(12) United States Patent
Murata

(10) Patent No.: US 11,106,145 B2
(45) Date of Patent: Aug. 31, 2021

(54) EXPOSURE SYSTEM AND LITHOGRAPHY SYSTEM

(71) Applicant: NIKON CORPORATION, Tokyo (JP)

(72) Inventor: Kenichiro Murata, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 64 days.

(21) Appl. No.: 16/341,542

(22) PCT Filed: Oct. 12, 2017

(86) PCT No.: PCT/JP2017/036902
§ 371 (c)(1),
(2) Date: Jul. 23, 2019

(87) PCT Pub. No.: WO2018/074306
PCT Pub. Date: Apr. 26, 2018

(65) Prior Publication Data
US 2019/0361359 A1 Nov. 28, 2019

(30) Foreign Application Priority Data
Oct. 17, 2016 (JP) .............................. JP2016-203454

(51) Int. Cl.
*G03F 7/20* (2006.01)
(52) U.S. Cl.
CPC ...... *G03F 7/70991* (2013.01); *G03F 7/70483* (2013.01); *G03F 7/70616* (2013.01); *G03F 7/70716* (2013.01); *G03F 7/70808* (2013.01)
(58) Field of Classification Search
CPC ............ H01L 21/027; H01L 21/67155; H01L 21/67161; H01L 21/6767; H01L 21/67173;
(Continued)

(56) References Cited

U.S. PATENT DOCUMENTS

| 4,780,617 A | 10/1988 | Umatate et al. |
| 5,243,377 A * | 9/1993 | Umatate ................... G03F 7/20 355/46 |

(Continued)

FOREIGN PATENT DOCUMENTS

| JP | H11-074191 A | 3/1999 |
| JP | H11-150057 A | 6/1999 |

(Continued)

OTHER PUBLICATIONS

Jan. 9, 2018 International Search Report issued in International Patent Application No. PCT/JP2017/036902.

(Continued)

*Primary Examiner* — Christina A Riddle
(74) *Attorney, Agent, or Firm* — Oliff PLC

(57) ABSTRACT

An exposure system is equipped with: chambers in a first row that are disposed on the +X side with respect to a C/D installed on a floor surface; chambers in a second row that are disposed on the +Y side of the chambers in the first row, facing the chambers in the first row; and a measurement chamber and a control rack that are disposed adjacently on the –X side with respect to the chambers in the first row and the second row and besides on the +X side of the C/D. Inside at least some of the chambers, an exposure room where exposure is performed is formed, and the control rack distributes utility supplied from below the floor surface to each of the chambers in the first row and the second row.

24 Claims, 28 Drawing Sheets

(58) Field of Classification Search
CPC ....... H01L 21/67225; G03F 1/16; G03F 7/20; G03F 7/203; G03F 7/2037; G03F 7/2039; G03F 7/2051; G03F 7/2057; G03F 7/2059; G03F 7/2065; G03F 7/70483; G03F 7/70291; G03F 7/70375; G03F 7/70383; G03F 7/70775; G03F 7/70733; G03F 7/7045; G03F 7/70458; G03F 7/70466; G03F 7/704; G03F 7/708; G03F 7/70841; G03F 7/70825; G03F 7/70833; G03F 7/7085; G03F 7/70858; G03F 7/709; G03F 7/70908; G03F 7/70916; G03F 7/70975; G03F 7/70991; G03F 7/70808; G03F 7/70616; G03F 7/70716
USPC ......... 355/18, 27, 46, 53–55, 67, 71, 72, 77; 250/492.1, 492.2, 492.21, 492.22, 492.23, 250/492.3, 493.1, 503.1; 378/34, 35; 356/399–401
See application file for complete search history.

(56) References Cited

U.S. PATENT DOCUMENTS

| | | | |
|---|---|---|---|
| 5,448,332 A | 9/1995 | Sakakibara et al. | |
| 5,811,211 A * | 9/1998 | Tanaka | G03F 7/70066 382/145 |
| 6,168,667 B1 * | 1/2001 | Yoshioka | H01L 21/67173 118/715 |
| 6,239,859 B1 | 5/2001 | Park | |
| 6,519,504 B1 * | 2/2003 | Soraoka | H01L 21/67161 700/228 |
| 6,697,145 B1 * | 2/2004 | Aoyama | G03F 7/70991 355/53 |
| 7,173,263 B2 | 2/2007 | Wieland et al. | |
| 7,488,127 B2 * | 2/2009 | Ogata | G03F 7/162 355/27 |
| 7,561,280 B2 | 7/2009 | Schluchter et al. | |
| 8,432,534 B2 | 4/2013 | Shibazaki | |
| 2002/0009658 A1 * | 1/2002 | Sato | G01N 21/9501 430/30 |
| 2005/0185160 A1 * | 8/2005 | Kuit | G03F 7/7075 355/53 |
| 2006/0221319 A1 * | 10/2006 | Yamaguchi | G03F 9/7046 355/55 |
| 2007/0206170 A1 * | 9/2007 | Ebihara | G03B 27/42 355/53 |
| 2008/0241969 A1 * | 10/2008 | Winkler | G03F 7/70525 438/5 |
| 2009/0231561 A1 * | 9/2009 | Arai | G03F 7/70775 355/53 |
| 2010/0270474 A1 | 10/2010 | Platzgummer et al. | |
| 2013/0120724 A1 * | 5/2013 | Wieland | G03B 27/80 355/46 |
| 2015/0090895 A1 * | 4/2015 | Koning | H01J 37/023 250/396 R |
| 2016/0066478 A1 * | 3/2016 | Van Den Bergen | H05K 7/20145 361/679.47 |
| 2018/0088472 A1 * | 3/2018 | Shibazaki | H01L 21/677 |

FOREIGN PATENT DOCUMENTS

| | | |
|---|---|---|
| JP | 2003-142393 A | 5/2003 |
| JP | 2011-258842 A | 12/2011 |
| JP | 2014-090094 A | 5/2014 |
| JP | 2015-231020 A | 12/2015 |
| WO | 2007/017255 A1 | 2/2007 |
| WO | 2007/077920 A1 | 7/2007 |
| WO | 2009/011356 A1 | 1/2009 |

OTHER PUBLICATIONS

Jan. 9, 2018 Written Opinion of the International Searching Authority issued in International Patent Application No. PCT/JP2017/036902.

* cited by examiner

Fig. 3
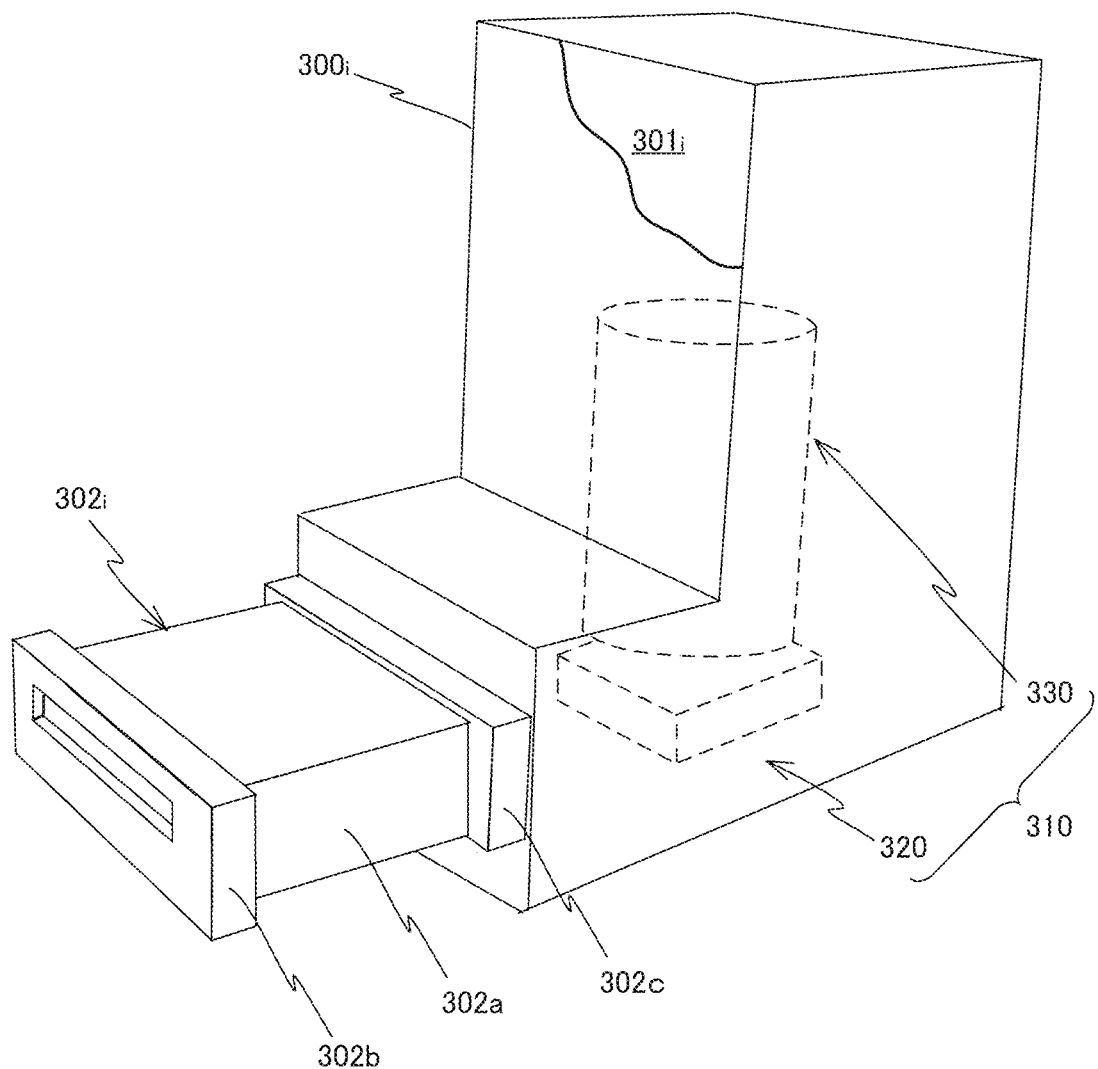
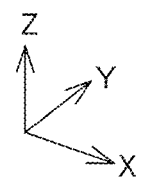

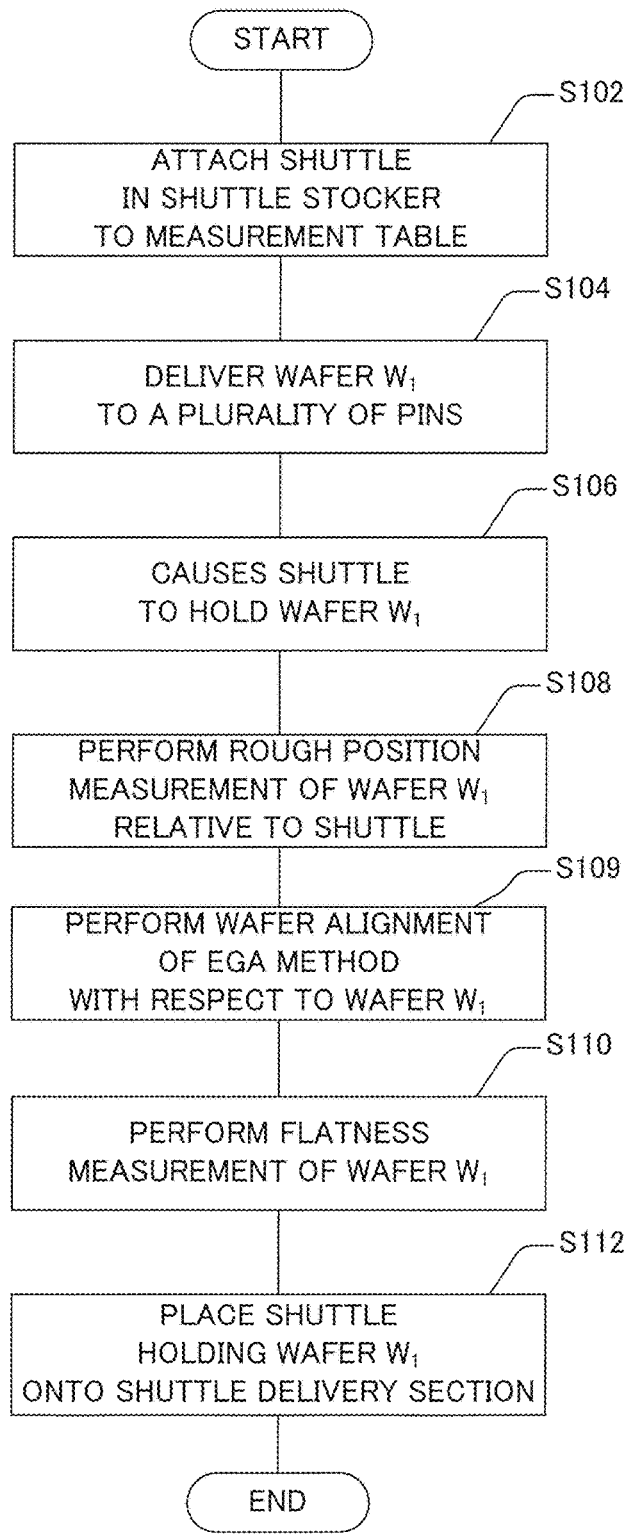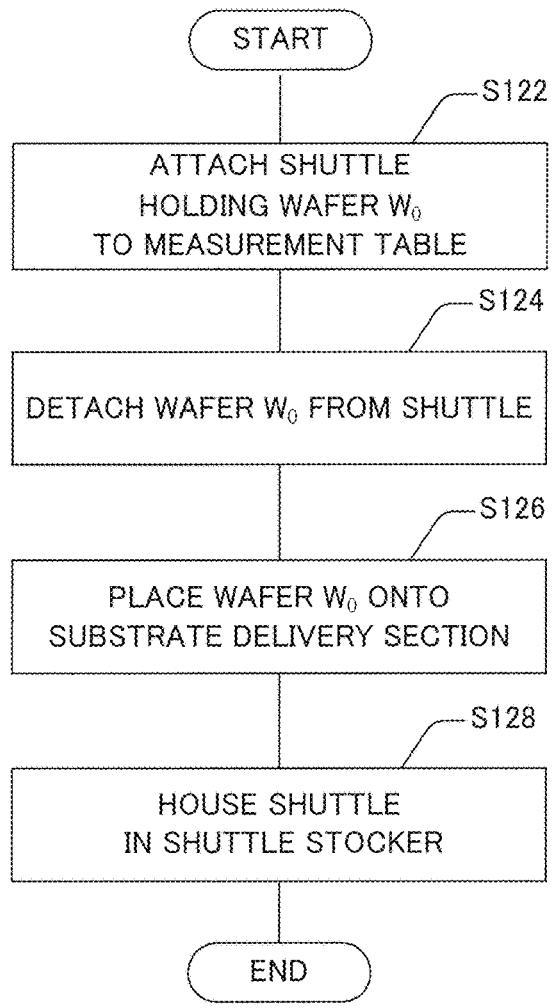

EXPOSURE SYSTEM AND LITHOGRAPHY SYSTEM

TECHNICAL FIELD

The present invention relates to exposure systems and lithography systems, and more particularly to an exposure system to expose a target with an exposure beam and a lithography system equipped with a first exposure system and a second exposure system.

BACKGROUND ART

In an exposure apparatus (hereinafter, called a ultraviolet ray exposure apparatus) used in a lithography process for manufacturing electron devices (microdevices) such as semiconductor devices, that uses ultraviolet rays from a far-ultraviolet range to a vacuum ultraviolet range as the exposure beam, the application of a liquid immersion method for shortening exposure wavelength, optimizing illumination conditions and further increasing the numerical aperture of a projection optical system and the like have been performed, in order to enhance a resolution. Further, as an attempt to enhance the resolution, it is considered that an EUV (Extreme Ultraviolet, extreme-ultraviolet rays, soft X-rays) exposure apparatus using EUV light source whose wavelength is much shorter than that of ultraviolet rays is employed.

In recent years, in order to form a circuit pattern with a finer pitch than the resolution limit of an ultraviolet ray exposure apparatus, an electron beam exposure apparatus has been proposed that forms a lot of circular spots smaller than the resolution limit of the ultraviolet ray exposure apparatus with electron beams and relatively scans these circular spots of the electron beams and a wafer (e.g., refer to PTL1).

The electron beam exposure apparatus or the EUV exposure apparatus is equipped various control units for vacuuming the inside of a chamber, and therefore, is larger in footprint than the ultraviolet ray exposure apparatus.

CITATION LIST

Patent Literature

[PTL 1] U.S. Pat. No. 7,173,263

SUMMARY OF THE INVENTION

According to a first aspect of the present invention, there is provided an exposure system that exposes a target with an exposure beam, the exposure system comprising: a first chamber in which a measurement room is formed, in the measurement room measurement being performed with respect to the target or the target coated with sensitive agent in a substrate processing device; a second chamber in which an exposure room is formed, in the exposure room the target carried from the first chamber being exposed with an exposure beam; and at least one control rack that is disposed adjacently or proximally to at least one of the first chamber and the second chamber, and supplies utility supplied from an external utility supply source to at least one of the first chamber and the second chamber.

According to a second aspect of the present invention, there is provided a lithography system that exposes a target with an exposure beam, the lithography system comprising: a first exposure system that comprises a first chamber in which a measurement room is formed, in the measurement room measurement being performed with respect to the target or the target coated with sensitive agent in a first substrate processing device, a second chamber in which an exposure room is formed, in the exposure room the target carried from the first chamber being exposed with an exposure beam, and at least one first control rack that is disposed adjacently or proximally to at least one of the first chamber and the second chamber, and supplies utility supplied from an external utility supply source to at least one of the first chamber and the second chamber; and a second exposure system that comprises a third chamber in which a measurement room is formed, in the measurement room measurement being performed with respect to the target or the target coated with sensitive agent in a second substrate processing device, a fourth chamber in which an exposure room is formed, in the exposure room the target carried from the third chamber being exposed with an exposure beam, and at least one second control rack that is disposed adjacently or proximally to at least one of the third chamber and the fourth chamber, and supplies utility supplied from an external utility supply source to at least one of the third chamber and the fourth chamber, wherein the first chamber is disposed on one side of the first substrate processing device in a second direction that intersects a first direction, in the first direction the first substrate processing device and the second substrate processing device lying side by side, the second chamber is disposed on the other side of the first chamber in the first direction, the third chamber is disposed on the other side of the second substrate processing device in the second direction, and the fourth chamber is disposed on one side of the third chamber in the first direction.

According to a third aspect of the present invention, there is provided a lithography system that exposes a target with an exposure beam, the lithography system comprising: a first exposure system that comprises a first chamber in which a measurement room is formed, in the measurement room measurement being performed with respect to the target or the target coated with sensitive agent in a first substrate processing device, a second chamber in which an exposure room is formed, in the exposure room the target carried from the first chamber being exposed with an exposure beam, and at least one first control rack that is disposed adjacently or proximally to at least one of the first chamber and the second chamber, and supplies utility supplied from an external utility supply source to at least one of the first chamber and the second chamber; and a second exposure system that comprises a third chamber in which a measurement room is formed, in the measurement room measurement being performed with respect to the target or the target coated with sensitive agent in a second substrate processing device, a fourth chamber in which an exposure room is formed, in the exposure room the target carried from the third chamber being exposed with an exposure beam, and at least one second control rack that is disposed adjacently or proximally to at least one of the third chamber and the fourth chamber, and supplies utility supplied from an external utility supply source to at least one of the third chamber and the fourth chamber, wherein the first substrate processing device and the second substrate processing device are disposed adjacently or proximally in a first direction, the first chamber and the third chamber are disposed at 180-degrees rotationally symmetric positions with respect to a point between the first substrate processing device and the second substrate processing device, and the second chamber and the fourth chamber are disposed at 180-degrees rotationally symmetric positions with respect to a point between the first substrate processing device and the second substrate processing device.

BRIEF DESCRIPTION OF DRAWINGS

FIG. 3 is a view schematically showing a load lock chamber equipped in a vacuum chamber, together with an exposure unit accommodated inside an exposure room within the vacuum chamber.

FIG. 14A is a flowchart used to explain an example of advance preparation work performed in a measurement room 60, and FIG. 14B is a flowchart used to explain an unloading work of a wafer that has been exposed in measurement room 60.

DESCRIPTION OF EMBODIMENTS

First Embodiment

Figure 1:
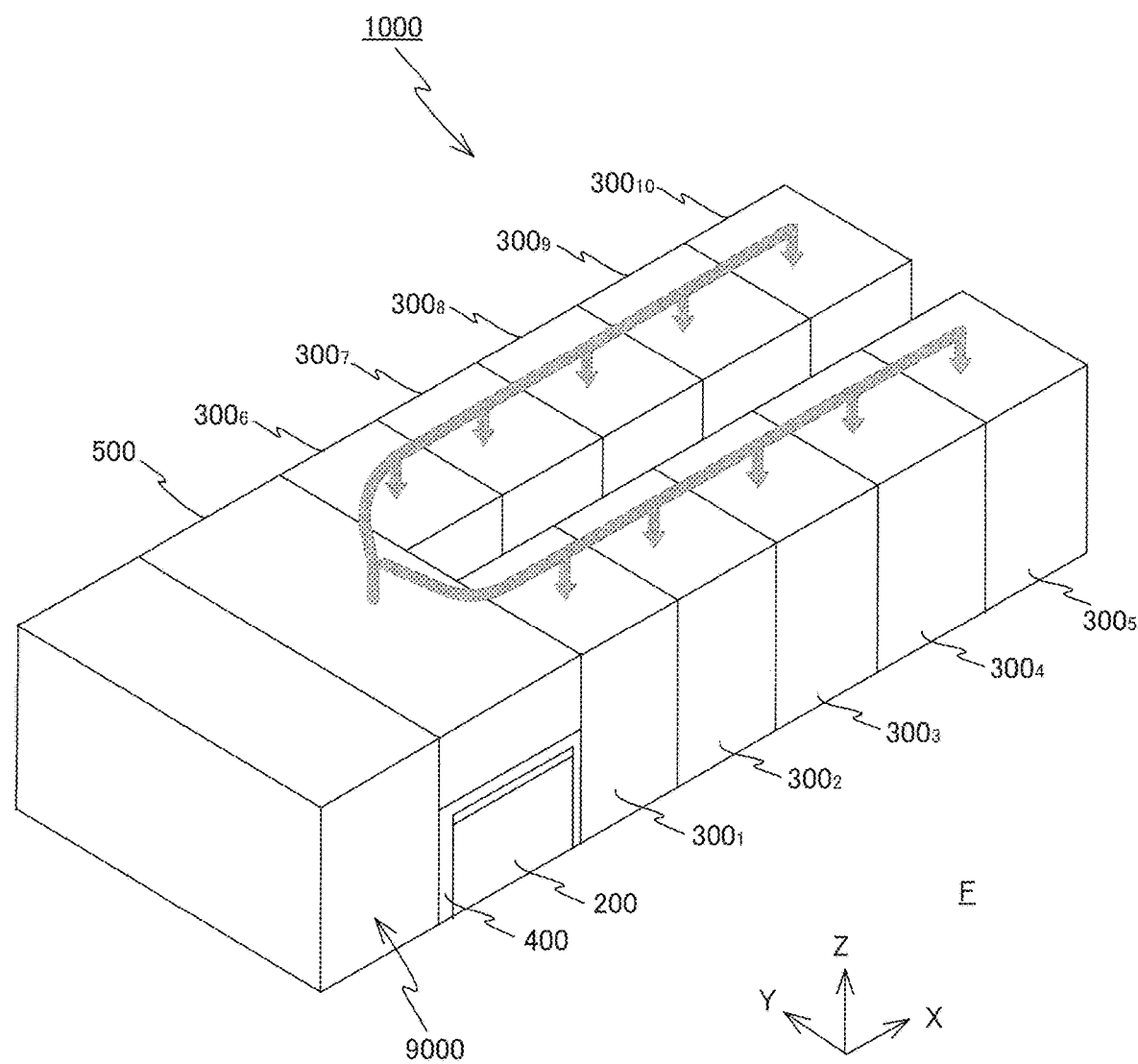
FIG. 1 is a perspective view showing an exposure system related to a first embodiment, together with a resist coating/development device.
Figure 2:
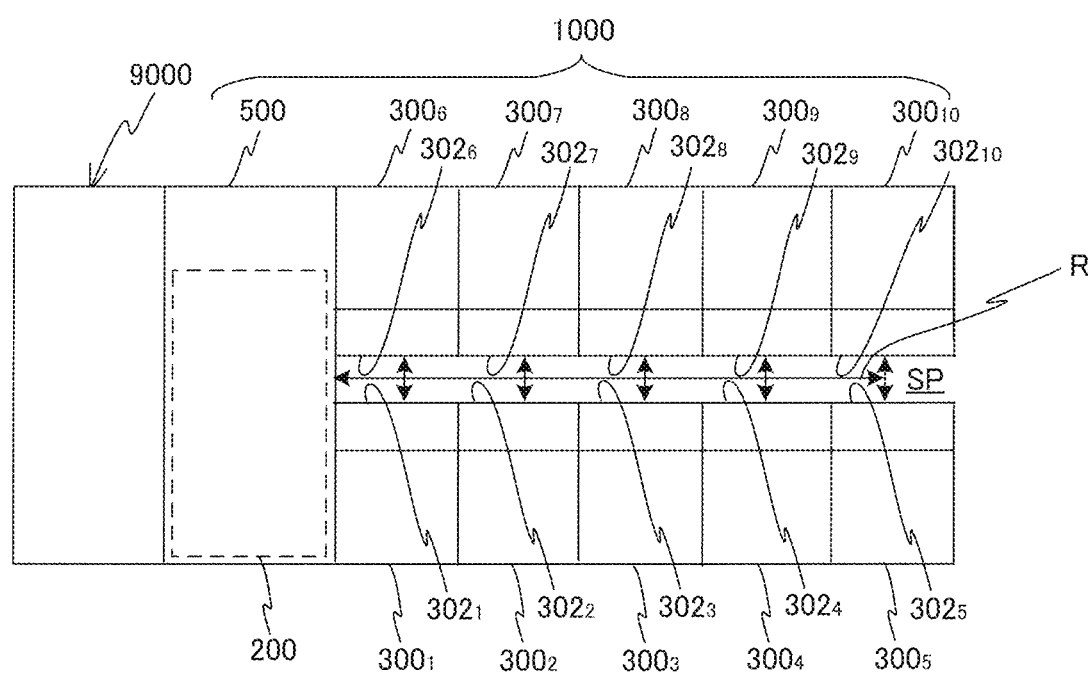
FIG. 2 is a plan view showing the exposure system related to the first embodiment, together with the resist coating/development device.

A first embodiment will be described below, on the basis of FIGS. 1 to 14. FIG. 1 shows, in a perspective view, an exposure system 1000 related to the first embodiment, together with a resist coating/development device (a coater/developer (hereinafter, simply referred to as C/D)) 9000. FIG. 2 shows, in a plan view, exposure system 1000 together with C/D 9000.

In the present embodiment, a configuration using charged particle beams, in particular, electron beams, as an example of exposure beams, will be described. However, the charged particle beams are not limited to the electron beams, and beams using charged particles such as ion beams may also be employed.

Since a plurality of electron beam optical systems are provided in the present embodiment as will be described later, hereinafter the explanation will be given, setting a Z-axis parallel to an optical axis of each of the electron beam optical systems and setting an X-axis and a Y-axis orthogonal to each other within a plane (which is a plane parallel to a floor surface F in the present embodiment) perpendicular to the Z-axis.

As illustrated in FIGS. 1 and 2, exposure system 1000 is equipped with: a measurement chamber 200 disposed adjacently on the +X side of C/D 9000 having a rectangular parallelepiped shape installed on floor surface F; a control rack 500 disposed above measurement chamber 200; and ten vacuum chambers (hereinafter, also referred to as chambers as needed) $300_1$ to $300_{10}$ disposed on the +X side of measurement chamber 200 and control rack 500. Control rack 500 is disposed on a frame 400 that has four leg sections located at the four corners of a space, in which measurement chamber 200 is disposed, between C/D 9000 and the ten chambers $300_1$ to $300_{10}$. Consequently, the weight of control rack 500 does not act on measurement chamber 200, and besides control rack 500 and measurement chamber 200 are vibrationally separated. Note that in the case where measurement chamber 200 has the sufficient intensity or in the case where control rack 500 is light in weight, control rack 500 may be directly placed on measurement chamber 200 without using a frame member such as frame 400.

The ten chambers $300_1$ to $300_{10}$ are divided into two rows consisting of five chambers $300_1$ to $300_5$ and five chambers $300_6$ to $300_{10}$.

The five chambers $300_1$ to $300_5$ are disposed in a row adjacently to each other in the X-axis direction (a direction in which measurement chamber 200 and C/D 9000 are adjacent to each other), and the remaining five chambers $300_6$ to $300_{10}$ are disposed in a row adjacently to each other, parallel to chambers $300_1$ to $300_3$.

As shown in a plan view in FIG. 2, chambers $300_1$ to $300_3$ are disposed in one row and chambers $300_6$ to $300_{10}$ in the other row are disposed side by side in the X-axis direction, adjacently on the +X side of the −Y side end and the +Y side end of control rack 500 (and measurement chamber 200), respectively. In the present embodiment, chamber $300_1$ faces chamber $300_6$, chamber $300_2$ faces chamber $300_7$, chamber $300_3$ faces chamber $300_8$, chamber $300_4$ faces chamber $300_9$, and chamber $300_5$ faces chamber $300_{10}$.

Each of chambers $300_1$ to $300_{10}$ has the same height as C/D 9000. Since the height of measurement chamber 200 is lower than the height of chambers $300_1$ to $300_{10}$ and C/D 9000, there exists a vacant space above measurement chamber 200. Therefore, in the present embodiment, in order to effectively utilize this vacant space, control rack 500 is disposed via frame 400. Frame 400 has a top plate section with a rectangular shape and the four leg sections of the same length that support this top plate section at the four corner parts of the top plate section, and frame 400 supports control rack 500 from below. The upper surface of control rack 500 and the upper surfaces of chambers $300_1$ to $300_{10}$ and C/D 9000 are substantially flush. Note that there exists an empty space between control rack 500 and floor surface F, on the +Y side of measurement chamber 200.

By employing such a layout, exposure system 1000 related to the present embodiment can be disposed together with C/D 9000 in a space with a rectangular parallelepiped shape in the clean room, and thus, it is possible to avoid a space of poor usability from being generated in the clean room and to attain improvement in the space utilization efficiency in the clean room.

Wiring and piping from a utility supply source of a clean room sub-fab, in which production supporting equipment and utility facility are accommodated, under floor surface F pass through the empty space section described earlier between control rack 500 and floor surface F, via floor surface F, and are connected to control rack 500 from the lower side. The wiring and the piping are used to supply utility (utilities, power) such as electric power, and the utility includes air, cooling water and vacuum exhaust, in addition to the electric power.

The following components are housed inside control rack 500: a control system unit that is directly related to the electron beam exposure apparatus such as, for example, a high voltage power supply and an amplifier; a control system for stages to be described later; and various units such as a control board for measurement systems to be described later. Control rack 500 relays the wiring and the piping once, and distributes the utility supplied via the wiring and the piping (supply members) from the utility supply source of the clean room sub-fab, to measurement chamber 200 and chambers $300_1$ to $300_{10}$. Note that, a temperature adjuster for the cooling water may be disposed inside control rack 500, as needed.

Note that, as the control rack, a plurality of control racks serving in different ways may be provided. For example, as the control racks, two racks may be provided, i.e., a control rack having a function related to the irradiation control of electron beams to be irradiated from an electron beam irradiation device to be described later to a wafer serving as a target, and another control rack having the other functions.

Control rack 500 supplies the utility supplied from the utility supply source from above (see thick arrows in FIG. 1), with respect to each of the ten chambers $300_1$ to $300_{10}$. Note that merits of supplying the utility from above to each of the ten chambers $300_1$ to $300_{10}$ will be described later.

Measurement chamber 200 disposed adjacently to C/D 9000 has a rectangular parallelepiped shape (see FIG. 2). Measurement chamber 200 is connected in-line to C/D 9000. Inside measurement chamber 200, a measurement room (measurement cell) 60 (not illustrated in the drawings such as FIGS. 1 and 2; see FIG. 10A) is provided. In measurement room 60, predetermined measurement with respect to a wafer (the wafer coated with resist for electron ray by C/D 9000) serving as a target, and the loading of a wafer before exposure onto a wafer shuttle to be described later and the unloading of a wafer that has been exposed are performed.

Among the ten chambers $300_1$ to $300_{10}$, chambers $300_1$ to $300_5$ each have an L-like shape when viewed from the +X side and the remaining chambers $300_6$ to $300_{10}$ each have a laterally symmetric shape to each of chambers $300_1$ to $300_3$, respectively. The inside space of each of the ten chambers $300_1$ to $300_{10}$ serves as an exposure room (exposure cell) $301_i$ (i=1 to 10) (not illustrated in the drawings such as FIGS. 1 and 2; see FIG. 3), in which exposure with respect to a wafer with an electron beam is performed. A high-degree vacuum state is maintained in exposure room $301_i$. That is, as each of the ten chambers $300_i$ inside which exposure room $301_i$ is formed, a vacuum chamber having a structure provided with durability sufficient to prevent the chamber from being crashed or deformed by the action of atmospheric pressure is used.

Note that, since the inside space of measurement chamber 200 serves as measurement room 60 described above, it is not necessary to set the inside space of measurement chamber 200 into vacuum atmosphere, which is different from the inside spaces of chambers $300_1$ to $300_{10}$. Therefore, as measurement chamber 200, a chamber whose intensity is weaker than the vacuum chambers can be used. Further, by controlling the pressure of the inside space of measurement chamber 200 and the pressure of the inside space of C/D 9000 to be higher than the pressure of the clean room, gas (air) in the clean room is suppressed from coming into measurement chamber 200 and C/D 9000. Note that the pressure of the inside space of control rack 500 may be set to the same pressure as the clean room (set to an atmospheric pressure space) or to a higher pressure than the pressure of the clean room.

A load lock chamber $302_i$ is affixed to the front surface of chamber $300_i$, as illustrated in FIG. 3. While FIG. 3 shows the chamber with the same orientation as that of chambers $300_6$ to $300_{10}$, chambers $300_1$ to $300_5$ each have a configuration similar to but laterally symmetric to the one shown in FIG. 3.

Each load lock chamber $302_i$ includes a main body section $302a$ inside which a load lock room (not illustrated) is formed, and a pair of gate sections 302b and 302c fixed to the front surface side (the atmospheric side) and the back surface side (the vacuum side) of main body section 302a. The pair of gate sections 302b and 302c are provided with respective gate valves that are made up of: shutters that open/close openings formed on the front surface side and the back surface side of main body section 302a; and drive mechanisms that slide and drive the shutters in a vertical direction. Hereinafter, the gate valves are expressed as gate valves 302b and 302c using the same reference signs as the respective gate sections. The opening and closing of gate valves 302b and 302c (i.e., the opening and closing of the shutters by the respective drive mechanisms) is controlled by an exposure controller $380_i$ (see FIGS. 11 and 13).

Vacuum piping connected to a vacuum source such as a vacuum pump via an opening-closing valve 305 (see FIG. 13) is connected to load lock chamber $302_i$ and the inside of the load lock room is evacuated as needed, by opening opening-closing valve 305. The opening and closing of opening-closing valve 305 is also controlled by exposure controller $380_i$. Note that each load lock chamber $302_i$ may be individually provided with a vacuum pump.

In exposure room $301_i$ inside chamber $300_i$, an exposure unit 310 as shown in FIG. 3 and an exposure room interior carrier system 312 (not illustrated in FIG. 3; see FIG. 13) made up of, for example, a horizontal multijoint robot are accommodated. Further, in exposure room $301_i$, a shuttle carrier 306 (see FIG. 13) that has, for example, two housing shelves on the upper side and the lower side and is vertically movable is provided. The vertical movement of shuttle carrier 306 is controlled by exposure controller $380_i$ (see FIG. 13).

Exposure unit 310 includes a stage device 320 and an electron beam irradiation device 330, as illustrated in a simplified manner in FIG. 3. Electron beam irradiation device 330 includes a barrel 331 with a cylindrical shape as illustrated in FIG. 4 and an electron beam optical system inside barrel 331.

Stage device 320 has a configuration including a coarse-fine movement stage on which a wafer shuttle that holds a wafer and is movable is attached so as to be freely detachable and attachable, and electron beam irradiation device 330 has a configuration in which an electron beam is irradiated on a wafer held by the wafer shuttle attached to the coarse-fine movement stage.

Here, the wafer shuttle is a holding member (or a table) that holds a wafer by electrostatic adsorption, the details of which will be described later, and this holding member in a state of holding the wafer is carried, and also the holding member repeatedly shuttles between measurement room 60 as a starting point and each of exposure rooms $301_1$ to $301_{10}$, and thus the holding member is referred to as the wafer shuttle.

Figure 4:
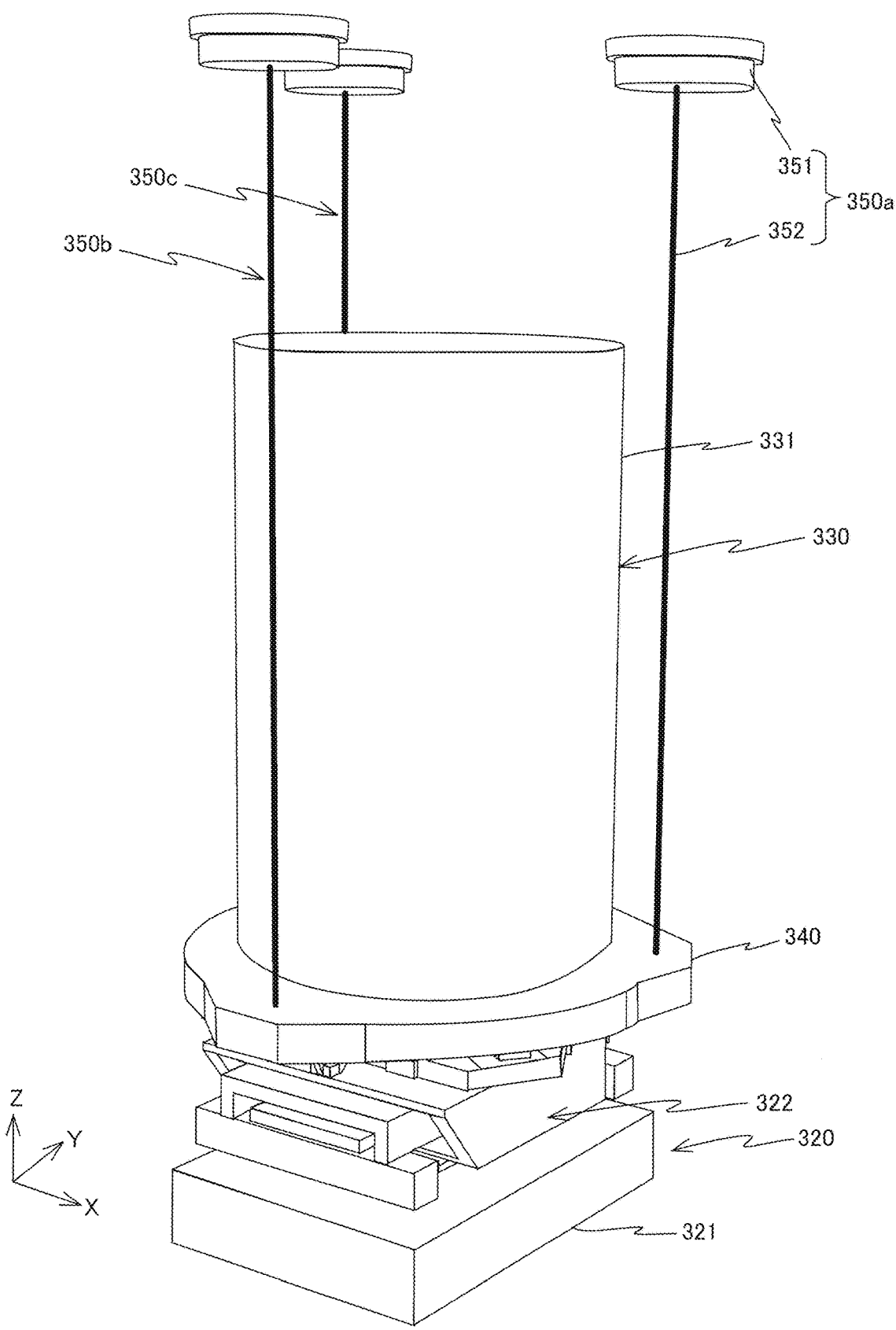
FIG. 4 is a perspective view showing the exposure unit.

As illustrated in FIG. 4, stage device 320 is equipped with a surface plate 321, a coarse-fine movement stage 322 that is moved on surface plate 321, a drive system that drives coarse-fine movement stage 322, and a position measurement system that measures the position information of the coarse-fine movement stage. The details of configuration and the like of stage device 320 will be described later.

As illustrated in FIG. 4, barrel 331 of electron beam irradiation device 330 is supported from below by a metrology frame 340 made up of an annular plate member with three protruding parts formed at intervals with a central angle of 120 degrees, on an outer circumference section thereof. More specifically, the lowermost end of barrel 331 is a small diameter part whose diameter is smaller, compared to that of its upper section, a boundary section between the small diameter part and the upper section is a stepped part. And, barrel 331 is supported from below by metrology frame 340 in a state where the small diameter part is inserted into the circular opening of metrology frame 340 and the bottom surface of the stepped part abuts the upper surface of metrology frame 340. As illustrated in FIG. 4, metrology frame 340 is supported in a suspended state from a top plate (a ceiling wall) of vacuum chamber $300_i$ that zones exposure room $301_i$, via three suspension support mechanisms 350a, 350b and 350c (coupling members each having a flexible structure) whose lower ends are connected to the foregoing three protruding parts, respectively. That is, in this manner, electron beam irradiation device 330 is supported in a suspended manner at three points with respect to vacuum chamber $300_i$.

As representatively shown by suspension support mechanism 350a in FIG. 4, the three suspension support mechanisms 350a, 350b and 350c each have a passive type vibration isolation pad 351 provided at its upper end, and a wire 352 made of steel having one end connected to the lower end of the vibration isolation pad (the vibration isolation section) 351 and the other end connected to metrology frame 340. Vibration isolation pads 351 are fixed to the top plate of vacuum chamber $300_i$ and each include an air damper or a coil spring.

In the present embodiment, of vibration such as floor vibration transmitted from the outside to vacuum chamber $300_i$, most part of a vibration component in the Z-axis direction parallel to the optical axis of the electron beam optical system is absorbed by vibration isolation pads 351, and therefore the high vibration damping performance can be obtained in a direction parallel to the optical axis of the electron beam optical system. Further, the natural frequencies of the suspension support mechanisms are lower in a direction perpendicular to the optical axis of the electron beam optical system, than those in the direction parallel to the optical axis. Since the three suspension support mechanisms 350a, 350b and 350c vibrate like pendulum in the direction perpendicular to the optical axis, the lengths of the three suspension support mechanisms 350a, 350b and 350c (the lengths of wires 352) are set sufficiently long so that the vibration damping performance in the direction perpendicular to the optical axis (the capability to prevent vibration such as floor vibration transmitted from the outside to vacuum chamber $300_i$ from travelling to electron beam irradiation device 330) is adequately high. With this structure, while the high vibration damping performance can be obtained and also large reduction in weight of a mechanism section is possible, there is a risk that the relative position between electron beam irradiation device 330 and vacuum chamber $300_i$ is changed at a relatively low frequency. Therefore, in order to maintain the relative position between electron beam irradiation device 330 and vacuum chamber $300_i$ in a predetermined state, a positioning device 353 of a noncontact method (not illustrated in FIG. 3; see FIG. 13) is provided. Positioning device 353 can be configured including a hexaxial acceleration sensor and a hexaxial actuator, as disclosed in, for example, PCT International Publication No. WO 2007/077920 and the like. Positioning device 353 is controlled by exposure controller $380_i$ (see FIG. 13). Accordingly, the relative position of electron beam irradiation device 330 with respect to vacuum chamber $300_i$ in the X-axis direction, the Y-axis direction and the Z-axis direction, and the relative rotation angle of electron beam irradiation device 330 with respect to vacuum chamber $300_i$ around the X-axis, the Y-axis and the Z-axis are maintained in a constant state (a predetermined state).

In the present embodiment, electron beam irradiation device 330 is equipped with an electron beam optical system configured of m-number ("m" is, for example, 100) of optical system columns disposed in a predetermined positional relationship within barrel 331. Each optical system column is made up of a multibeam optical system that is capable of irradiating the n-number ("n" is, for example, 4,000) of beams that can individually be turned ON/OFF and besides deflected. As the multibeam optical system, an optical system having a configuration similar to an optical system disclosed in, for example, Japanese Patent Application Publication No. 2011-258842, PCT International Publication No. WO2007/017255, and the like can be used.

when the 4,000 multibeams are all set to the ON state (a state where the electron beams are irradiated on a wafer), a circular spot of the electron beam, with a small diameter (e.g., a diameter of 20 nm) that is smaller than the resolution limit of the ultraviolet ray exposure apparatus, is simultaneously formed at 4,000 points set at an equal spacing within an rectangular area (an exposure area) of, for example, 100 μm×20 nm.

The 100 optical system columns correspond to, for example, 100 shot areas, substantially on one-to-one basis, that are formed (or to be formed according a shot map) on, for example, a 300 mm wafer. In the present embodiment, each of the 100 optical system columns arranges many (n=4,000) circular spots of electron beams each of which has a diameter of 20 nm and can be turned ON/OFF and besides deflected, within a rectangular-shaped exposure area (e.g. 100 μm×20 nm), and while the wafer is scanned with respect to the exposure area, the many circular spots of electron beams are turned ON/OFF while being deflected, and thereby the 100 shot areas on the wafer are exposed and patterns are formed. Consequently, in the case of the 300 mm wafer, as the movement stroke of the wafer on the exposure, several tens mm including a slight margin, e.g. 50 mm is sufficient. Similarly to a typical electron beam optical system, each optical system column is equipped with a reflected electron detecting system (not illustrated) that detects reflected electrons. Electron beam irradiation device 330 is controlled by exposure controller 380$_i$ (see FIG. 13).

Figure 5:
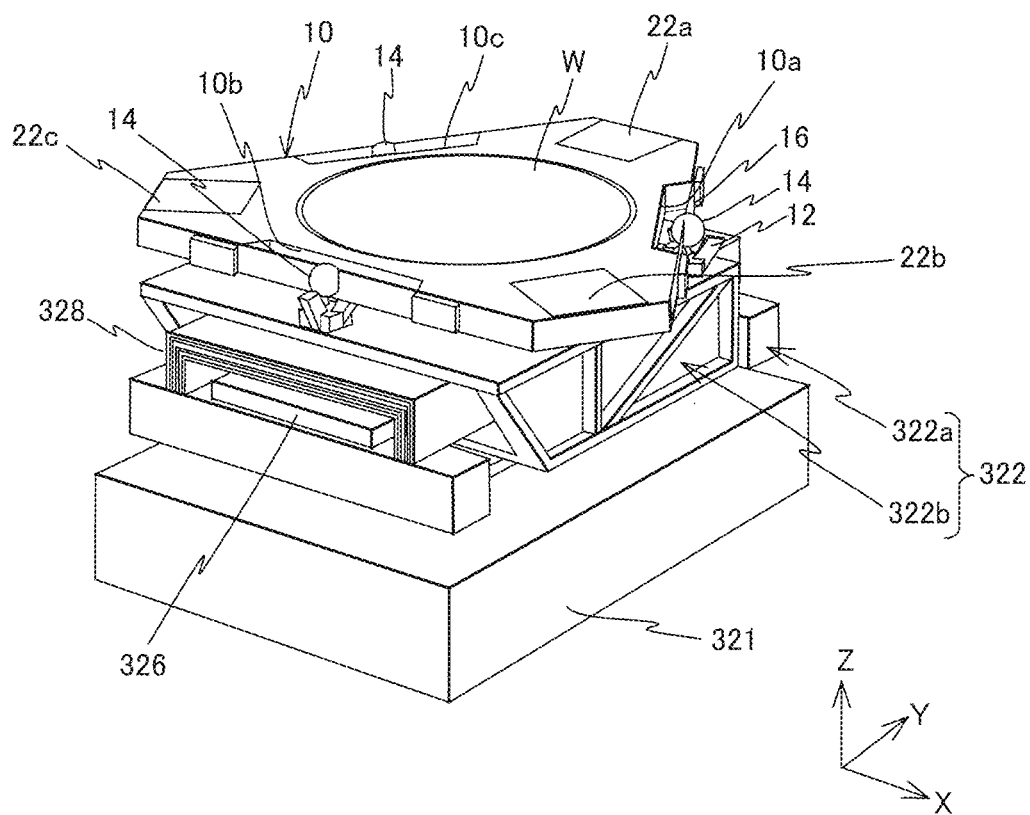
FIG. 5 is a perspective view showing a state where a wafer shuttle is attached to a coarse-fine movement stage placed on a surface plate.
Figure 6:
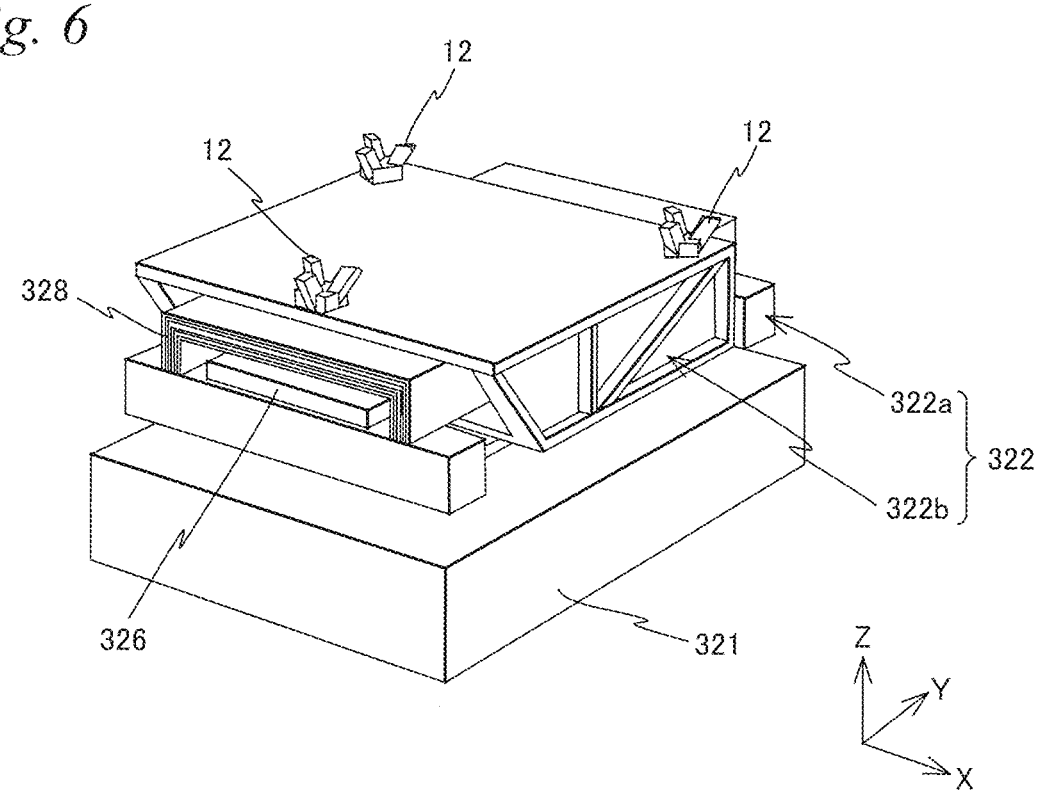
FIG. 6 is a perspective view showing the coarse-fine movement stage shown in FIG. 5 in which the wafer shuttle is removed from a fine movement stage.

Next, the configuration and the like of stage device 320 will described. FIG. 5 shows a perspective view of a state where a wafer shuttle (hereinafter, simply referred to as a shuttle) 10 is attached to coarse-fine movement stage 322 of stage device 320. FIG. 6 shows a perspective view of coarse-fine movement stage 322 as shown in FIG. 5 in a state where shuttle 10 is detached (removed).

In actuality, surface plate 321 equipped in stage device 320 is installed on a bottom wall of vacuum chamber 300$_i$ that zones exposure room 301$_i$. As shown in FIGS. 5 and 6, coarse-fine movement stage 322 is equipped with: a coarse movement stage 322a that includes a pair of quadrangular prism-shaped sections disposed with a predetermined spacing in between in the Y-axis direction and each extending in the X-axis direction, and is movable with a predetermined stroke, e.g., a stroke of 50 mm, in the X-axis direction on surface plate 321; and a fine movement stage 322b that is movable with a predetermined stroke, e.g., a stroke of 50 mm, in the Y-axis direction with respect to coarse movement stage 322a and besides movable with a shorter stroke compared to the stroke in the Y-axis direction, in directions of the remaining 5 degrees of freedom, i.e., the X-axis direction, the Z-axis direction, a rotation direction around the X-axis (the θx direction), a rotation direction around the Y-axis (the θy direction), and a rotation direction around the Z-axis (the θz direction). Note that, although the illustration is omitted, the pair of quadrangular prism-shaped sections of coarse movement stage 322a are coupled to be integrated, in actuality, by a coupling member (not illustrated) in a state not obstructing the movement of fine movement stage 322b in the Y-axis direction.

Figure 13:
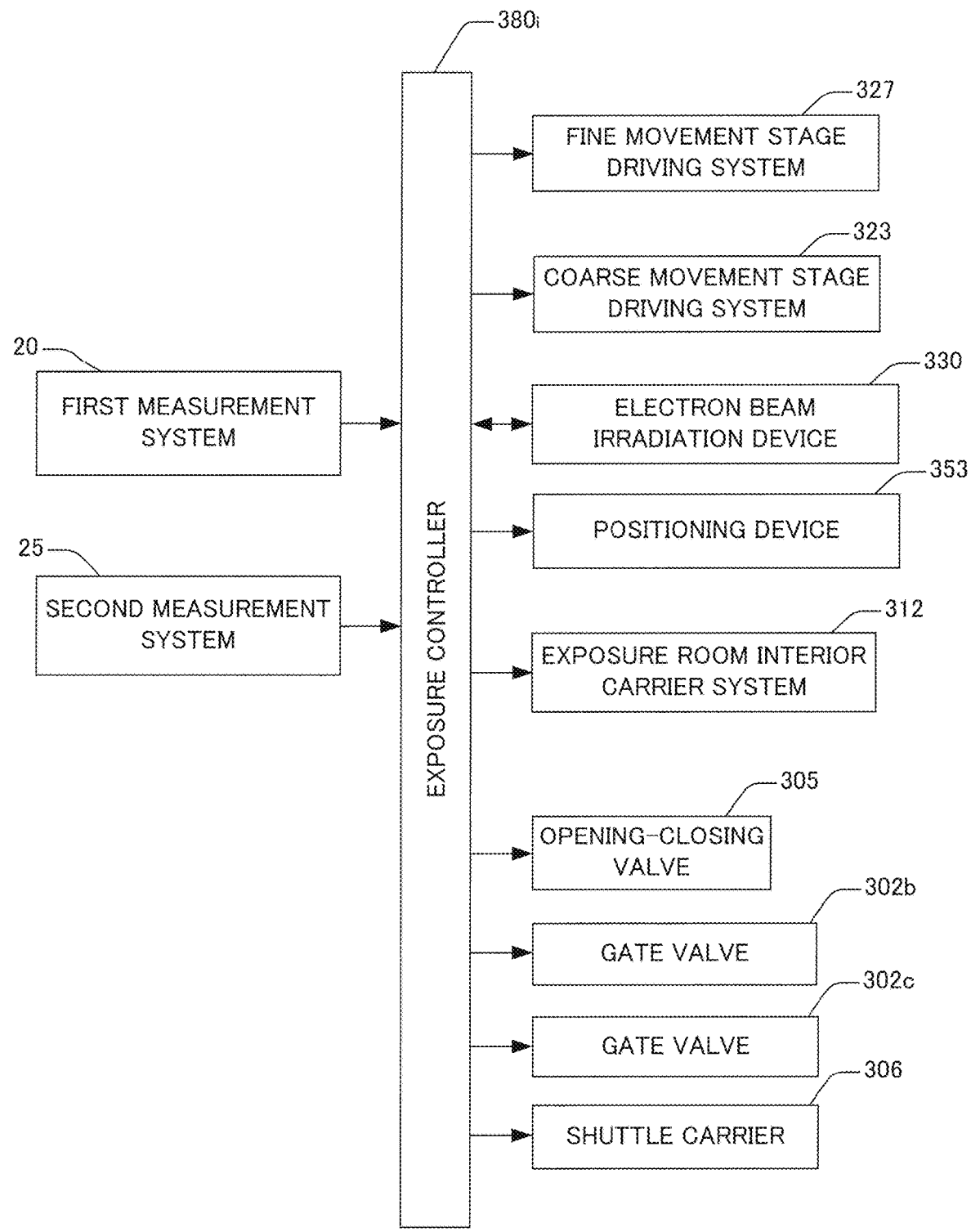
FIG. 13 is a block diagram showing the input/output relationships of an exposure controller that configures the control system shown in FIG. 11.

Coarse movement stage 322a is driven with a predetermined stroke (e.g. 50 mm) in the X-axis direction (see a long arrow along the X-axis direction in FIG. 8) by a coarse movement stage driving system 323 (see FIG. 13). In the present embodiment, coarse movement stage driving system 323 is configured of a uniaxial drive mechanism in which the magnetic flux leakage does not occur, e.g., a feed screw mechanism using a ball screw. Coarse movement stage driving system 323 is disposed between one quadrangular prism-shaped section of the pair of quadrangular prism-shaped sections of the coarse movement stage, and surface plate 321. For example, coarse movement stage driving system 323 has a configuration in which a screw shaft is affixed to surface plate 321 and a ball (a nut) is affixed to the one quadrangular prism-shaped section. Note that another configuration, in which the ball is affixed to surface plate 321 and the screw shaft is affixed to the one quadrangular prism-shaped section, may also be employed.

Further, the other quadrangular prism-shaped section, of the pair of quadrangular prism-shaped sections of the coarse movement stage, is configured to move along a guide surface (not illustrated) provided at surface plate 321.

The screw shaft of the ball screw is rotated and driven by a stepping motor. Alternatively, coarse movement stage driving system 323 may be configured of a uniaxial drive mechanism equipped with an ultrasonic motor as a drive source. In either case, the influence, of the magnetic field fluctuation caused by magnetic flux leakage, on the positioning of electron beams can be ignored. Coarse movement stage driving system 323 is controlled by exposure controller 380$_i$ (see FIG. 13).

Figure 7:
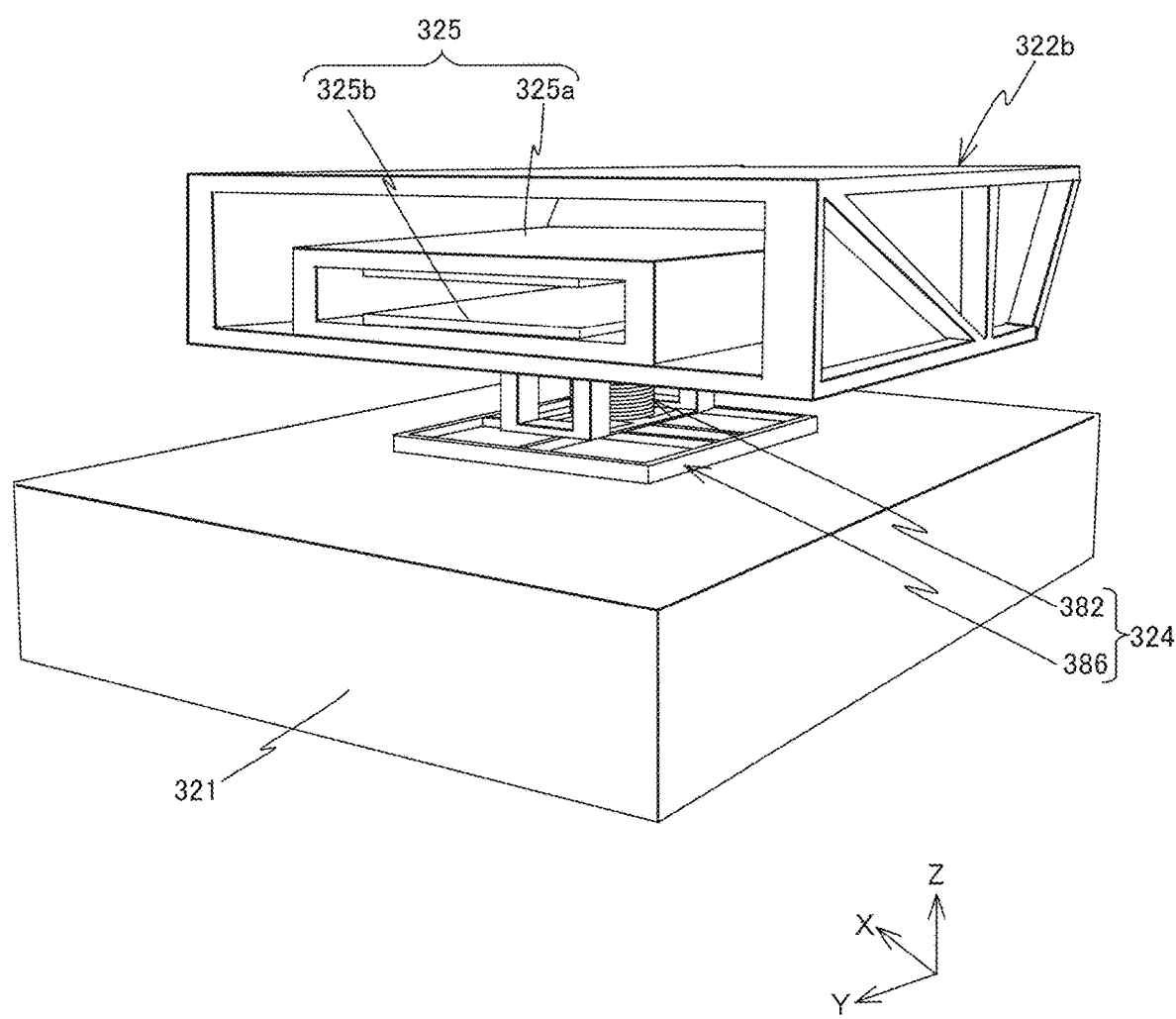
FIG. 7 is a view enlargedly showing the coarse-fine movement stage placed on the surface plate.

Fine movement stage 322b is made up of a member having an XZ cross-section with a rectangular frame shape that penetrates in the Y-axis direction, as enlargedly illustrated in a perspective view in FIG. 7, and is supported movably within the XY plane on surface plate 321, by a weight cancelling device 324. A plurality of stiffening ribs are provided on the outer surface of a side wall of fine movement stage 322b.

Inside a hollow section of fine movement stage 322b, a yoke 325a having an XZ cross-section with a rectangular frame shape and extending in the Y-axis direction, and a pair of magnet units 325b fixed to the vertically facing surfaces of yoke 325a are provided, and yoke 325a and the pair of magnet units 325b configure a mover 325 of a motor that drives fine movement stage 322b.

Figure 8:
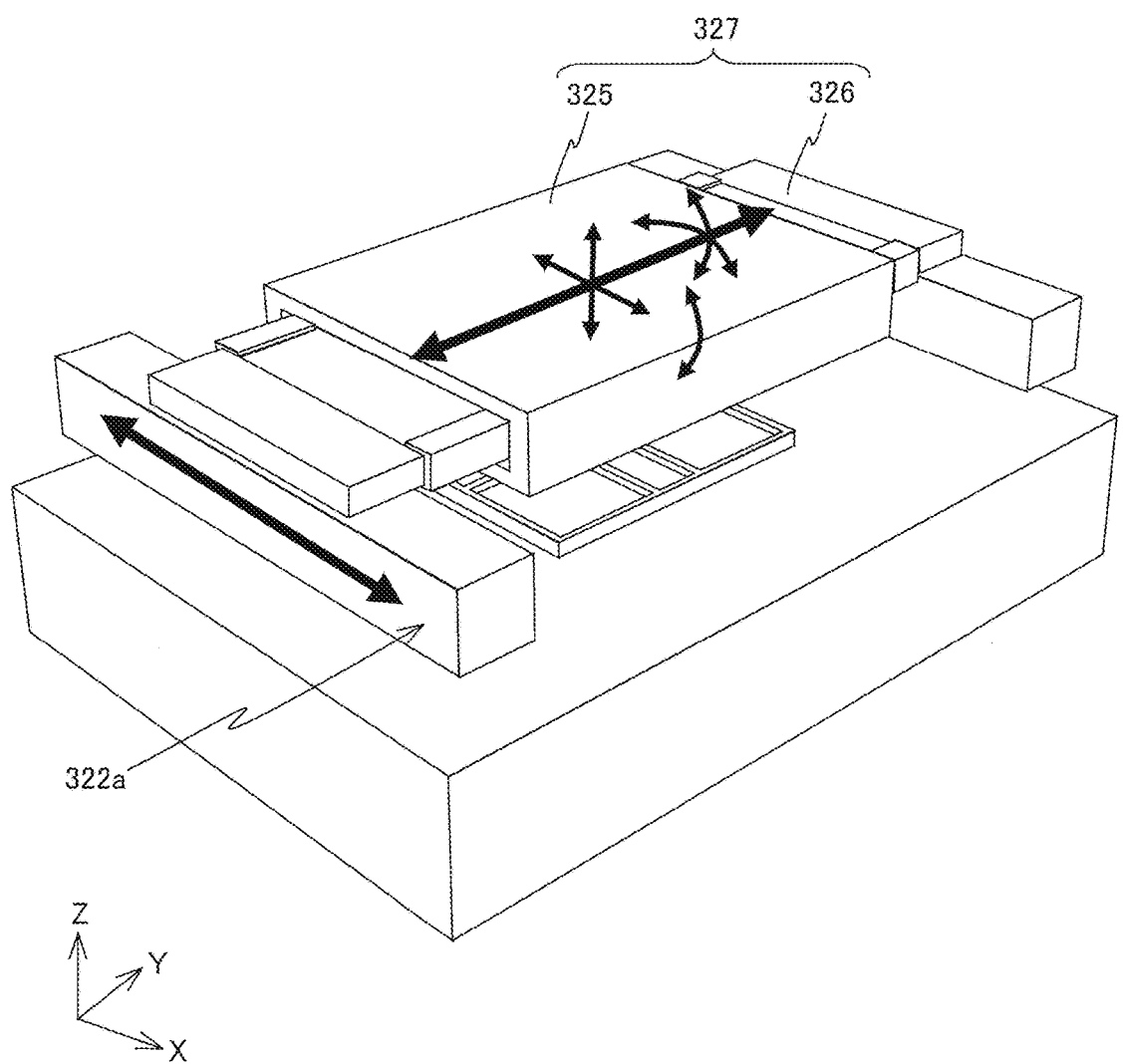
FIG. 8 is a view showing a state where the fine movement stage and a magnetic shield member are taken off from the coarse-fine movement stage shown in FIG. 6.

Corresponding to mover 325, a stator 326 made up of a coil unit is stretched between the pair of quadrangular prism sections of coarse movement stage 322a, as illustrated in FIG. 8 that shows a state where fine movement stage 322b and a magnetic shield member (to be described later) denoted by a reference sign 328 are removed from FIG. 6. Stator 326 and mover 325 described earlier configure a motor 327 of a closed magnetic field type and besides a moving magnet type that is capable of moving mover 325 with a predetermined stroke, e.g., a stroke of 50 mm, relative to stator 326 in the Y-axis direction as well as finely driving mover 325 relative to stator 326 in the X-axis direction, the Z-axis direction, the θx direction, the θy direction and the θz direction, as indicated by arrows along the respective directions in FIG. 8. In the present embodiment, motor 327 configures a fine movement stage driving system that drives the fine movement stage in directions of six degrees of freedom. Hereinafter, the fine movement stage driving system is expressed as fine movement stage driving system 327, using the same reference sign as the motor. Fine movement stage driving system 327 is controlled by exposure controller 380, (see FIG. 13).

For example, as illustrated in the drawings such as FIGS. 5 and 6, magnetic shield member 328 whose XZ cross-section has a reversed U-like shape is further stretched between the pair of quadrangular prism sections of coarse movement stage 322a, in a state of covering the upper surface and the both side surfaces in the X-axis direction of motor 327. That is, magnetic shield member 328 is formed extending in a direction (the Y-axis direction) intersecting a direction in which the quadrangular prism sections extend, and is equipped with an upper surface section facing the upper surface of motor 327 in a noncontact manner and side surface sections facing the side surfaces of motor 327 in a noncontact manner. Of the side surface sections of magnetic shield member 328, the lower surfaces of both ends in the longitudinal direction (the Y-axis direction) are fixed to the upper surfaces of the pair of quadrangular prism sections of coarse movement stage 322a, in a state where magnetic shield member 328 is inserted into the hollow section of fine movement stage 322b. Further, of the side surface sections of magnetic shield member 328, the other portions, than the lower surfaces of the both ends described above, face in a noncontact manner the bottom wall surface (the lower surface) of the inner wall surfaces of fine movement stage 322b. That is, magnetic shield member 328 is inserted into the hollow section of fine movement stage 322b, in a state not blocking the movement of mover 325 relative to stator 326.

As magnetic shield member 328, a laminate magnetic shield member that is configured of multiple layers of films made of magnetic material that are layered with a predetermined clearance (space) in between is used. In addition, a magnetic shield member having a configuration in which films made of materials of two types having different magnetic permeabilities are alternately layered may be used. Magnetic shield member 328 covers the upper surface and the side surfaces of motor 327 over the full length of the movement stroke of mover 325 and besides magnetic shield member 328 is fixed to coarse movement stage 322a, and therefore the magnetic flux leaking upward (to the electron beam optical system side) can be prevented in a substantially reliable manner, in the entire area of the movement range of fine movement stage 322b and coarse movement stage 322a.

As illustrated in FIG. 7, weight cancelling device 342 has an air spring of a bellows type made of metal (hereinafter, simply referred to as an air spring) 382 having an upper end connected to the lower surface of fine movement stage 322b, and a base slider 386 made up of a tabular plate member connected to the lower end of air spring 382.

Base slider 386 is provided with a bearing section that blows out air inside air spring 382 to the upper surface of surface plate 321, and the empty weight of weight cancelling device 342, fine movement stage 322b and mover 325 (in the case where the shuttle is attached to coarse-fine movement stage 322, shuttle 10 and the like are also included) is supported by the static pressure (the pressure in a gap) between the bearing surface of the pressurized air blown out from the bearing section and the upper surface of surface plate 321. Note that the compressed air is supplied to air spring 328 via piping (not illustrated) connected to fine movement stage 322b. Base slider 386 is supported in a noncontact manner on surface plate 321 via a kind of air static pressure bearing of a differential evacuation type, and the air blown out from the bearing section toward surface plate 321 is prevented from leaking out around (into the exposure room).

Now, a structure for attaching shuttle 10 to coarse-fine movement stage 322, more precisely, to fine movement stage 322b, so as to be freely detachable and attachable, will be described.

As illustrated in FIG. 6, three triangular pyramid groove members 12 are provided on the upper surface of fine movement stage 322b. Triangular pyramid groove members 12 are provided at, for example, positions of three vertices of a substantially equilateral triangle in planar view. Spheres or hemispheres (to be described later) provided at shuttle 10 are engageable with triangular pyramid groove members 12, and triangular pyramid groove members 12 configure a kinematic coupling, together with these spheres or hemispheres. Note that, although triangular pyramid groove member 12 is illustrated in FIG. 6 like flower petals configured of three plate members, triangular pyramid groove member 12 serves in the same way as a triangular pyramid groove that makes point-contact with the sphere or the hemisphere, and therefore referred to as a triangular pyramid groove member. Consequently, a single member in which triangular pyramid grooves are formed may be used instead of triangular pyramid groove members 12.

In the present embodiment, corresponding to the three triangular pyramid groove members 12, three spheres or hemispheres (balls in the present embodiment) 14 are provided at shuttle 10 as illustrated in FIG. 5. Shuttle 10 is formed into a hexagonal shape that is like an equilateral triangle with the respective vertices cut away in planar view. More specifically, cutout sections 10a, 10b and 10c are formed at shuttle 10 in the center part of each of three oblique sides in planar view, and plate springs 16 are affixed in a state of covering cutout sections 10a, 10b and 10c from the outer side, respectively. Ball 14 is fixed to the center part in the longitudinal direction of each plate spring 16. In a state before balls 14 are engaged with triangular pyramid groove members 12, each ball 14 is finely moved only in a radial direction with the center of shuttle 10 (which substantially coincides with the center of wafer W, as illustrated in FIG. 5) serving as a center, when receiving an external force.

After shuttle 10 is moved to a position where the three balls 14 substantially face the three triangular pyramid groove members 12, respectively, above fine movement stage 322b, shuttle 10 is moved downward, and thereby the three balls 14 are each individually engaged with the three triangular pyramid groove members 12, and shuttle 10 is attached to fine movement stage 322b. At the time of such an attachment, even if the position of shuttle 10 with respect to fine movement stage 322b is displaced from a desired position, balls 14 are moved in the radial direction, as is described earlier, by receiving an external force from triangular pyramid groove members 12 when balls 14 are engaged with triangular pyramid groove members 12, and as a result, the three balls 14 are engaged with the corresponding triangular pyramid groove members 12, constantly in the same state. On the other hand, shuttle 10 can be easily removed (detached) from fine movement stage 322b only by moving shuttle 10 upward and releasing the engagement between balls 14 and triangular pyramid groove members 12. That is, in the present embodiment, three sets of balls 14 and triangular pyramid groove members 12 configure a kinematic coupling, and with this kinematic coupling, the affixed state of shuttle 10 to fine movement stage 322b can be constantly set to the substantially same state. Consequently, even if shuttle 10 is removed from fine movement stage 322b a plurality of times, a constant positional relationship between shuttle 10 and fine movement stage 322b can be reproduced only by attaching shuttle 10 to fine movement stage 322b via the kinematic coupling (the three sets of balls 14 and triangular pyramid groove members 12).

For example, as illustrated in FIG. 5, a circular recessed section whose diameter slightly larger than that of wafer W is formed in the center of the upper surface of shuttle 10, and an electrostatic chuck (not illustrated) is provided in the recessed section and wafer W is electrostatically adsorbed and held by the electrostatic chuck. In this holding state of wafer W, the surface of wafer W is substantially flush with the upper surface of shuttle 10. A plurality of circular openings (not illustrated) vertically penetrating the placing surface (the adsorbing surface) of wafer W are formed, in a predetermined positional relationship, at shuttle 10.

Next, a position measurement system that measures the position information of coarse-fine movement stage 322 will be described. This position measurement system measures the position information of shuttle 10 in a state where shuttle 10 is attached to fine movement stage 322b via the foregoing kinematic coupling. The position measurement system includes a first measurement system 20 that measures the position information of fine movement stage 322b to which shuttle 10 is attached and a second measurement system 25 that directly measures the position information of fine movement stage 322b (see FIG. 13).

First measurement system 20 will be described first. In the vicinity of three sides excluding the foregoing three oblique sides of shuttle 10, grating plates 22a, 22b and 22c are respectively provided, as illustrated in FIG. 5. At each of grating plates 22a, 22b and 22c, a two-dimensional grating is formed that has period directions in a radial direction with the center of shuttle 10 (which coincides with the center of the circular recessed section in the present embodiment) serving as a center and in a direction orthogonal to the radial direction. For example, a two-dimensional grating having period directions in the Y-axis direction and the X-axis direction is formed at grating plate 22a. Further, a two-dimensional grating having period directions in a direction (hereinafter, referred to as an α direction) that is angled from the Y-axis by an angle of −120 degrees with respect to the center of shuttle 10 and a direction orthogonal to the α direction is formed at grating plate 22b, and a two-dimensional grating having period directions in a direction (hereinafter, referred to as a β direction) that is angled from the Y-axis by an angle of +120 degrees with respect to the center of shuttle 10 and a direction orthogonal to the β direction is formed at grating plate 22c. As the two-dimensional grating, a reflective diffraction grating with a pitch of, for example, 1 μm in each period direction is used.

Figure 9A:
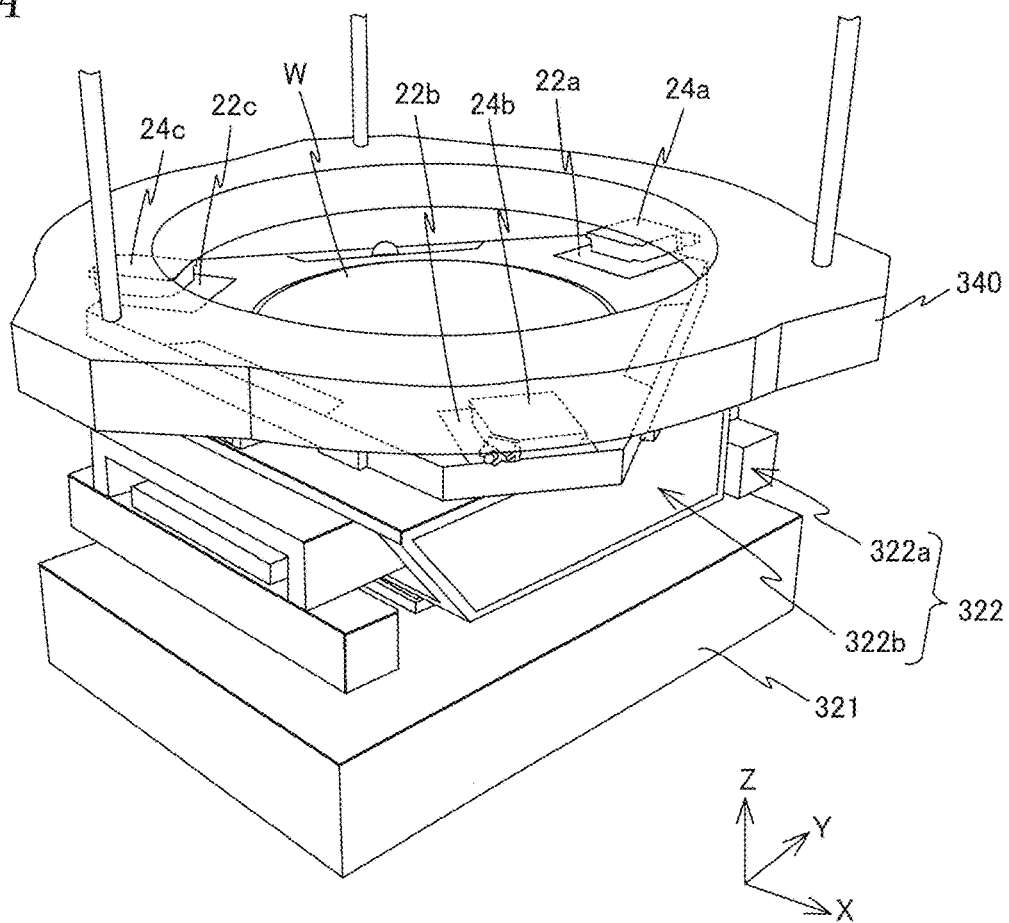
FIGS. 9A and 9B are views (No. 1 and No. 2) used to explain the configuration of a first measurement system.
Figure 9B:
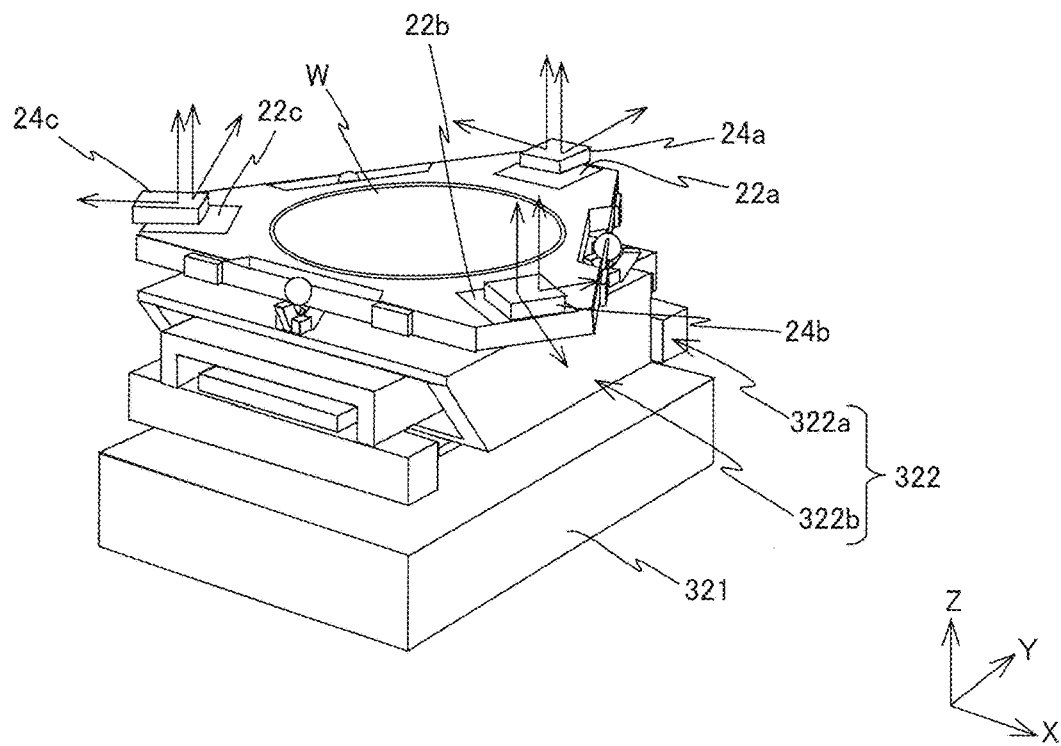

As illustrated in FIG. 9A, on the lower surface (the surface on the −Z side) of metrology frame 340, three head sections 24a, 24b and 24c are fixed to positions that are individually capable of facing the three grating plates 22a, 22b and 22c, respectively. Each of the three head sections 24a, 24b and 24c is provided with a four-axes encoder head having measurement axes indicated by four arrows in FIG. 9B.

More specifically, head section 24a includes a first head with the X-axis direction and the Z-axis direction serving as its measurement directions and a second head with the Y-axis direction and the Z-axis direction serving as its measurement directions, which are accommodated inside the same housing. The first head (to be more precise, an irradiation point, on grating plate 22a, of a measurement beam emitted from the first head) and the second head (to be more precise, an irradiation point, on grating plate 22a, of a measurement beam emitted from the second head) are disposed on the same straight line parallel to the X-axis. The first head and the second head of head section 24a configure a biaxial linear encoder that measures the position information of shuttle 10 in the X-axis direction and the Z-axis direction and a biaxial linear encoder that measures the position information in the Y-axis direction and the Z-axis direction, respectively, using grating plate 22a.

Although the orientations of the remaining head sections 24b and 24c with respect to metrology frame 340 are each different (the measurement directions within the XY-plane are different), they are configured including the first head and the second head similarly to head section 24a. The first head and the second head of head section 24b configure a biaxial linear encoder that measures the position information of shuttle 10 in the direction orthogonal to the α direction within the XY plane and the Z-axis direction and a biaxial linear encoder that measures the position information in the α direction and the Z-axis direction, respectively, using grating plate 22b. The first head and the second head of head section 24c configure a biaxial linear encoder that measures the position information of shuttle 10 in the direction orthogonal to the β direction within the XY plane and the Z-axis direction and a biaxial linear encoder that measures the position information in the β direction and the Z-axis direction, respectively, using grating plate 22c.

As each of the first head and the second head that each of head sections 24a, 24b and 24c has, an encoder head having a similar configuration to a displacement measurement sensor head disclosed in, for example, U.S. Pat. No. 7,561,280 can be used.

The foregoing three sets of biaxial encoders, i.e., a total of the six biaxial encoders, namely, the three head sections 24a, 24b and 24c that measure the position information of shuttle 10 using the three grating plates 22a, 22b and 22c, respectively, configure an encoder system, and this encoder system configures first measurement system 20 (see FIG. 13). The position information measured by first measurement system 20 is supplied to exposure controller $380_i$.

In first measurement system 20, since the three head sections 24a, 24b and 24c each have four of the measurement degrees of freedom (the measurement axes), the measurement in twelve degrees of freedom in total can be performed. That is, since the maximum degrees of freedom are six in a three-dimensional space, the redundant measurement is performed and two pieces of the position information are obtained for each of the directions of six degrees of freedom.

Therefore, exposure controller $380_i$ assumes that the average value of the two pieces of the position information for each degree of freedom is a measurement result of each direction, on the basis of the position information measured by first measurement system 20. Accordingly, the position information of shuttle 10 and fine movement stage 322b can be obtained with high accuracy by an averaging effect, for all the directions of six degrees of freedom.

Next, second measurement system 25 will be described. Second measurement system 25 is capable of measuring the position information of fine movement stage 322b in the directions of six degrees of freedom, irrespective of whether shuttle 10 is attached to fine movement stage 322b or not. Second measurement system 25 can be configured of an interferometer system that measures the position information of fine movement stage 322b in the directions of six degrees of freedom by irradiating reflection surfaces provided at, for example, on the outer surface of the side wall of fine movement stage 322b, with measurement beams and receiving the reflected beams. Each interferometer of the interferometer system may be supported in a suspended manner by metrology frame 340 via a support member (not illustrated), or may be fixed to surface plate 321. Since the second measurement system is provided in exposure room $301_i$ (in a vacuum space), there is no risk that the measurement accuracy is deteriorated because of air fluctuation. Further, in the present embodiment, second measurement system 25 is mainly used to maintain the position and the attitude of fine movement stage 322b into a desired state when shuttle 10 is not attached to fine movement stage 322b, i.e., when exposure of a wafer is not performed, and therefore, the measurement accuracy of second measurement system 25 may be lower, compared to that of first measurement system 20. The position information measured by second measurement system 25 is supplied to exposure controller $380_i$ (see FIG. 13). Note that the second measurement system is not limited to the interferometer system, and may be configured of an encoder system or a combination of an encoder system and an interferometer system. In the latter case, the position information of fine movement stage 322b in directions of three degrees of freedom within the XY plane may be measured by the encoder system and the position information in directions of the remaining three degrees of freedom may be measured by the interferometer system.

Measurement information by first measurement system 20 and measurement information by second measurement system 25 are sent to exposure controller $380_i$, and exposure controller $380_i$ controls coarse-fine movement stage 322 on the basis of the measurement information by at least one of first measurement system 20 and second measurement system 25.

In the present embodiment, load lock chambers $302_i$ respectively equipped in chambers $300_i$ (i=1 to 10) are also disposed side by side in the X-axis direction, in a similar manner to chambers $300_i$, and therefore, load lock chambers $302_1$ to $302_5$ respectively equipped in chambers $300_1$ to $300_5$ in one row and load lock chambers $302_6$ to $302_{10}$ respectively equipped in chambers $300_6$ to $300_{10}$ in the other row face with a predetermined spacing in between. Then, as illustrated in FIG. 2, a carrying space SP is provided between these facing load lock chambers, and a movement route R of a shuttle carrier system to be described later is set in carrying space SP. Note that carrying space SP is not limited to the atmospheric pressure space, and may be set to a low vacuum space whose vacuum degree is lower than that of the inside of the vacuum chamber.

Figure 10A:
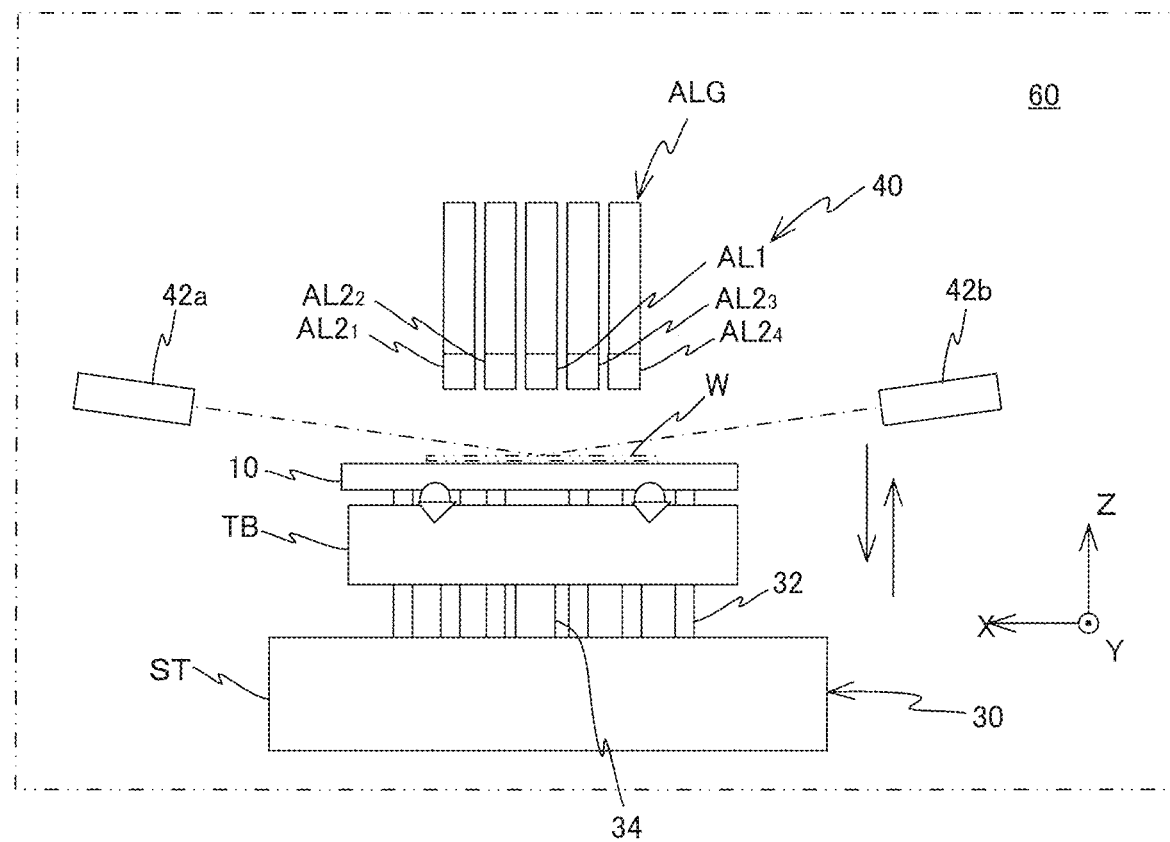
FIG. 10A is a view used to explain the configuration of respective components in a measurement room.

Next, the configuration of the inside of measurement room 60 will be described. As illustrated in FIG. 10A, in measurement room 60: a measurement stage device 30 having a measurement stage ST that is moved two-dimensionally within the XY plane and a measurement table TB mounted on measurement stage ST; a measurement system 40; a measurement room interior carrier system 62 (not illustrated in FIG. 10A: see FIG. 12); and the like are housed. Measurement room interior carrier system 62 is made up of, for example, a multijoint robot that carries wafer W and shuttle 10. In measurement stage device 30, shuttle 10 is attached to measurement table TB so as to be freely detachable and attachable, via a kinematic coupling that is similar to the foregoing. Measurement system 40 performs predetermined measurement with respect to wafer W held by shuttle 10.

In addition, inside measurement room 60, a shuttle stocker (not illustrated) is provided that has a plurality of shelves capable of housing shuttle 10, and is capable of storing a plurality of shuttles 10 at the same time. In the present embodiment, the shuttle stocker also has a temperature adjustment function for shuttles 10 housed therein. Note that a carrier system to carry a wafer and a carrier system to carry the shuttle may be separately provided, but it is assumed in the present embodiment that the wafer and the shuttle are carried by the same carrier system, in order to simplify the description.

Figure 10B:
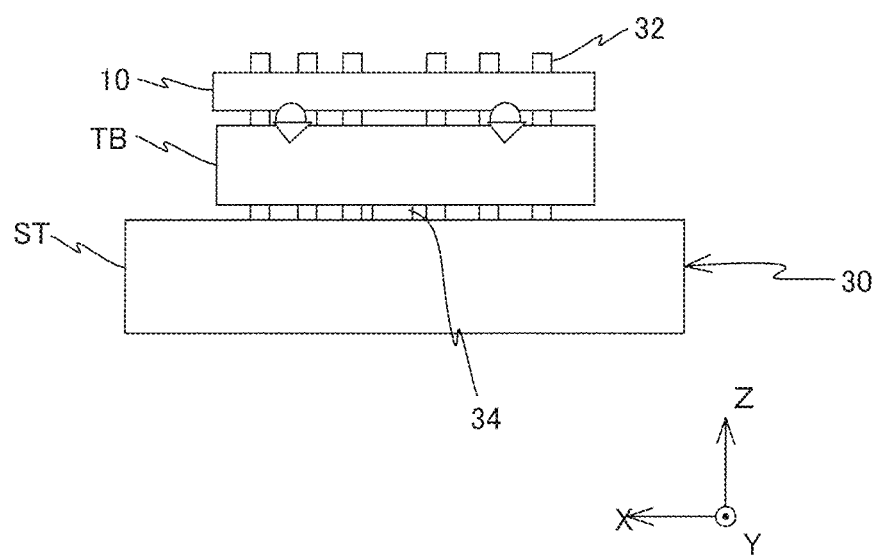
FIG. 10B is a view used to explain a movable range in a vertical direction of a measurement table shown in FIG. 10A.

A plurality of circular openings are formed at measurement table TB in a placement corresponding to the plurality of circular openings formed at shuttle 10 described earlier. A plurality of pins 32 are provided protruding at measurement stage ST in a placement corresponding to the plurality of circular openings of measurement table TB, and measurement table TB is disposed on measurement stage ST in a state where the plurality of pins 32 are individually inserted into the plurality of circular openings of measurement table TB. Measurement table TB is driven by a drive system 34 provided at measurement stage ST, and is vertically movable (is movable in the Z-axis direction) with a predetermined stroke. In the present embodiment, in a state where shuttle 10 is attached to measurement table TB via the kinematic coupling, measurement table TB is vertically movable between a first position as shown in FIG. 10A, where the upper surface of shuttle 10 is a predetermined distance higher than the upper end surfaces of the plurality of pins 32 (the upper end surfaces of the plurality of pins do not protrude from the upper surface of shuttle 10), and a second position as shown in FIG. 10B, where the wafer placing surface of shuttle 10 (the upper surface of the electrostatic chuck) is a predetermined distance lower than the upper end surfaces of the plurality of pins 32 (the upper end surfaces of the plurality of pins 32 protrude from the wafer placing surface of shuttle 10).

Note that measurement table TB may be placed on measurement sage ST and the plurality of pins 32 may be vertically moved with respect to measurement table TB.

Measurement stage ST is driven within the XY-plane (including the rotation in the θz direction) by a measurement stage driving system. 36 (see FIG. 12) made up of, for example, a planar motor. The position information of measurement stage ST within the XY-plane is measured by a measurement stage interferometer 38 (see FIG. 12). Further, the position of measurement table TB in a vertical direction is measured by an encoder that drive system 34 has. The operations of the respective components of measurement stage device 30 are controlled by a measurement controller 50 (see FIG. 12).

Figure 12:
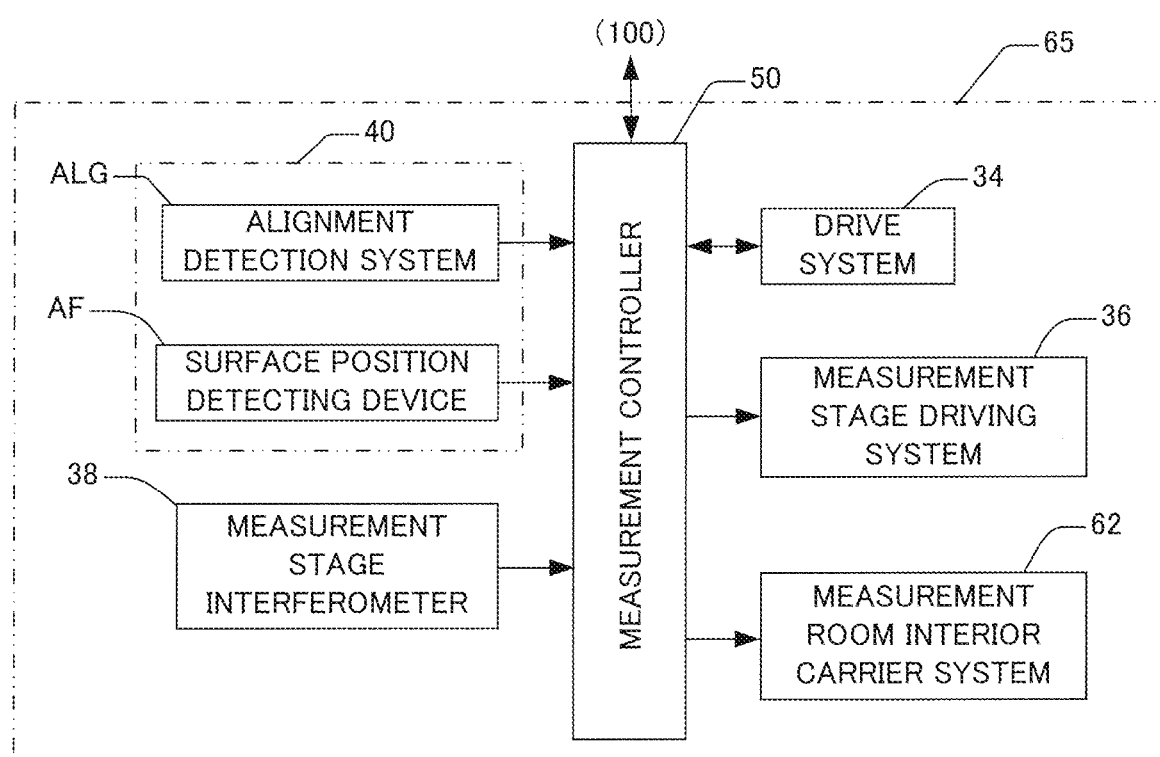
FIG. 12 is a block diagram showing the input/output relationships of a measurement controller that configures the control system shown in FIG. 11.

As illustrated in FIG. 10A, measurement system 40 includes an alignment detection system ALG, and a surface position detecting device AF having an irradiation system 42a and a light-receiving system 42b (see FIG. 12). Alignment detection system ALG is equipped with: a primary alignment system AL1 disposed with its detection center coinciding with the origin of a two-dimensional orthogonal coordinate system (a reference coordinate system) defined by the length measurement axes of measurement stage interferometer 38; and secondary alignment systems $AL2_1$ and $AL2_2$, and secondary alignment systems $AL2_3$ and $AL2_4$ that are provided on one side and the other side in the X-axis direction, respectively, with primary alignment system AL1 in between, and have detection centers disposed substantially symmetric with respect to primary alignment system AL1. That is, the detection centers of the five alignment systems AL1 and $AL2_1$ to $AL2_4$ are disposed along the X-axis direction. At least the respective X-positions of secondary alignment systems $AL2_1$, $AL2_2$, $AL2_3$ and $AL2_4$ are adjustable.

In the present embodiment, the upper surface of a wafer held on shuttle 10 is coated with sensitive agent (resist for electron ray), and correspondingly thereto, a detection beam with a wavelength to which the resist for electron ray is insensitive is used as the detection beam of each of alignment systems AL1 and $AL2_1$ to $AL2_4$. As each of alignment systems AL1 and $AL2_1$ to $AL2_4$, an FIA (Field Image Alignment) system of an image processing method is used that irradiates a target mark with broad-band detection light flux to which the resist coated on the wafer is insensitive, for example, and picks up an image of the target mark formed on a light-receiving surface by the reflected light from the target mark and an image of an index that is not illustrated (an index pattern on an index plate provided inside) using an imaging device (such as CCD), and outputs the imaging signals thereof. An imaging signal from each of alignment systems AL1 and $AL2_1$ to $AL2_4$ that configure alignment detection system ALG is supplied to measurement controller 50 (see FIG. 12) via a signal processing device (not illustrated). Alignment detection system ALG is configured similarly to an alignment device disposed in, for example, U.S. Pat. No. 8,432,534 and the like. Note that each of alignment systems AL1 and $AL2_1$ to $AL2_4$ that configure alignment detection system ALG is not limited to the FIA system, and for example, an alignment system of a diffraction light interference method, in which a target mark is irradiated with coherent detection light and two diffraction lights generated from the target mark (e.g., the diffraction lights with the same order or the diffraction lights diffracted in the same direction) are interfered with each other to be detected, may be used instead of the FIA system. The number of alignment systems that alignment detection system ALG has is not limited to five, and alignment detection system ALG only has to have at least one alignment system.

Surface position detecting device AF has irradiation system 42a and light-receiving system 42b, and is configured of a multiple focal point position detection system of an oblique incident method having a configuration similar to that disclosed in, for example, U.S. Pat. No. 5,448,332 and the like. A plurality of detection points of surface position detecting device AF are disposed at a predetermined spacing along the X-axis direction on a surface to be detected. In the present embodiment, the plurality of points are disposed in, for example, a row matrix shape with one row and M columns ("M" is the total number of the detection points) or with two rows and N columns ("N" is ½ of the total number of the detection points). Although the illustration is omitted in in FIG. 10A, the plurality of detection points are substantially uniformly set within an area having a length in the X-axis direction that is about the same as the diameter of wafer W, and therefore, the position information (the surface position information) in the Z-axis direction can be measured across the substantially entire surface of wafer W only scanning wafer W once in the Y-axis direction. In the present embodiment, the respective components disposed in measurement room 60 described above, that is, measurement stage device 30, measurement system 40, measurement room interior carrier system 62 and the like, and measurement controller 50 configure a measurement section 65 (see FIG. 12) that performs measurement with respect to a wafer before exposure held on shuttle 10. Note that the measurement with respect to a wafer before exposure is called pre-measurement.

Besides, exposure system 1000 related to the present embodiment is further equipped with a shuttle carrier system 70 (see FIG. 11) that moves in carrying space SP described earlier along movement route R indicated by an arrow in FIG. 2, and repeatedly performs a shuttle carrying operation of carrying shuttle 10 holding a wafer before exposure from measurement room 60 to load lock chamber $302_i$ equipped in each of chambers $300_i$ and carrying shuttle 10 holding an exposed wafer from load lock chamber $302_i$ to measurement room 60. Shuttle carrier system 70 is configured of, for example, a horizontal multijoint robot that is movable along movement route R. Shuttle carrier system 70 is controlled by a carrier system controller 72 (see FIG. 11) including a microcomputer and the like.

Figure 11:
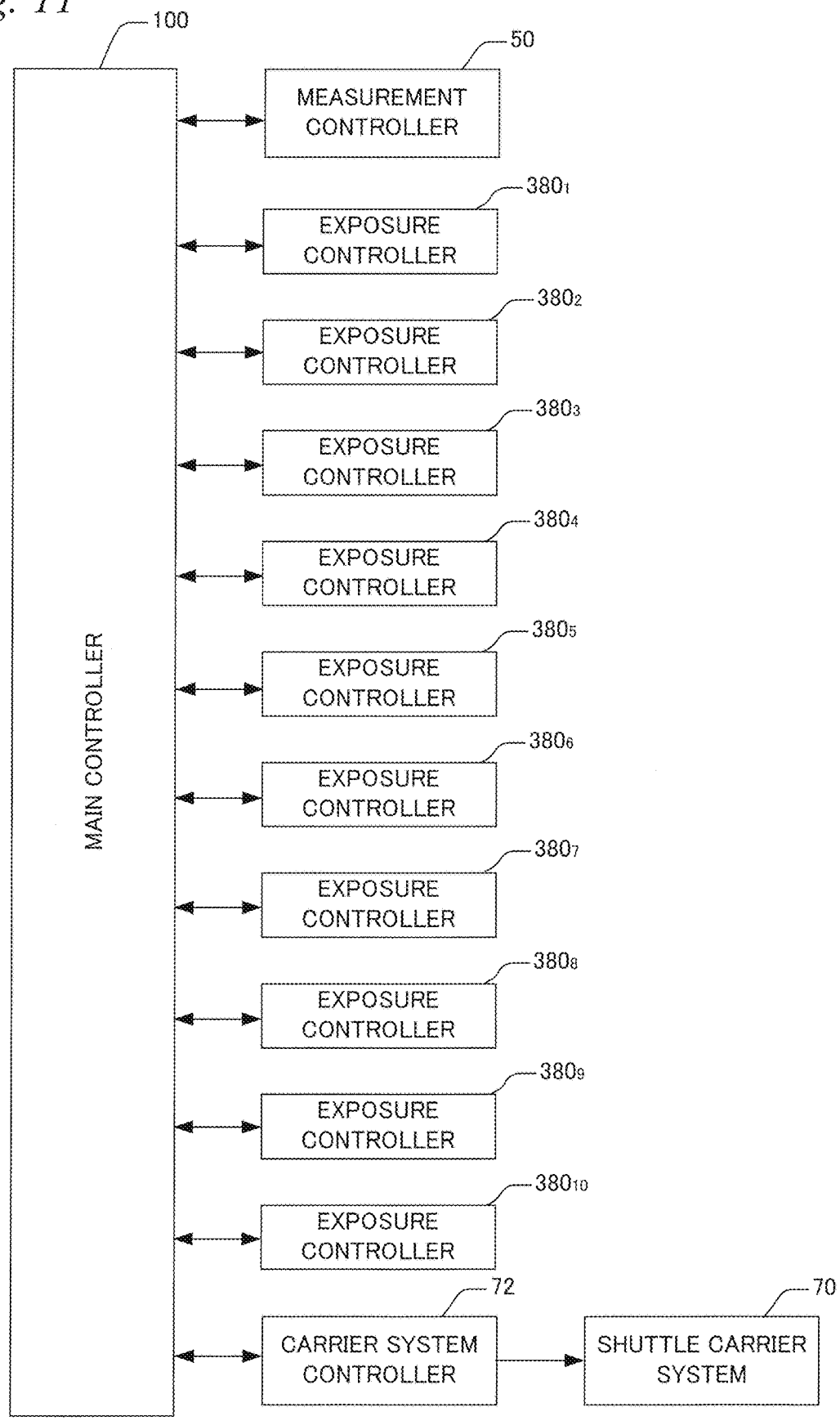
FIG. 11 is a block diagram showing the configuration of a control system of the exposure system.

FIG. 11 shows, in a block diagram, the configuration of a control system of exposure system 1000. The control system of exposure system 1000 is equipped with: a main controller 100 made up of a workstation and the like that comprehensively performs the overall controls of exposure system 1000; measurement controller 50 under the control of main controller 100; a plurality (ten in this case) of exposure controllers $380_i$ (i=1 to 10); and carrier system controller 72.

FIG. 12 shows, in a block diagram, the input/output relationships of measurement controller 50 that configures the control system as shown FIG. 11. Measurement controller 50 includes a microcomputer and the like and controls each of the components, as shown in FIG. 12, provided in measurement room 60.

FIG. 13 shows, in a block diagram, the input/output relationships of the ten exposure controllers $380_i$ that configure the control system as shown FIG. 11. Exposure controller $380_i$ includes a microcomputer and the like and controls each of the components, as shown in FIG. 13, provided in exposure chamber $301_i$.

Next, an example of advance preparation works including pre-measurement operations performed in measurement room 60 will be described on the basis of the flowchart shown in FIG. 14A. Although the processing of each step to be described below will be performed under the control of measurement controller 50, the description regarding main controller 50 will be omitted except for the case where such description is necessary in particular, in order to simplify the description.

As a prerequisite, it is assumed that a plurality of shuttles 10 are stored in the shuttle stocker installed in measurement room 60. Further, it is assumed that a wafer before exposure is placed on a substrate delivery section, by a wafer carrier system on the C/D 9000 side that is connected in-line to measurement room 60.

In Step S102, shuttle 10 stored in the shuttle stocker is attached to measurement table TB. Specifically, shuttle 10 stored in the shuttle stocker is carried, by measurement room interior carrier system 62, from the shuttle stocker to above measurement table TB located at the foregoing second position on measurement stage ST at the wafer exchange position, and then is driven downward and attached to measurement table TB via the kinematic coupling.

In the next step, Step S104, the wafer before exposure (to be a wafer $W_1$, for the sake of convenience) at the substrate delivery section is delivered to the plurality of pins 32 of measurement stage ST by measurement room interior carrier system 62. At this time, measurement table TB is at the second position, and in this state, wafer $W_1$ is placed on the plurality of pins 32 in a state where the rotational position displacement and the center position displacement have been adjusted.

In the next step, Step S106, shuttle 10 is caused to hold wafer $W_1$. Specifically, measurement table TB is driven upward to the first position, and thereby wafer $W_1$ is placed on the electrostatic chuck of shuttle 10, and after that, the adsorption of the wafer by the electrostatic chuck is started. Note that shuttle 10 is provided with a connecting terminal connected to the electrostatic chuck and measurement table TB is provided with a table-side terminal connected to an electric power supplying source that is not illustrated, and when shuttle 10 is attached to measurement table TB via the kinematic coupling, the connecting terminal and the table-side terminal are connected, which enables the electric power to be supplied from the electric power supplying source to the electrostatic chuck.

In the next step, Step S108, the brief (rough) position measurement of wafer $W_1$ with respect to shuttle 10 is performed. Specifically, the search alignment of wafer $W_1$ is performed first, and then the position information of reference marks (not illustrated) provided at shuttle 10 is measured and the relative position information of wafer $W_1$ with respect to shuttle 10 (the reference marks) is obtained.

When the search alignment is performed, for example, at least two search alignment marks located on the periphery, substantially symmetric with respect to the center of wafer $W_1$ serve as detection targets. While positioning each of the search marks within the detection area (the detection field) of primary alignment system AL1 by controlling the driving of measurement stage ST by measurement stage driving system 36, measurement controller 50 acquires measurement information by measurement stage interferometer 38, and obtains the position information of each of the search marks on the basis of a detection signal obtained when detecting the search marks formed on wafer $W_1$ using primary alignment system AL1 and the measurement information by measurement stage interferometer 38.

More specifically, measurement controller 50 obtains the position coordinates of the two search marks on the reference coordinate system, on the basis of the detection result of primary alignment system AL1 output from a signal processing device (not illustrated) (the relative positional relationship between the detection center (the index center) of primary alignment system AL1 and each of the search marks obtained from the detection signal), and on the basis of the measurement values of measurement stage interferometer 38 at the time of detecting each of the search marks.

After that, measurement controller 50 obtains the position coordinates, on the reference coordinate system, of a plurality of reference marks provided on shuttle 10, in the procedures similar to those for the search marks. Then, measurement controller 50 obtains the relative position of wafer $W_1$ with respect to shuttle 10, on the basis of the position coordinates of the two search marks and the position coordinates of the plurality of reference marks. Thus, the rough position measurement of wafer $W_1$ with respect to shuttle 10 is finished. Note that, in actuality, wafer $W_1$ is loaded onto shuttle 10 in a state where the rotational position displacement and the center position displacement have been adjusted, and therefore the center position displacement of wafer $W_1$ is negligibly small and the residual rotation error is very small.

When the processing in Step S108 (the rough position measurement of wafer $W_1$ with respect to shuttle 10) is finished, the procedure proceeds to Step S109, and wafer alignment of an EGA (Enhanced Global Alignment) method to obtain the array of a plurality of shot areas on wafer $W_1$ is performed. Prior to starting this wafer alignment, the positional adjustment of secondary alignment systems $AL2_1$ to $AL2_4$ in the X-axis direction is performed in accordance with the placement of the alignment short areas. In the wafer alignment, the step movement of fine movement stage 322b is performed in the Y-axis direction (and the X-axis direction) within the XY plane, and one alignment mark or a plurality of alignment marks on wafer $W_1$ is/are sequentially positioned in at least some of the detection areas of the five alignment systems AL1 and $AL2_1$ to $AL2_4$, and the one alignment mark or the plurality of alignment marks is/are detected by alignment detection system. ALG. In this case, it is possible that the step movement of fine movement stage 322b is performed only in the Y-axis direction and a plurality (e.g. three or five) of marks are detected using at least some of the five alignment systems AL1 and $AL2_1$ to $AL2_4$. However, it is assumed here that the step movement of fine movement stage 322b is performed in the X-axis direction and the Y-axis direction, and all-shots alignment is performed in which at least one each alignment mark formed in all of shot areas (a predetermined number of shot areas) on wafer $W_1$ is detected. Then, on the basis of detection result of each of the alignment marks and measurement information of measurement stage interferometer 38 at the time of each detection, the position on the foregoing reference coordinate system is obtained for each of the predetermined number of alignment marks. Then, using the positions of the predetermined number of alignment marks thus obtained, statistical operation is performed in the EGA method disclosed in, for example, U.S. Pat. No. 4,780,617 and the like, and thereby the array, on the reference coordinate system, of all the shot areas on wafer $W_1$ is calculated.

Next, in Step S110, the flatness measurement (the measurement of unevenness of the surface) of wafer $W_1$ is performed. This flatness measurement is performed by capturing measurement information of surface position detecting device AF and measurement information of measurement stage interferometer 38 at predetermined sampling intervals, while moving measurement stage ST in the Y-axis direction. The measurement of the flatness of the wafer is performed here because a position measurement error (a lateral displacement) of the wafer within XY plane occurs due to the unevenness of the wafer surface, and therefore, this position measurement error needs to be corrected on the exposure. This position measurement error can be obtained easily by arithmetic operation on the basis of flatness information of the wafer (information Z (X, Y) of the Z-position in accordance with the XY coordinate position (X, Y) on a wafer coordinate system). Note that, since information on rotational displacement of the wafer is known from the search alignment, the relationship between the wafer coordinate system and the foregoing reference coordinate system can be obtained easily.

When the flatness measurement in Step S110 is finished, in Step S112, shuttle 10 holding wafer $W_1$ is driven upward by measurement room interior carrier system 62, and is removed from measurement table TB by releasing the kinematic coupling, and then is placed onto a shuttle placing section on the loading side of a shuttle delivery section provided in a boundary section between measurement room 60 and carrying space SP. Thus, the advance preparation work including the pre-measurement operations (S108, S109 and S110) in measurement room 60 is finished. Note that also after shuttle 10 has been removed from measurement table TB, the electrostatic chuck of shuttle 10 is capable of holding wafer $W_1$ with the residual charge.

Further, an internal power source may be provided in shuttle 10, and the electric power may be supplied from this internal power source to the electrostatic chuck, after shuttle 10 has been removed from measurement table TB.

Next, an unloading work of an exposed wafer that is performed in measurement room 60 will be described on the basis of the flowchart as shown in FIG. 14B. Although the processing of each step to be described below will be performed under the control of measurement controller 50, the description regarding measurement controller 50 will be omitted except for the case where such description is necessary in particular, in order to simplify the description. As a prerequisite, it is assumed that the shuttle holding the exposed wafer is placed on a shuttle placing section on the unloading side of the shuttle delivery section.

In Step S122, shuttle 10 holding the exposed wafer (called a wafer $W_0$, for the sake of convenience) is attached to measurement table TB. Specifically, shuttle 10 holding wafer $W_0$ is carried, by measurement room interior carrier system 62, from the shuttle placing section on the unloading side of the shuttle delivery section, to above measurement table TB located at the foregoing first position on measurement stage ST at the wafer exchange position, and then is driven downward and attached to measurement table TB via the kinematic coupling.

In the next step, Step S124, wafer $W_0$ is detached (removed) from shuttle 10. Specifically, the adsorption of wafer $W_0$ by the electrostatic chuck of shuttle 10 is released and measurement table TB is driven downward to the second position. Accordingly, wafer $W_0$ is entirely pushed up from below by the plurality of pins 32, and wafer $W_0$ can be easily detached from shuttle 10. Note that, in the case where it is difficult to detach wafer $W_0$ from shuttle 10 because of the residual charge, wafer $W_0$ may be detached, for example, while applying the ultrasonic to wafer $W_0$, or taking various charge-removing measures with respect to the wafer.

In the next step, Step S126, wafer $W_0$ supported by the plurality of pins 32 is carried out from measurement table TB and placed onto the foregoing substrate delivery section by measurement room interior carrier system 62.

In the next step, Step S128, shuttle 10 is driven upward by measurement room interior carrier system 62, and is removed from measurement table TB by releasing the kinematic coupling, and then is housed in a vacant housing shelf of the shuttle stocker. Thus, the unloading work of the exposed wafer in measurement room 60 is finished. Shuttle 10 housed in the shuttle stocker will be stored in the shuttle stocker until it is taken out next, and the temperature of shuttle 10 is adjusted (cooled) to a predetermined temperature during this storage.

Next, the flow of processing with respect to a wafer by exposure system 1000 will be described. The processing to be described below is performed by measurement controller 50 and exposure controllers $380_1$ to $380_{10}$, and carrier system controller 72, under the control of main controller 100 that performs the comprehensive control of these controllers. However, the description regarding these controllers will be omitted below except for the case where such description is necessary in particular.

Prior to starting the processing by exposure system 1000, a wafer before exposure that is coated with electron ray resist is placed, by a carrier system (e.g. a multijoint-type robot) within C/D 9000, onto a substrate delivery section provided in a boundary section between measurement room 60 and C/D 9000. In C/D 9000, a series of processing including electron ray resist coating processing with respect to the wafers is repeatedly performed, and the wafers are sequentially placed on the substrate delivery section.

First of all, in measurement room 60, the processing of Step S102 to Step S112 described earlier is performed. By the processing of these steps, shuttle 10 holding wafer $W_1$ before exposure, to which the rough position measurement of the wafer with respect to the shuttle, the wafer alignment by the EGA method (in this case, all-shots-alignment (which is also called a full-point EGA)) and the flatness measurement have been finished, is placed onto the shuttle placing section on the loading side of the shuttle devilry section.

Subsequently, shuttle 10 holding wafer $W_1$ before exposure is carried, by shuttle carrier system 70, from the shuttle placing section on the loading side of the shuttle devilry section to a position in front of load lock chamber $302_i$ corresponding to exposure room $301_i$ designated by main controller 100, and then is exchanged with shuttle 10 holding wafer $W_0$ that has been exposed in the designated exposure room $301_i$. In this case, if there is any exposure room $301_i$ in which the exposure processing to a wafer has been finished at this point in time, main controller 100 designates such an exposure room $301_i$, whereas if there is no exposure room in which the exposure processing has been finished, main controller 100 designates exposure room $301_i$ in which the exposure processing will be finished at the earliest timing. Here, as an example, it is assumed that exposure room $301_i$ in which the exposure processing will be finished at the earliest timing is designated.

A shuttle exchange operation, that is, an exchange operation of a wafer integral with the shuttle will be described below. First of all, shuttle 10 holding wafer $W_1$ carried out from the shuttle placing section on the loading side of the shuttle delivery section is carried, by shuttle carrier system 70, to a position in front of load lock chamber $302_i$ of vacuum chamber $300_i$ inside which exposure room $301_i$ is formed. At this time, exposure of wafer $W_0$ is being performed in exposure room $301_i$. Note that, in the description below, the "shuttle holding wafer $W_1$" is expressed as a "shuttle $10_1$" and the "shuttle holding wafer $W_0$" is expressed as a "shuttle $10_0$", for the sake of convenience.

When the exposure of wafer $W_0$ is finished, gate valve $302b$ on the external side (the atmospheric side) provided at load lock chamber $302_i$ of vacuum chamber $300_i$ is opened, and then, shuttle $10_1$ is carried, by shuttle carrier system 70, into the load lock room inside main body section $302a$. Next, gate valve $302b$ on the external side (the atmospheric side) is closed, and then the inside of the load lock room starts to be evacuated.

After carrying in shuttle $10_1$ into the load lock room, shuttle carrier system 70 engages in an operation (hereinafter, referred to as another operation) such as an operation of carrying in another shuttle holding a next wafer before exposure from the shuttle delivery section into another load lock room, or an operation of carrying out yet-another shuttle holding another wafer that has been exposed from yet-another load lock room and carrying it to the shuttle delivery section.

Then, when the inside of the load lock room reaches a high vacuum state of about the same level as exposure room $301_i$, gate valve $302c$ on the inner side (the vacuum side) provided at load lock chamber $302_i$ is opened and then, by exposure room interior carrier system 312 inside exposure room $301_i$, shuttle $10_1$ is housed in the housing shelf, for example, on a lower side, of shuttle carrier 306 within exposure room $301_i$. At this time, in shuttle carrier 306, the height of the housing shelf on the lower side is in a first state (a first position) of coinciding with the opening of the load lock room. The position of shuttle $10_1$ at this time is referred to as a carry-out/in position, for the sake of convenience. At this time, exposure with respect to wafer $W_0$ on shuttle $10_0$ is being continued.

Subsequently, shuttle carrier 306 is moved downward from the first position to a second position that is a first distance lower than the first position. By this downward movement, in shuttle carrier 306, the height of the housing shelf on an upper side is in a second state of coinciding with the height of the opening of the load lock room. At this time, since exposure with respect to wafer $W_0$ on shuttle $10_0$ is being continued, shuttle carrier 306 maintains the second state until the exposure is finished. That is, shuttle $10_1$ stands by at a first standby position below the carry-out/in position.

And, when the exposure is finished, shuttle $10_0$ is removed from fine movement stage 322b and housed in the housing shelf on the upper side of shuttle carrier 306, by exposure room interior carrier system 312. Note that, prior to shuttle $10_0$ being removed from fine movement stage 322b, the feedback control of the position and the attitude in the directions of six degrees of freedom of fine movement stage 322b based on measurement information of second measurement system 25 (see FIG. 13) is started by exposure controller $380_i$, and the position and the attitude in the directions of six degrees of freedom of fine movement stage 322b are maintained in a predetermined reference state until the position control of fine movement stage 322b integral with the shuttle based on measurement information of first measurement system 20 (see FIG. 13) is started next.

Subsequently, shuttle carrier 306 is moved upward by the first distance, and returns to the foregoing first state (the first position). That is, by this upward movement operation of shuttle carrier 306, shuttle $10_1$ and shuttle $10_0$ are moved upward by the first distance, and thereby shuttle $10_0$ is positioned at a second standby position above the carry-out/in position and shuttle $10_1$ is positioned at the carry-out/in position.

Subsequently, by exposure room interior carrier system 312, shuttle $10_1$ is taken out from shuttle carrier 306 and carried toward above coarse-fine movement stage 322, and attached to fine movement stage 322b. At this time, as is described earlier, since the position and the attitude in the directions of six degrees of freedom of fine movement stage 322b are maintained in the reference state, the positional relationship between electron beam irradiation device 330 (the electron beam optical system) and shuttle $10_1$ becomes a desired positional relationship, only by attaching shuttle $10_1$ to fine movement stage 322b via the kinematic coupling. Then, the position of fine movement stage 322b is finely adjusted, taking into account the result of the rough position measurement described previously. Then, some of the alignment marks formed on wafer $W_1$ on shuttle $10_1$ attached to fine movement stage 322b are irradiated with the electron beams from the electron beam optical system, and the reflected electrons from the some of the alignment marks are detected by the reflected electron detecting system, and the position measurement of wafer $W_1$ is performed, and then on the basis of the result of this position measurement and the result of the full-point EGA performed previously, exposure using electron beam irradiation device 330 is started with respect to a plurality of shot areas on wafer $W_1$.

In parallel with the position measurement and the exposure of wafer $W_1$ using the electron beams described above, a carrying operation (a shuttle recovering operation) of carrying shuttle $10_0$ to the shuttle placing section on the unloading side of the foregoing shuttle delivery section is performed in the following procedures.

That is, first of all, shuttle carrier 306 is moved downward by the first distance, and comes into the second state again. Accordingly, the housing shelf on the upper side of shuttle carrier 306 on which shuttle $10_0$ is housed is located at the same height as the opening of the load lock room.

Subsequently, shuttle $10_0$ is taken out from shuttle carrier 306 and carried toward the inside of the load lock room, and at the point in time when shuttle $10_0$ is carried into the load lock room, gate valve 302c on the vacuum side is closed.

At this time, shuttle carrier system 70 has temporarily finished the foregoing another operation and has moved to a position in front of load lock chamber $302_i$ equipped in vacuum chamber $300_i$. Note that, in the case where shuttle carrier system 70 is continuing the another operation, main controller 100 may immediately cause shuttle carrier system 70 to temporarily suspend the another operation and to move to a position in front of load lock chamber $302_i$ equipped in vacuum chamber $300_i$, for example, at the point in time when exposure of wafer $W_0$ within exposure room $301_i$ is finished.

Subsequently, after gate valve 302b on the atmospheric side is opened, shuttle $10_0$ is taken out from the load lock room and recovered by shuttle carrier system 70. Before or after opening gate valve 302b, exposure controller $380_i$ drives upward shuttle carrier 306 in the second state by the first distance, and restores shuttle carrier 306 into the first state. Note that after shuttle $10_0$ is taken out, gate valve 302b is closed.

Subsequently, shuttle $10_0$ that has been recovered is immediately returned, by shuttle carrier system 70, to the shuttle placing section on the unloading side of the shuttle delivery section. Shuttle $10_0$ that has been returned is carried, by measurement room interior carrier system 62, toward measurement table TB for wafer exchange. After that, the foregoing processing is repeatedly performed in measurement room 60, and every time the exposure room is designated by main controller 100, the operations for carriage of the shuttle by shuttle carrier system 70, shuttle exchange and exposure processing in the designated exposure room $301_i$ are repeatedly performed.

Note that, although shuttle carrier 306 is to be restored to the first state (the first position) before or after the opening of gate valve 302b to take out shuttle $10_0$ from the load lock room, this is not intended to be limiting, and shuttle carrier 306 in the second state may be kept unchanged. In this case, when the shuttle exchange is performed in exposure room $301_i$, the shuttle exchange should be performed in the procedures similar to those described above while the setting of the first state and the second state of shuttle carrier 306 is reversed to the above-described setting.

Note that, in actuality, a period of time in total required for the advance preparatory work in measurement room 60 described above and a series of operations by shuttle carrier system 70 (such as an operation of carrying in a shuttle holding a wafer before exposure from the shuttle delivery section into the load lock room, and an operation of carrying out a shuttle holding a wafer that has been exposed from the load lock room and carrying the shuttle to the shuttle delivery section) is remarkably shorter than a period of time required for the exposure operation performed in one exposure unit 310, and therefore, it is sufficient to have one each of measurement room 60 and shuttle carrier system 70 provided for the ten exposure units 310, as in exposure system 1000 related to the present embodiment. That is, there is no risk that the decreased in throughput of exposure system 1000 as a whole is caused by a series of operations in measurement room 60 and a series of operations by shuttle carrier system 70. Moreover, with the system configuration described above, the sufficient throughput can practically be secured. Note that, since it is easy to additionally provide a vacuum chamber/vacuum chambers (an exposure room/exposure rooms) adjacently to vacuum chamber 300$_5$ and vacuum chamber 300$_{10}$, further improvement in throughput can be expected by further increasing the number of exposure rooms (and exposure units), in the case where there is the idle time for measurement room 60 and shuttle carrier system 70.

As is described above, according to exposure system 1000 related to the present embodiment, control rack 500 that supplies the utility, supplied from below floor surface F via the wiring and the piping, to measurement chamber 200 and also distributes the utility to each of chambers 300$_1$ to 300$_{10}$ is disposed between the two rows of chambers 300$_1$ to 300$_5$ and chambers 300$_6$ to 300$_{10}$, and C/D 9000, and besides above measurement chamber 200. The height of chambers 300$_1$ to 300$_{10}$, the height of C/D 9000, the height of the upper surface of frame 400 and the height of control rack 500 are set so that the upper surfaces of chambers 300$_1$ to 300$_{10}$, the upper surface of C/D 9000 and the upper surface of control rack 500 are located substantially coplanar. Further, the layout in which the width size (the size in the Y-axis direction) of the two rows of chambers 300$_1$ to 300$_5$ and 300$_6$ to 300$_{10}$, and the width size of the C/D 9000 are made uniform is employed.

Consequently, the components of exposure system 1000 that include the two rows of the chambers, measurement chamber 200 and control rack 500, together with C/D 9000, occupy a space having a rectangular parallelepiped shape as a whole. Thus, in the present embodiment, it is possible to avoid a space of poor usability from being generated in the clean room and to attain improvement in the space utilization efficiency.

Further, since control rack 500 supplies the utility from above to each of chambers 300$_1$ to 300$_{10}$, there are the advantages as follows. Specifically, for example, many electric cables (wirings) need to be connected to barrel 331 of electron beam irradiation device 330, and if such connection of the electric cables is tried from below for example, the connection itself will have difficulty because there exist stage device 320 including coarse-fine movement stage 322 and the like, which will be an obstacle. In contrast, in the case of making the connection of the electric cables from above to barrel 331, there is no obstacle, and therefore even if there are lots of electric cables, the connection of the electric cables can be made easily.

Further, exposure system 1000 related to the present embodiment is equipped with the ten exposure units 310 in total accommodated inside vacuum chambers 300$_1$ to 300$_{10}$, respectively, and each exposure unit 310 is equipped with electron beam irradiation device 330. In electron beam irradiation device 330, the optical system column made up of the multibeam optical system capable of arranging the circular spots of, for example, the 4000 electron beams, each of which has a diameter of 20 nm and can individually be turned ON/OFF and besides deflected, within a rectangular-shaped exposure area (e.g., 100 μm×20 nm) is disposed, for example, in the 100 positions within barrel 331, for example, in a positional relationship corresponding to the 100 shot areas on, for example, a 300 mm wafer, substantially on one-to-one basis. Consequently, exposures of different wafers are performed in parallel by the ten exposure units 310 in total, which allows throughput to remarkably be improved compared to a conventional electron beam exposure apparatus.

Further, in exposure system 1000 related to the present embodiment, prior to exposure, the pre-measurement such as the measurement of the positional relationship of a wafer with respect to shuttle 10, the alignment measurement of the EGA method and the flatness measurement of the wafer is performed in a state where the wafer is held by shuttle 10, in measurement room 60 that is different from exposure room 301$_i$, and after that, shuttle 10 holding the wafer to which the pre-measurement has been finished is carried into each exposure room 301$_i$ and attached to fine movement stage 322b located at the reference position, via the kinematic coupling, and only the position confirmatory work of the wafer in which several alignment marks on the wafer are measured by irradiating the wafer with electron beams is performed, and thereby exposure with respect to the wafer can immediately be started using the result of the alignment measurement, e.g., the full-point EGA measurement and the result of the flatness measurement that have been performed beforehand. Also in this regard, throughput can be remarkably improved compared to the conventional case.

Further, in exposure system 1000, a wafer to which the pre-measurement has been finished and a wafer to which the exposure has been finished are carried, integrally with shuttles 10, by shuttle carrier system 70 between measurement room 60 and load lock chamber 302$_i$ of each of vacuum chambers 300$_1$ to 300$_{10}$. Therefore, after shuttle 10 holding the wafer, to which the pre-measurement has been finished, is carried into load lock chamber 302$_i$ of each of vacuum chambers 300$_1$ to 300$_{10}$, and is carried into each exposure room 301$_i$ by exposure room interior carrier system 312 and is attached to fine movement stage 322b, only the foregoing position confirmatory work of the wafer is performed, and thereby the exposure of the wafer can be immediately started.

Further, according to stage device 320 equipped in each of the plurality of exposure units 310 of exposure system 1000 related to the present embodiment, coarse movement stage driving system 323 that drives coarse movement stage 322a in the X-axis direction is made up of a uniaxial drive mechanism, for example, a feed screw mechanism using a ball screw, and therefore there is no risk that the magnetic flux leakage from the feed screw mechanism occurs. Further, as fine movement stage driving system 327 that drives fine movement stage 322b to which shuttle 10 is attached in the directions of six degrees of freedom, the foregoing motor 327 of a closed magnetic field type and besides a moving magnet type is used, and also the upper surface and the surfaces of both sides of the motor are covered with magnetic shield member 328 whose both ends are fixed to coarse movement stage 322a, and therefore the magnetic flux leakage to above can be effectively suppressed or prevented in the entire movement range of coarse movement stage 322a and fine movement stage 322b. Consequently, in the present embodiment, there is no risk of generating variation in magnetic field that gives an unignorably adverse effect on the positioning of electron beams emitted from abeam source of electron beam irradiation device 330. Note that since the magnetic flux leakage to above can be effectively suppressed or prevented in stage device 320 related to the present embodiment as is described above, stage device 320 is suitable as a stage device used in an electron beam exposure apparatus, the other charged particle beam exposure apparatus or an SEM or the like.

Note that, although an example in which coarse movement stage driving system 323 is configured of the feed screw mechanism using the ball screw is shown in the present embodiment, the coarse movement stage driving system is not limited to such a configuration. For example, similarly to the fine movement stage, it is also possible to use a coarse movement stage driving system in which measures against the magnetic flux leakage is taken.

Further, in stage device 320 related to the present embodiment, since weight cancelling device 324 that supports the empty weight of fine movement stage 322b (and shuttle 10) on surface plate 321 is provided, it is not necessary to generate a continuous force for supporting the empty weight by motor 327 when the motor does not drive the fine movement stage (and shuttle 10). Accordingly, it is possible to prevent the inconvenience caused by the heating being increased and to further suppress or prevent the magnetic force from adversely affecting the positioning of electron beams.

Further, in exposure unit 310 related to the present embodiment, in a state where shuttle 10 is attached to fine movement stage 322b, the position information of fine movement stage 322b in the directions of six degrees of freedom is measured by first measurement system 20 made up of the foregoing encoder system that measures the position information of shuttle 10. Since the encoder system has an optical path length that is extremely short compared to that of an interferometer, the required space is small, which allows first measurement system 20 to be smaller in size. Further, first measurement system 20 can perform the measurement of twelve degrees of freedom in total as is described earlier, and therefore, the redundant measurement is performed and two pieces of the position information are obtained for each of the directions of six degrees of freedom. Then, exposure controller 380 assumes the average value of the two pieces of the position information for each degree of freedom, as the measurement result for each direction, on the basis of the position information measured by first measurement system 20. Accordingly, the position information of shuttle 10 and fine movement stage 322b can be obtained with high accuracy for all the directions of six degrees of freedom, by the averaging effect. Consequently, the position controllability of the wafer on exposure can be improved, and the highly accurate exposure can be performed.

Further, in exposure unit 310 related to the present embodiment, second measurement system 25 that constantly measures the position information of fine movement stage 322b in the directions of six degrees of freedom is provided separately from first measurement system 20. Therefore, in exposure controller $380_i$ (i=1 to 10), the position and the attitude in the directions of six degrees of freedom of fine movement stage 322b can be controlled also when the shuttle is not attached to fine movement stage 322b.

Further, in exposure system 1000 related to the present embodiment, the entirety of exposure unit 310 is accommodated inside vacuum chamber $300_i$. Consequently, even if the atmospheric pressure varies, barrel 331 whose entirety is accommodated inside vacuum chamber $300_i$ is not deformed, and there is no risk of, for example, a situation in which the electron beam optical system within barrel 331 is adversely affected occurring.

Note that, in the embodiment described above, the case has been exemplified where one exposure unit 310 is accommodated inside vacuum chamber $300_i$, but this is not intended to be limiting, and two or more exposure units 310 may be accommodated inside one vacuum chamber. Further, in the embodiment described above, while the case has been descried where exposure system 1000 is equipped with the ten exposure rooms $301_i$ and one measurement room 60, the number of the exposure rooms is not particularly concerned.

However, the even number is desirable in the viewpoint of their layout. Furthermore, all of chambers $300_1$ to $300_5$ and $300_6$ to $300_{10}$ in the two rows do not have to be provided, and at least only one of chambers $300_1$ and $300_6$ that are adjacent to measurement chamber 200 and control rack 500 may be provided.

Note that, in the embodiment described above, electron beam irradiation device 330 is supported, integrally with metrology frame 340, in a suspended manner by the top plate (the ceiling wall) of the vacuum chamber or by frame 400 via the three suspension support mechanisms 350a, 350b and 350c, but this is not intended to be limiting, and electron beam irradiation device 330 may be supported by a body of a floor placement type.

In either of the case of carrying a wafer integrally with the shuttle, and the case of carrying the wafer alone, carrying space SP described earlier into which the wafer is carried and a part of measurement room 60 that communicates with carrying space SP may be configured so that they can be set into a low vacuum state whose vacuum degree is lower compared to the inside of the vacuum chamber. In the case of carrying in the wafer (and the shuttle) from the atmosphere into the load lock room, it is necessary to evacuate the inside of the load lock room within a period of time as short as possible until the inside of the load lock room becomes a high vacuum state of about the same level as the inside of the vacuum chamber, and in this case, the environment where the wafer (and the shuttle) is/are placed changes from the atmospheric pressure into the high vacuum and the wafer shrinks due to the temperature decrease. On the other hand, in the case of carrying in the wafer (and the shuttle) from the low vacuum space into the load lock room, the decreasing ratio in temperature is lower, and therefore the shrinkage of the wafer caused by the temperature decrease is smaller.

Note that the shuttle holding the exposed wafer does not necessarily have to be returned to measurement room 60. For example, a wafer carrying-out section is provided separately from measurement room 60, and the wafer may be removed from the shuttle in such a wafer carrying-out section.

Further, although the case has been described in the embodiment described above where fine movement stage 322b is movable in the directions of six degrees of freedom with respect to coarse movement stage 322a, this is not intended to be limiting, and the fine movement stage may be movable only within the XY plane. In this case, first measurement system 20 and second measurement system 25 that measure the position information of the fine movement stage may also be capable of measuring the position information in the directions of three degrees of freedom within the XY plane.

In the embodiment described above, the redundant measurement is performed by first measurement system 20 for each direction of the directions of six degrees of freedom, and the position of the fine movement stage in each direction is obtained on the basis of the average of the two pieces of the position information obtained for each direction, but this is not intended to be limiting, and further redundant measurement may be performed for each direction of the directions of six degrees of freedom and the position of the fine movement stage in each direction may be obtained on the basis of the average of three or more pieces of the position information. Alternatively, the redundant measurement may be performed only for some of the directions of six degrees of freedom, e.g., the directions of three degrees of freedom within the XY plane, or the redundant measurement does not have to be performed for any direction.

Modified Example of First Embodiment

Figure 15:
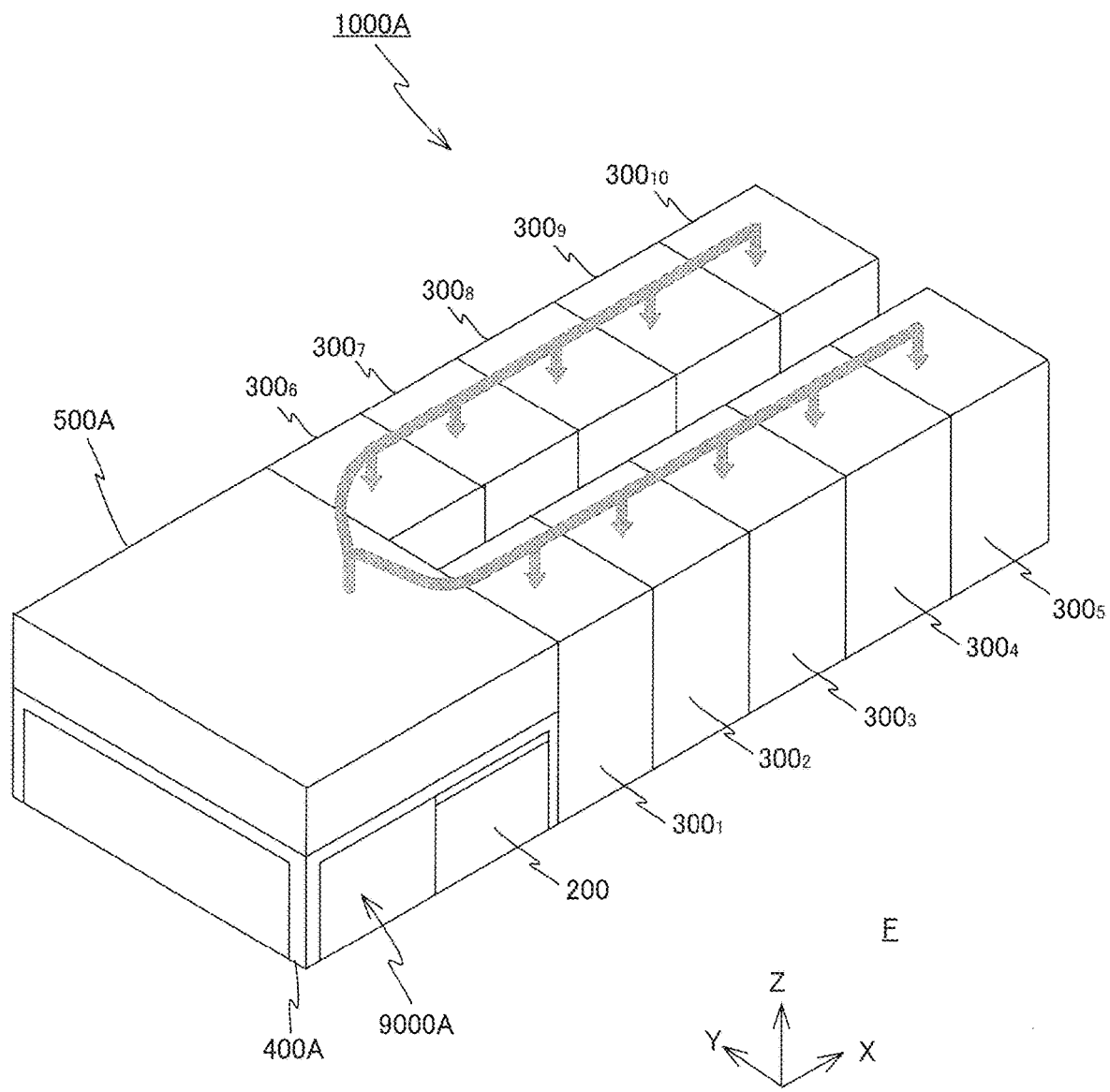
FIG. 15 is a perspective view showing an exposure system related to a modified example of the first embodiment, together with a resist coating/development device.

Next, an exposure system related to a modified example will be described, in which a control rack is disposed on a measurement chamber, similarly to exposure system 1000 related to the first embodiment described above. FIG. 15 shows, in a perspective view, an exposure system 1000A related to the present modified example, together with a C/D 9000A.

As is clearly understood when comparing FIG. 15 and FIG. 1, exposure system 1000A is partly different only in its layout from exposure system 1000 related to the first embodiment described earlier, and the functions and the like of the respective components of exposure system 1000A are similar to those of exposure system 1000. Exposure system 1000A can be disposed together with C/D 9000A in a space with a rectangular parallelepiped shape in a clean room, which is similar to exposure system 1000 related to the first embodiment described earlier.

In exposure system 1000A, C/D 9000A that has a chamber connected in-line to measurement chamber 200 and having a height lower than that of C/D 9000 is used instead of C/D 9000, and in order to effectively utilize a space above C/D 9000A, a control rack 500A whose width (the length in the X-axis direction) is larger than control rack 500 is used instead of control rack 500. Further, control rack 500A is placed on a frame 400A. Frame 400A has four leg sections located at the four corners of a space in which C/D 9000A and measurement chamber 200 are disposed side by side in the X-axis direction, and a ceiling section supported by these leg sections. Control rack 500A is placed on this ceiling section. Note that in the cases such as the case where the intensity of the chamber of C/D 9000A is sufficient or the case where the weight of control rack 500A is light, and besides the case where the height of measurement chamber 200 substantially coincides with the height of C/D 9000A, control rack 500A may be directly placed on measurement chamber 200 and C/D 9000A, without using a frame member such as frame 400A.

Also in the present modified example, wiring and piping from a utility supply source of a clean room sub-fab, located under floor surface F, pass through an empty space section between control rack 500A and floor surface F, via floor surface F, and are connected to control rack 500A from the lower side. Similarly to control rack 500, the following components are housed inside control rack 500A: a control system unit that is directly related to the electron beam exposure apparatus such as, for example, a high voltage power supply and an amplifier; a control system for stages to be described later; and various units such as a control board for measurement systems to be described later. Control rack 500A relays the wiring and the piping once, and distributes the utility supplied via the wiring and the piping (supply members) from the utility supply source of the clean room sub-fab, to measurement chamber 200 and chambers 300₁ to 300₁₀. Note that, a temperature adjuster for cooling water may be disposed inside control rack 500A, as needed. Note that, in this case as well, as the control rack, a plurality of control racks serving in different ways may be provided.

The configurations of the other components of exposure system 1000A are similar to those of exposure system 1000.

Exposure system 1000A configured as described above is installed on floor surface F of the clean room, together with C/D 9000A, in the layout as shown in FIG. 15, and thereby a lithography system that occupies a space with a rectangular parallelepiped shape in the clean room can be assembled, and thus, it is possible to avoid a space of poor usability from being generated in the clean room and to attain improvement in the space utilization efficiency in the clean room. Also with exposure system 1000A related to the present modified example, the various effects similar to those of exposure system 1000 related to the embodiment described above can be obtained.

Second Embodiment

Figure 16:
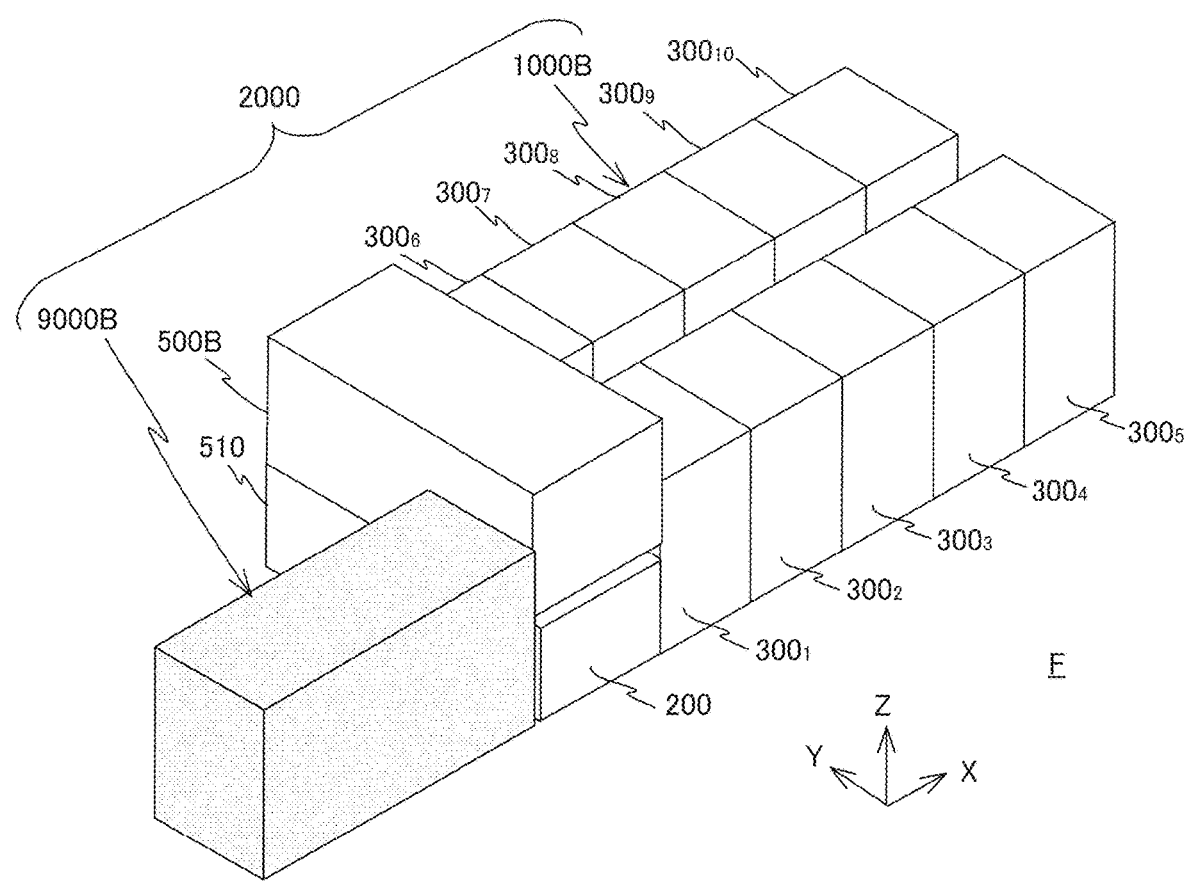
FIG. 16 is a perspective view showing an exposure system related to a second embodiment, together with a resist coating/development device.

FIG. 16 shows, in a perspective view, an exposure system 1000B related to a second embodiment together with a C/D 9000B. In FIG. 16, exposure system 1000B is illustrated in a simplified manner, and the illustration of a frame member that supports a control rack 500B is omitted. The layout of measurement chamber 200, vacuum chambers 300₁ to 300₁₀, the control rack and the like equipped in exposure system 1000B is mainly described below. The same can be said for each of embodiments and their modified examples to be described later. Also in exposure system 1000B, a frame member that supports control rack 500B does not necessarily have to be used.

In exposure system 1000B, another control rack 510 that is different from control rack 500B is disposed in the foregoing empty space on the +Y side of measurement chamber 200. Above control rack 510 and measurement chamber 200, control rack 500B is placed via a frame member (the illustration is omitted). While control rack 500B is configured similarly to control rack 500 of the embodiment described earlier and has functions equal to or more than those of control rack 500, the height of control rack 500B is higher than that of control rack 500 and its upper surface is set higher than chambers 300₁ to 300₁₀ and C/D 9000B.

Wiring and piping from a utility supply source of a clean room sub-fab are connected to control rack 510 via floor surface F, and control rack 510 supplies the utility to control rack 500B. Control rack 500B distributes the utility supplied from control rack 510 to measurement chamber 200 and the ten chambers 300₁ to 300₁₀. That is, control rack 500B functions as an interface between control rack 510, and the measurement chamber and the ten chambers 300₁ to 300₁₀. Note that a configuration of supplying the utility from control rack 510 to measurement chamber 200 may also be employed. In this case, the two control racks may be allotted separate roles, for example, by making control rack 510 serve as a control rack having a function relating to the irradiation control of electron beams irradiated from electron beam irradiation device 330 onto a wafer serving as target, and making control rack 500B serve as a control rack having the other functions.

C/D 9000B is connected in-line to measurement chamber 200, and the in-line connection port is provided on one side in the longitudinal direction of a chamber of C/D 9000B. The configuration and the like of other components of exposure system 1000B are similar to those of exposure system 1000 related to the first embodiment described earlier. Exposure system 1000B and C/D 9000B related to the present second embodiment configure a lithography system 2000. As can be seen from FIG. 16, in lithography system 2000, a free space is generated on the +Y side of C/D 9000B.

Figure 17:
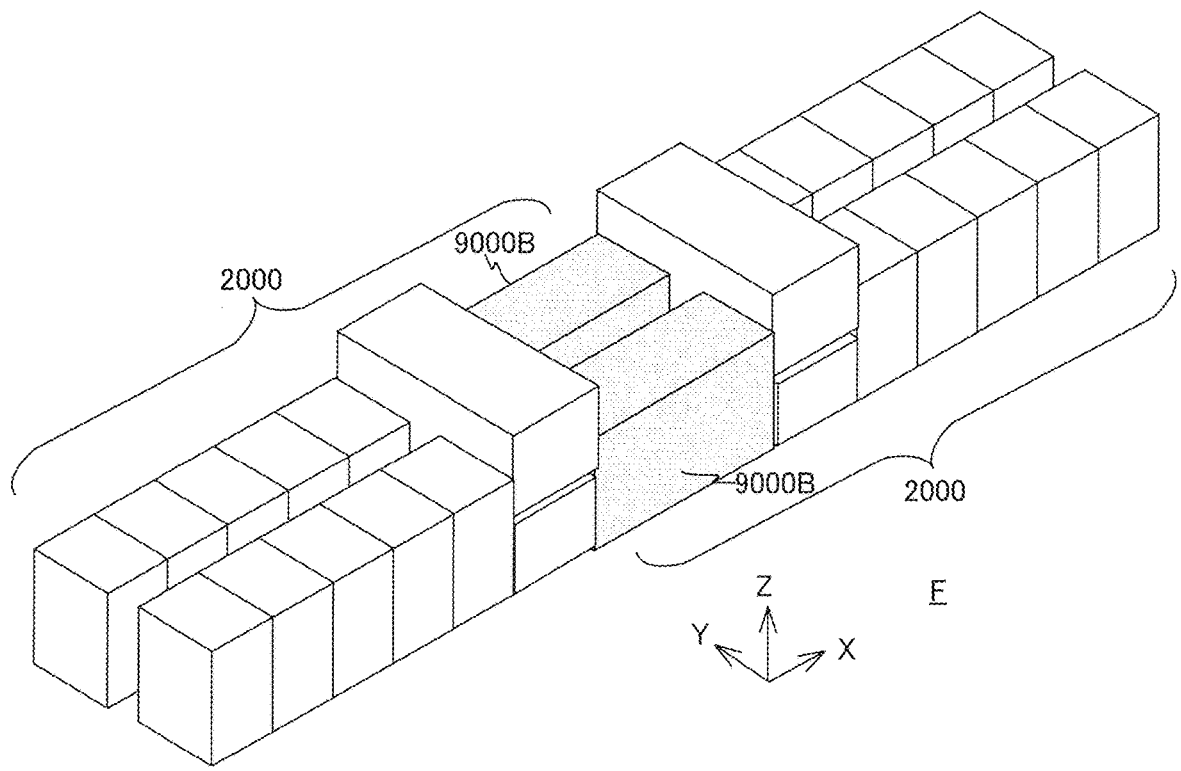
FIG. 17 is a perspective view showing a state where two lithography systems 2000 are rotated by an angle of 180 degrees with respect to each other so that the respective resist coating/development devices are disposed to face each other.

As shown in a perspective view in FIG. 17, lithography systems 2000 are disposed in a state of being rotated by an angle of 180 degrees with respect to each other so that the respective C/Ds 9000B face each other, and thereby the lithography systems can be disposed in a space with a substantially rectangular parallelepiped shape as a whole, and thus, it is possible to avoid a space of poor usability from being generated in the clean room and to attain improvement in the space utilization efficiency in the clean room.

Modified Example No. 1 of Second Embodiment

Figure 18:
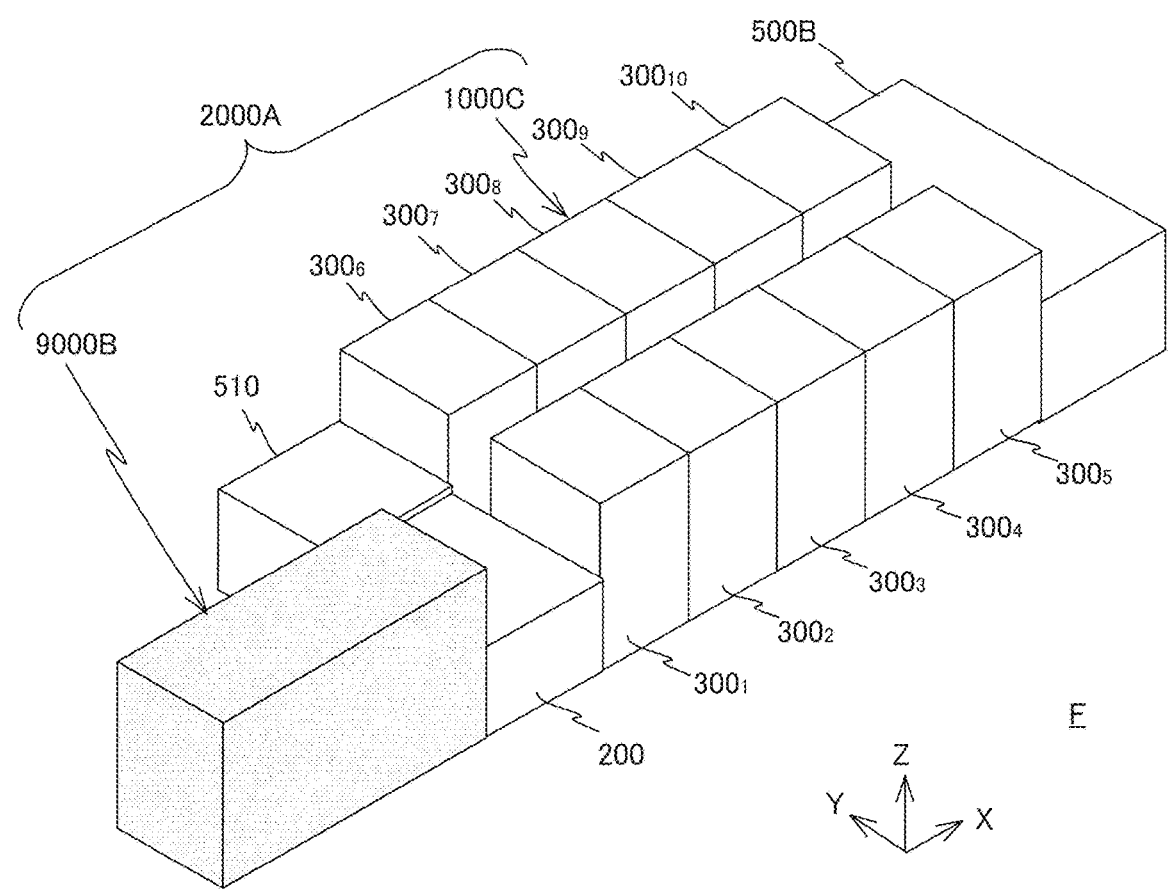
FIG. 18 is a perspective view showing an exposure system related to a modified example No. 1 of the second embodiment, together with the resist coating/development device.

FIG. 18 shows, in a perspective view, an exposure system 1000C related to a modified example No. 1 of the second embodiment, together with C/D 9000B. Exposure system 1000C is like exposure system 1000B related to the second embodiment described earlier but different in that, instead of being disposed above measurement chamber 200 and control rack 510, control rack 500B disposed on floor surface F adjacently on the +X side of chamber $300_5$ and chamber $300_{10}$. In exposure system 1000C related to the present modified example, wiring and piping from a utility supply source of a clean room sub-fab are connected to control rack 500B via floor surface F. Control rack 500B incorporates a board for controlling the components other than the electron beam irradiation devices such as, for example, a stage system, and the like. Further, control rack 510 distributes the utility to measurement chamber 200 and chambers $300_i$ (i=1 to 10) and incorporates a board relating to the control of the electron beam irradiation device of each chamber $300_i$, and the like.

Exposure system 1000C related to the present modified example configures a lithography system 2000A, together with C/D 9000B, and two lithography systems 2000A are disposed in a state of being rotated by an angle of 180 degrees with respect to each other so that the respective C/Ds 9000B face each other, and thereby the lithography systems can be disposed in a space with a substantially rectangular parallelepiped shape (a rectangular shape in planar view) as a whole, though the illustration is omitted.

Modified Example No. 2 of Second Embodiment

Figure 19:
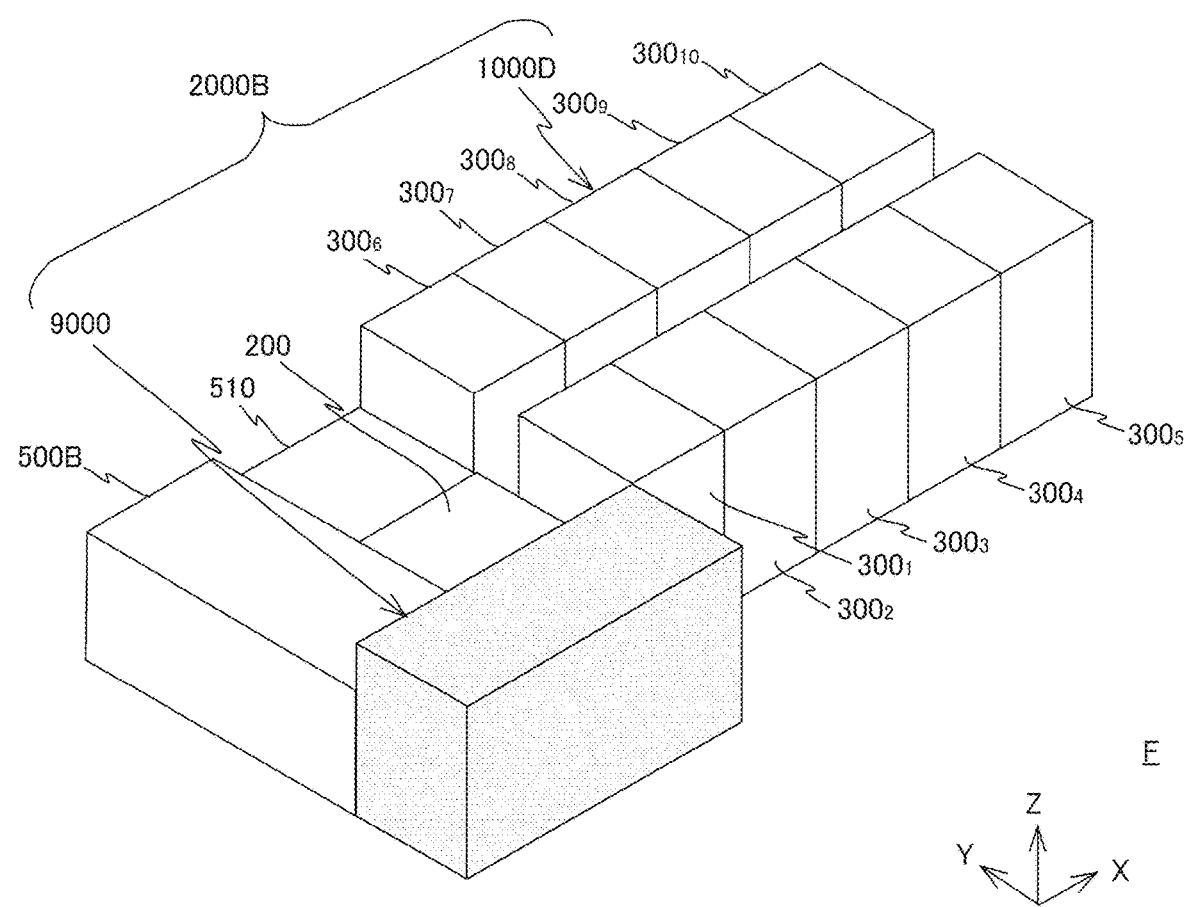
FIG. 19 is a perspective view showing an exposure system related to a modified example No. 2 of the second embodiment, together with the resist coating/development device.

FIG. 19 shows, in a perspective view, an exposure system 1000D related to a modified example No. 2 of the second embodiment, together with C/D 9000. Exposure system. 1000D is like exposure system 1000B related to the second embodiment described earlier, but different in that control rack 500B is installed on floor surface F adjacently on the −X side of measurement chamber 200 and control rack 510. In exposure system 1000D, C/D 9000 described earlier is used instead of C/D 9000B, and C/D 9000 is disposed on the −Y side of measurement chamber 200 and control rack 500B of exposure system. 1000D, and is connected in-line to measurement chamber 200. In exposure system 1000D related to the present modified example, wiring and piping from a utility supply source of a clean room sub-fab are connected to control rack 500B via floor surface F. Control rack 500B supplies the utility to control rack 510 and incorporates a board for controlling the components other than the electron beam irradiation devices such as, for example, a stage system, and the like. Further, control rack 510 distributes the utility to measurement chamber 200 and chambers $300_i$ (i=1 to 10) and incorporates a board relating to the control of the electron beam irradiation device of each chamber $300_i$, and the like.

Exposure system 1000D related to the present modified example configures a lithography system 2000B, together with C/D 9000. Although the illustration is omitted, two lithography systems 2000B are disposed in a state of being rotated by an angle of 180 degrees with respect to each other so that the respective C/Ds 9000 face each other with a predetermined distance in between, and thereby the lithography systems can be disposed in a space with a substantially rectangular parallelepiped shape (a rectangular shape in planar view) as a whole.

Modified Example No. 3 of Second Embodiment

Figure 20:
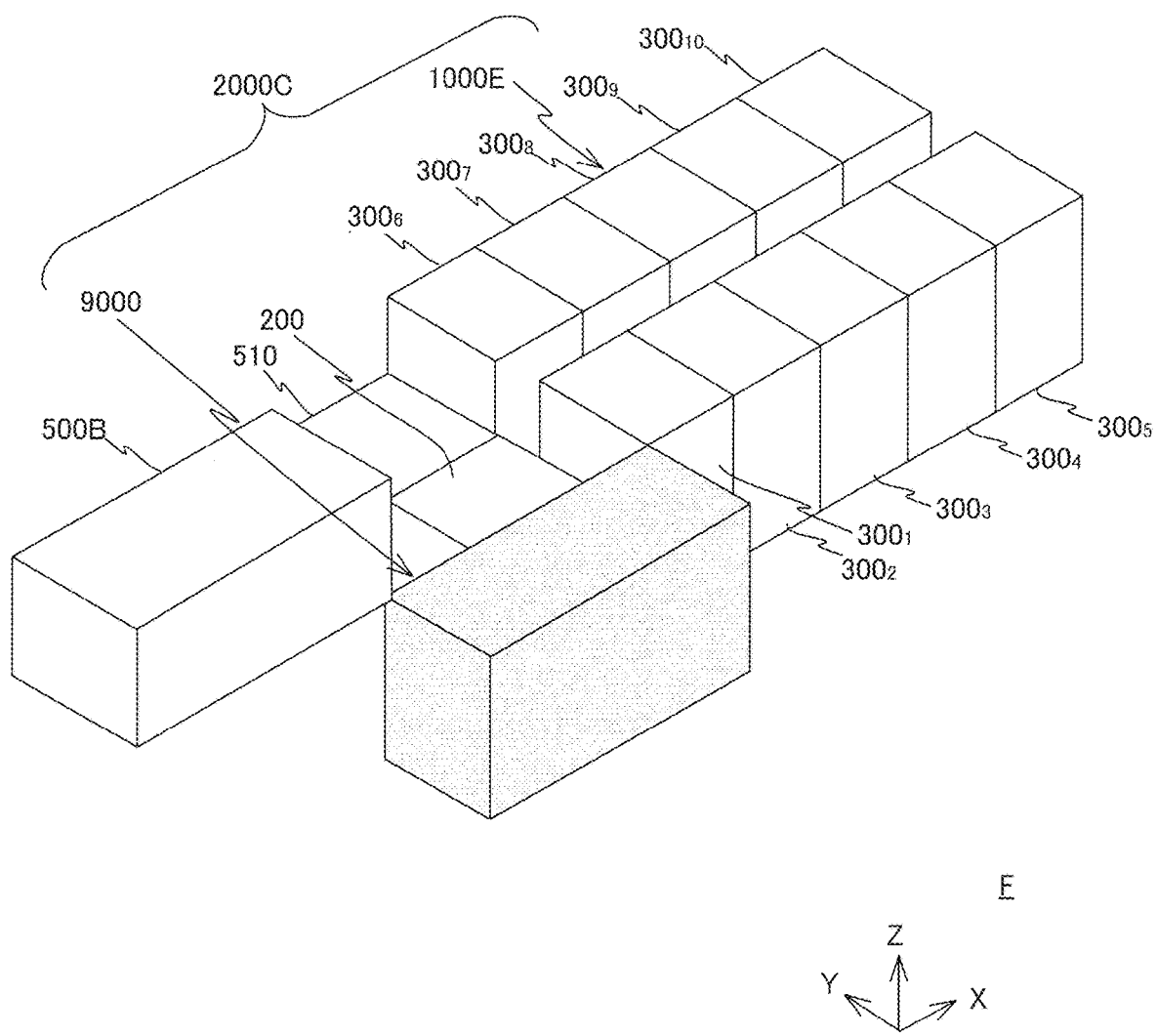
FIG. 20 is a perspective view showing an exposure system related to a modified example No. 3 of the second embodiment, together with the resist coating/development device.

FIG. 20 shows, in a perspective view, an exposure system 1000E related to a modified example No. 3 of the second embodiment, together with C/D 9000. Exposure system 1000E is like exposure system 1000B related to the second embodiment described earlier but different in that, instead of being disposed above control rack 510 and measurement chamber 200, control rack 500B is installed with the X-axis direction serving as its longitudinal direction, on floor surface F adjacently on the −X side of control rack 510 and measurement chamber 200. In the present modified example, C/D 9000 described earlier is used, and C/D 9000 is disposed on the Y side of measurement chamber 200 and connected in-line to measurement chamber 200. In exposure system 1000E related to the present modified example, wiring and piping from a utility supply source of a clean room sub-fab are connected to control rack 500B via floor surface F. Control rack 500B supplies the utility to control rack 510 and incorporates a board for controlling the components other than the electron beam irradiation devices such as, for example, a stage system, and the like. Further, control rack 510 distributes the utility to measurement chamber 200 and chambers $300_i$ (i=1 to 10) and incorporates a board relating to the control of the electron beam irradiation device of each chamber $300_i$, and the like.

Exposure system 1000E related to the present modified example configures a lithography system 2000C, together with C/D 9000. Although the illustration is omitted, two lithography systems 2000C are disposed in a state of being rotated by an angle of 180 degrees with respect to each other so that the respective one end surfaces in the longitudinal direction of two C/Ds 9000 face each other in a substantially contact state, and thereby the lithography systems can be disposed in a space with a substantially rectangular parallelepiped shape (a rectangular shape in planar view) as a whole, though a free space is generated at some places.

Modified Example No. 4 of Second Embodiment

Figure 21:
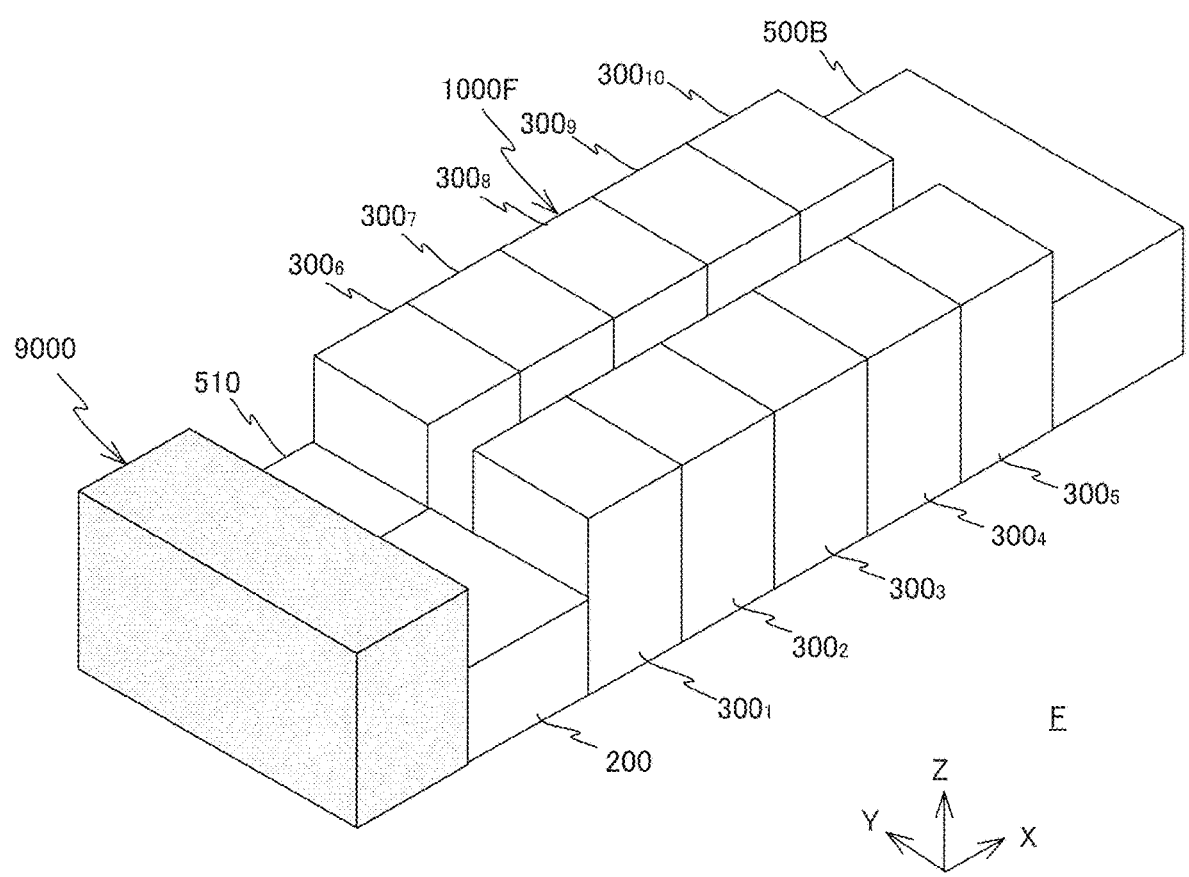
FIG. 21 is a perspective view showing an exposure system related to a modified example No. 4 of the second embodiment, together with the resist coating/development device.

FIG. 21 shows, in a perspective view, an exposure system 1000F related to a modified example No. 4 of the second embodiment, together with C/D 9000. Exposure system. 1000F is like exposure system 1000B related to the second embodiment described earlier but different in that, instead of being disposed above measurement chamber 200 and control rack 510, control rack 500B is installed on floor surface F adjacently on the +X side of chamber $300_5$ and chamber $300_{10}$. In the present modified example, C/D 9000 is installed on floor surface F, adjacently on the −X side of control rack 510 and measurement chamber 200, and connected in-line to measurement chamber 200. In exposure system 1000F related to the present modified example, wiring and piping from a utility supply source of a clean room sub-fab are connected to control rack 500B via floor surface F. Control rack 500B incorporates a board for controlling the components other than the electron beam irradiation devices such as, for example, a stage system, and the like. Further, control rack 510 distributes the utility to measurement chamber 200 and chambers $300_i$ (i=1 to 10) and incorporates a board relating to the control of the electron beam irradiation device of each chamber $300_i$, and the like.

Exposure system 1000F related to the present modified example can be disposed together with C/D 9000 in a space with a substantially rectangular parallelepiped shape (a rectangular shape in planar view).

Third Embodiment

Figure 22:
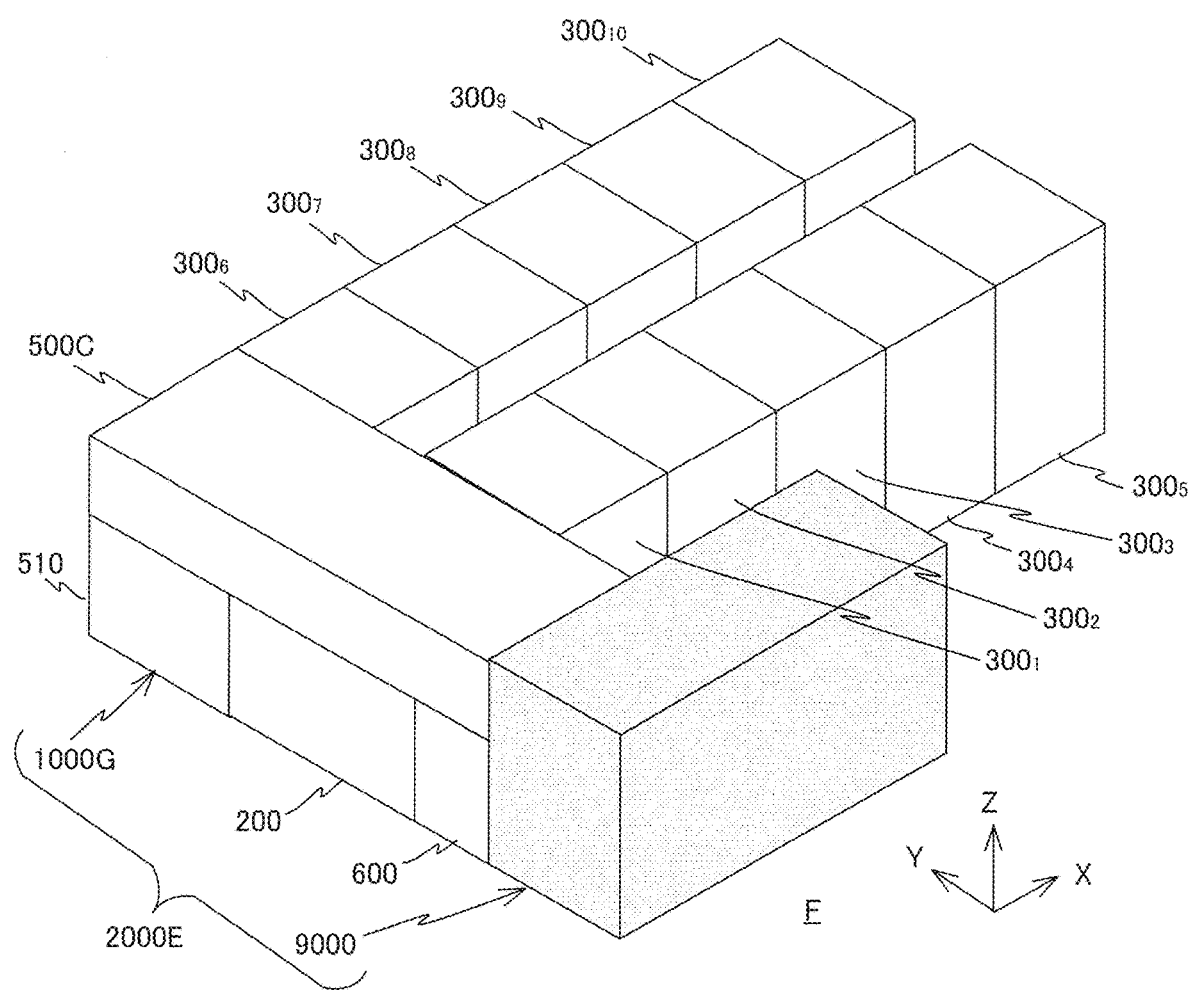
FIG. 22 is a perspective view showing an exposure system related to a third embodiment, together with the resist coating/development device.

FIG. 22 shows, in a perspective view, an exposure system 1000G related to a third embodiment, together with C/D 9000.

In exposure system 1000G, control rack 510 described earlier is disposed on the +Y side of measurement chamber 200 installed on floor surface F. Further, an interface chamber 600 inside which a carrying route for wafers is provided is disposed between measurement chamber 200 and C/D 9000. A control rack 500C is placed above control rack 510, measurement chamber 200 and interface chamber 600, via a frame member (not illustrated). While control rack 500C is configured similarly to control rack 500 described earlier, and has functions equal to or more than those of control rack 500, the length of control rack 500C is longer than that of control rack 500. Note that control rack 500C may be disposed above control rack 510, measurement chamber 200 and interface chamber 600 not via the frame member.

Wiring and piping from a utility supply source of a clean room sub-fab are connected to control rack 510 via floor surface F, and control rack 510 supplies the utility to control rack 500C. Control rack 500C distributes the utility supplied from control rack 510 to measurement chamber 200 and the ten chambers $300_1$ to $300_{10}$. That is, control rack 500C functions as an interface between control rack 510, and measurement chamber 200 and the ten chambers $300_1$ to $300_{10}$. Note that a configuration of supplying the utility from control rack 510 to measurement chamber 200 may also be employed. In this case, the two control racks may be allotted separate roles, for example, by making control rack 510 serve as a control rack having a function relating to the irradiation control of electron beams irradiated from electron beam irradiation device 330 onto a wafer serving as target, and making control rack 500C serve as a control rack having the other functions.

C/D 9000 is connected in-line to measurement chamber 200 via interface chamber 600. In exposure system 1000G, the configuration and the like of the other components are similar to those of exposure system 1000 related to the first embodiment described earlier. In exposure system 1000G, maintenance and the like can be performed from both sides in the Y-axis direction with respect to any one of chambers $300_1$ to $300_{10}$.

Figure 23:
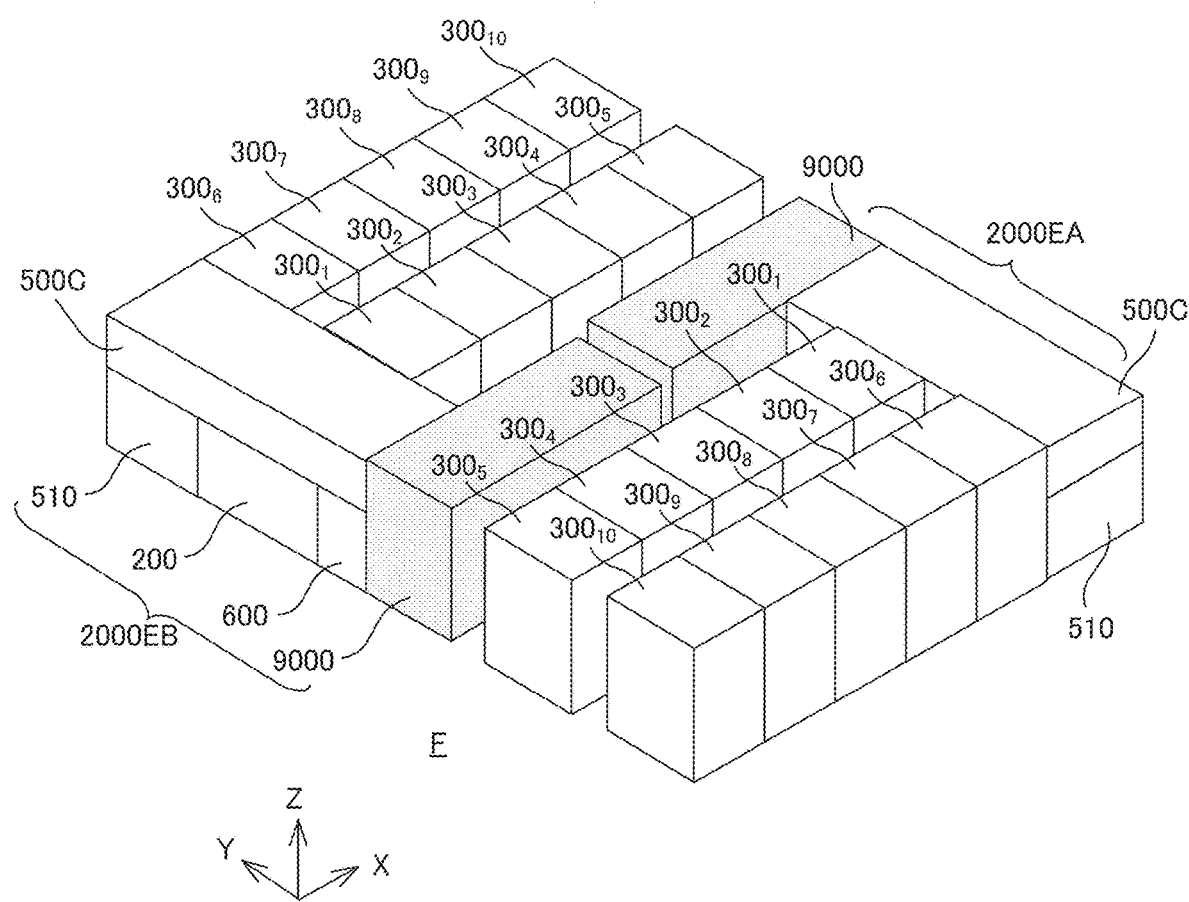
FIG. 23 is a perspective view showing a state where two lithography systems 2000E are rotated by an angle of 180 degrees with respect to each other so that the respective one ends in a longitudinal direction of the resist coating/development devices are disposed to face each other.

Exposure system 1000G configures a lithography system 2000E, together with C/D 9000. As can be seen from FIG. 22, in lithography system 2000E, a free space is generated on the +X side of C/D 9000. However, as shown in a perspective view in FIG. 23, such a configuration can be employed that two lithography systems 2000E are disposed in a state of being rotated by an angle of 180 degrees with respect to each other so that the respective one ends of C/Ds 9000 in the longitudinal direction face each other. That is, in a first lithography system 2000EA, interface chamber 600 described earlier (hidden under control rack 500C in FIG. 23), measurement chamber 200 (hidden under control rack 500C in FIG. 23) and control rack 510, that face the +X side half of C/D 9000, are disposed on the −Y side of C/D 9000 to be placed side by side in the order from the C/D 9000 side. Control rack 500C is placed above measurement chamber 200 and interface chamber 600 via a frame member (not illustrated), and each chamber $300_i$ is disposed on the −X side of measurement chamber 200. In a second lithography system 2000EB, the interface chamber 600 described earlier, measurement chamber 200 and control rack 510, that face the −X side half of C/D 9000, are disposed on the +Y side of C/D 9000 to be placed side by side in the order from the side closest to C/D 9000. Control rack 500C is placed above measurement chamber 200 and interface chamber 600 via a frame member (not illustrated), and each chamber $300_i$ is disposed on the +X side of measurement chamber 200.

In lithography system 2000EA, wiring and piping from a utility supply source of a clean room sub-fab are connected to control rack 510A via floor surface F, and control rack 510A supplies the utility to control rack 500CA. In lithography system 2000EB, wiring and piping from a utility supply source of a clean room sub-fab are connected to control rack 510B via floor surface F, and control rack 510B supplies the utility to control rack 500CB.

By employing the configurations as described above, the lithography systems can be disposed in a space with a substantially parallelepiped shape as a whole, and thus, it is possible to avoid a space of poor usability from being generated in the clean room and to attain improvement in the space utilization efficiency in the clean room.

Modified Example of Third Embodiment

Figure 24:
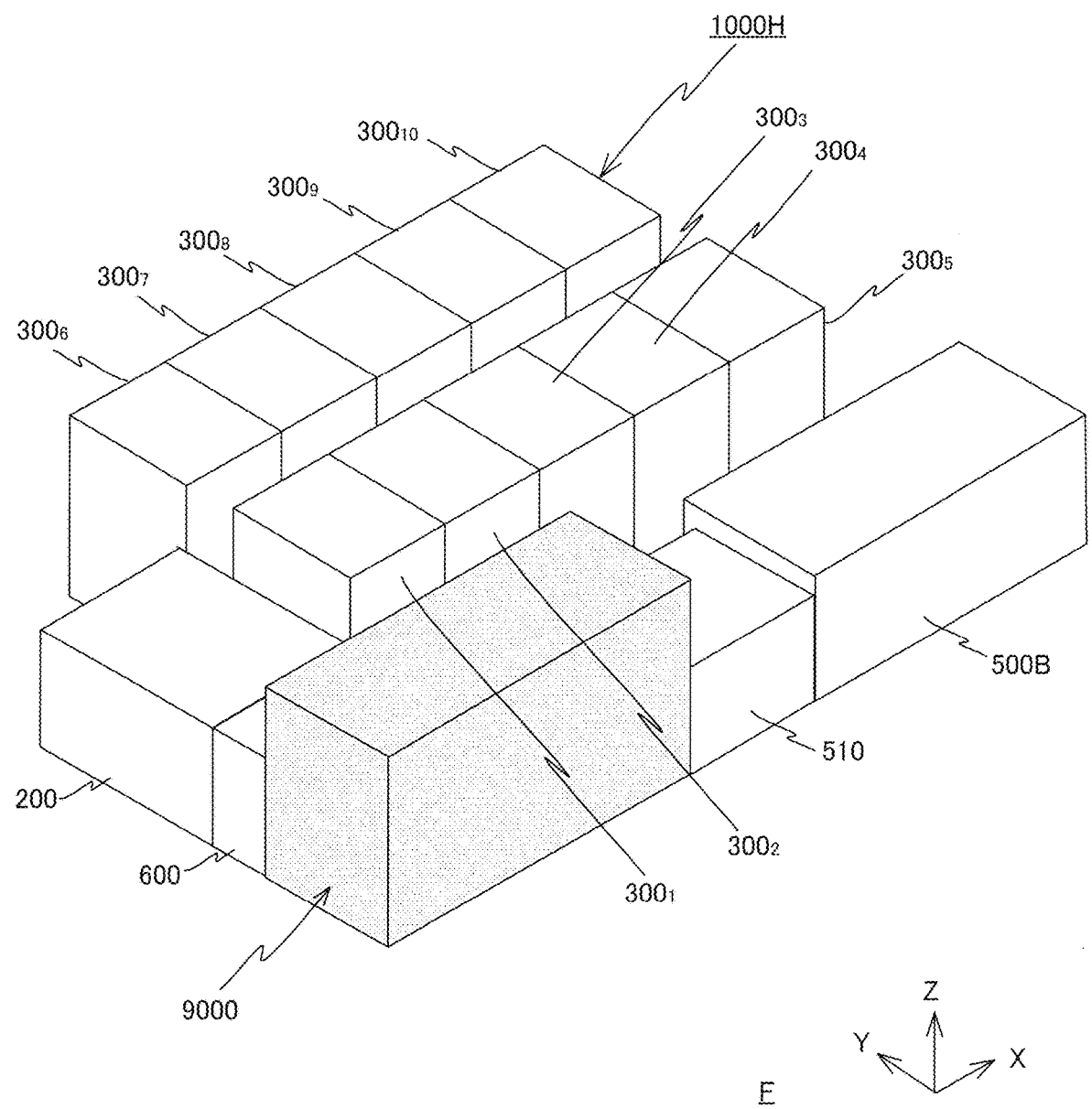
FIG. 24 is a perspective view showing an exposure system related to a modified example of the third embodiment, together with the resist coating/development device.

FIG. 24 shows, in a perspective view, an exposure system 1000H related to a modified example of the third embodiment, together with C/D 9000. Exposure system 1000H is like exposure system 1000G related to the third embodiment described earlier, but different in that control rack 500B is provided instead of control rack 500C, and control rack 500B is installed on floor surface F on the +X side of C/D 9000 to be placed side by side with control rack 510 in the X-axis direction. In exposure system 1000H related to the present modified example, wiring and piping from a utility supply source of a clean room sub-fab are connected to control rack 500B via floor surface F. Control rack 500B supplies the utility to control rack 510 and incorporates a board for controlling the components other than the electron beam irradiation devices such as, for example, a stage system, and the like. Further, control rack 510 distributes the utility to measurement chamber 200 and chambers $300_i$ (i=1 to 10) and incorporates a board relating to the control of electron beam irradiation device 330 of each chamber $300_i$, and the like.

A space for maintenance is secured between a chamber row consisting of chambers $300_1$ to $300_5$, and control rack 510 and control rack 500B. Further, exposure system 1000H can be disposed in a space with a substantially parallelepiped shape (a rectangular shape in planar view) as a whole, though a free space is generated on the +Y side of measurement chamber 200.

Other Layouts

The various layouts of the exposure system in which chambers $300_1$ to $300_{10}$ are disposed in two rows in order to decrease the overall length of a lithography system made up of the exposure system and a C/D have been described so far. However, the case where an installation space elongated in planar view is provided in a clean room can also be considered, and in such a case, a layout of an exposure system in which chambers $300_1$ to $300_{10}$ are disposed side by side in one row will be possible. Examples of exposure systems having such one chamber row (hereinafter, referred to as exposure systems of single chamber row types, for the sake of convenience) will be described below.

Single Chamber Row Type (No. 1)

Figure 25:
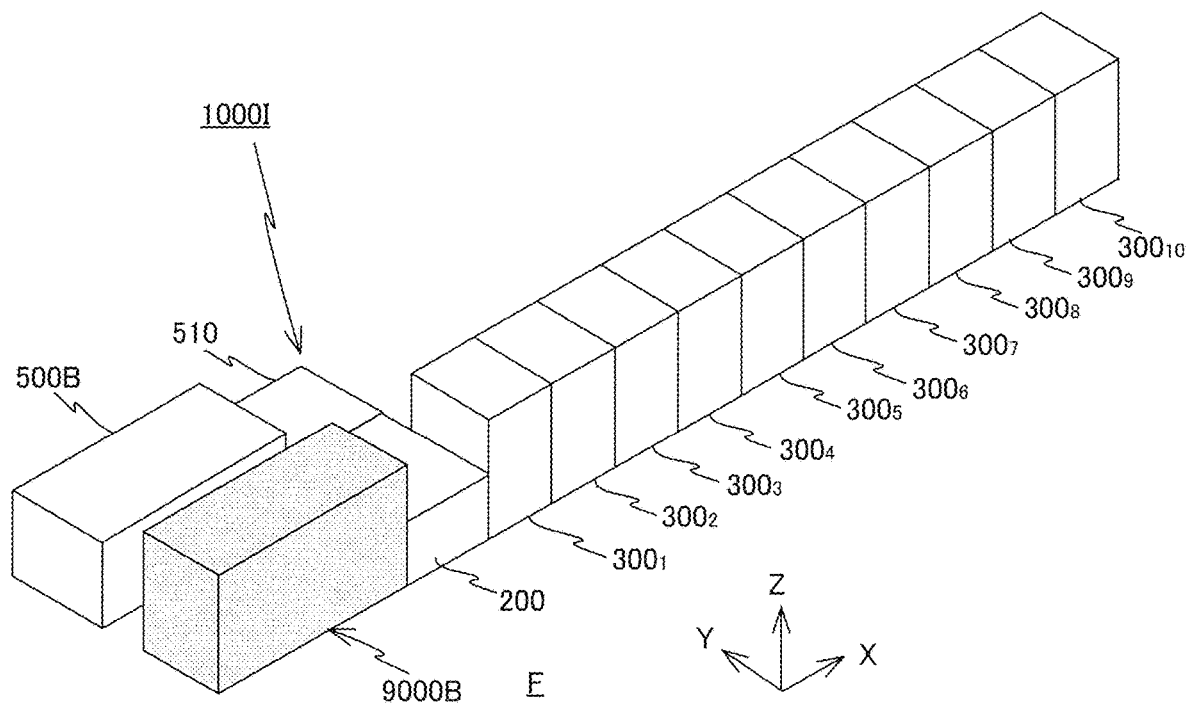
FIG. 25 is a perspective view showing an exposure system related to a single chamber row type (No. 1), together with the resist coating/development device.

FIG. 25 shows, in a perspective view, an exposure system 1000I related to a single chamber row type (No. 1), together with C/D 9000B. Exposure system 1000I is like exposure system 1000B related to the second embodiment described earlier but different in that, instead of being disposed above measurement chamber 200 and control rack 510, control rack 500B is disposed side by side with a predetermined spacing in between on the +Y side of the C/D (also in this case, C/D 9000B is used), and chambers $300_1$ to $300_{10}$ are disposed side by side in one row along the X-axis direction on the +X side of measurement chamber 200.

In exposure system 1000I, wiring and piping from a utility supply source of a clean room sub-fab are connected to control rack 510 via floor surface F. Control rack 510 supplies the utility to control rack 500B. Control rack 500B distributes the utility supplied from control rack 510 to measurement chamber 200 and the ten chambers $300_1$ to $300_{10}$. That is, control rack 500B functions as an interface between control rack 510, and measurement chamber 200 and the ten chambers $300_1$ to $300_{10}$. Control rack 500B incorporates aboard for controlling the components other than electron beam irradiation devices 330 such as, for example, a stage system, and the like. Further, control rack 510 incorporates a board relating to the control of electron beam irradiation device 330 of each chamber $300_j$, and the like. Note that a configuration of supplying the utility from control rack 510 to measurement chamber 200 may also be employed.

Exposure system 1000I allows maintenance to be performed from both sides with respect to any one of chambers $300_1$ to $300_{10}$, and also facilitates maintenance of the shuttle carrier system.

Further, exposure system 1000I configures a lithography system, together with C/D 9000B. By disposing the lithography systems in a state of being rotated by an angle of 180 degrees with respect to each other so that the respective control racks 510 face each other with a predetermined distance in between, the lithography systems can be disposed in a space with a substantially rectangular parallelepiped shape (a rectangular shape in planar view) as a whole.

Single Chamber Row Type (No. 2)

Figure 26:
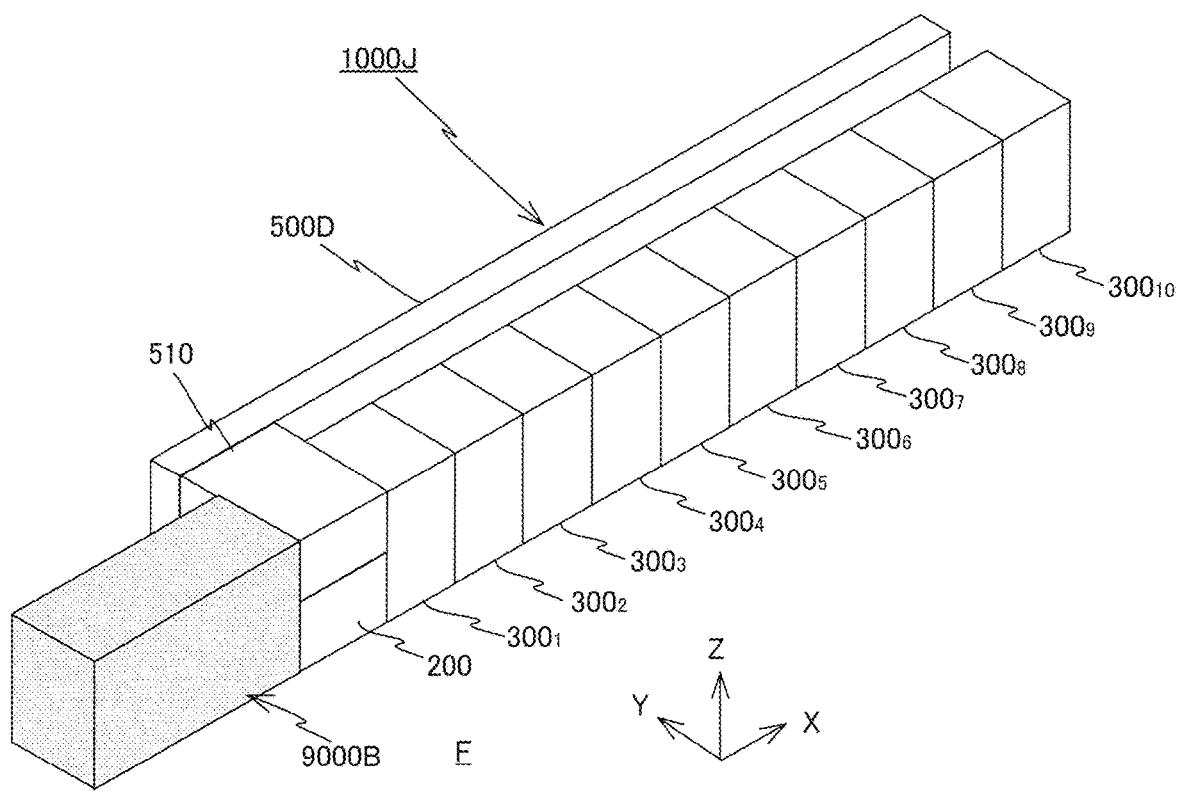
FIG. 26 is a perspective view showing an exposure system related to a single chamber row type (No. 2), together with the resist coating/development device.

FIG. 26 shows, in a perspective view, an exposure system 1000J related to a single chamber row type (No. 2), together with C/D 9000B. Exposure system 1000J is like exposure system 1000I described earlier, but different in that control rack 510 is disposed on measurement chamber 200 via a frame member (not illustrated) and a control rack 500D whose length is about the same as the length of a chamber row consisting of measurement chamber 200 and the ten chambers $300_1$ to $300_{10}$ is provided instead of control rack 500B, and control rack 500D is disposed on the +Y side of measurement chamber 200 and the ten chambers $300_1$ to $300_{10}$. In this case, control rack 500D faces the ten chambers $300_1$ to $300_{10}$ with a predetermined distance (a distance corresponding to a difference in length in the Y-axis direction between control rack 510 and each of chambers $300_1$ to $300_{10}$) in between. Note that control rack 510 may be disposed on measurement chamber 200 not via the frame member.

In exposure system 1000J, wiring and piping from a utility supply source of a clean room sub-fab are connected to control rack 510 from below via floor surface F and measurement chamber 200. Control rack 510 supplies the utility to measurement chamber 200 and control rack 500D. Control rack 500D distributes the utility supplied from control rack 510 to the ten chambers $300_1$ to $300_{10}$. That is, control rack 500D functions as an interface between control rack 510 and the ten chambers $300_1$ to $300_{10}$. Control rack 500D incorporates a board for controlling the components other than the electron beam irradiation devices such as, for example, a stage system, and the like. Further, control rack 510 incorporates a board relating to the control of electron beam irradiation device 330 of each chamber $300_j$, and the like. Note that a configuration of supplying the utility from control rack 510 to measurement chamber 200 may also be employed.

In this case, since the spacing between control rack 500D and chambers $300_1$ to $300_{10}$ is narrow, wiring and piping for distributing the utility from control rack 500D to the ten chambers $300_1$ to $300_{10}$ can be shortened.

Single Chamber Row Type (No. 3)

Figure 27:
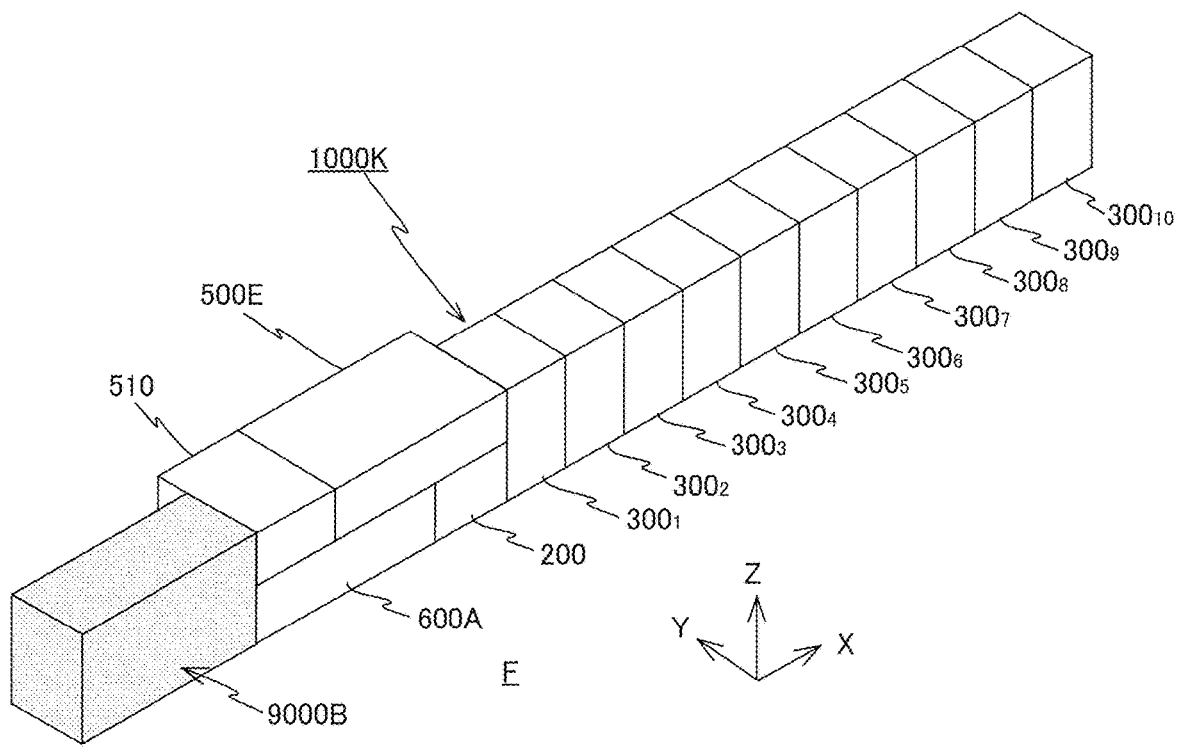
FIG. 27 is a perspective view showing an exposure system related to a single chamber row type (No. 3), together with the resist coating/development device.

FIG. 27 shows, in a perspective view, an exposure system 1000K related to a single chamber row type (No. 3), together with C/D 9000B. In exposure system 1000K, C/D 9000B and measurement chamber 200 are installed on floor surface F with a predetermined spacing in between in the X axis direction, and C/D 9000B and measurement chamber 200 are connected in-line via an interface chamber 600A with the X axis direction serving as its longitudinal direction. Control rack 510 and a control rack 500E are disposed side by side in the X-axis direction above interface chamber 600A and measurement chamber 200, via a frame member (not illustrated). Chambers $300_1$ to $300_{10}$ are disposed in line in the X-axis direction, on the +X side of measurement chamber 200. Note that control rack 510 and control rack 500E may be disposed above interface chamber 600A and measurement chamber 200 not via the frame member.

In exposure system 1000K, wiring and piping from a utility supply source of a clean room sub-fab are connected to control rack 510 from below via floor surface F and interface chamber 600A. Control rack 510 supplies the utility to control rack 500E. Control rack 500E distributes the utility supplied from control rack 510 to measurement chamber 200 and the ten chambers $300_1$ to $300_{10}$. Control rack 500E incorporates a board for controlling the components other than the electron beam irradiation devices such as, for example, a stage system, and the like. Further, control rack 510 incorporates a board relating to the control of electron beam irradiation device 330 of each chamber $300_1$, and the like.

Exposure system 1000K allows maintenance to be performed from both sides with respect to any one of chambers $300_1$ to $300_{10}$, and also facilitates maintenance of the shuttle carrier system.

Figure 28:
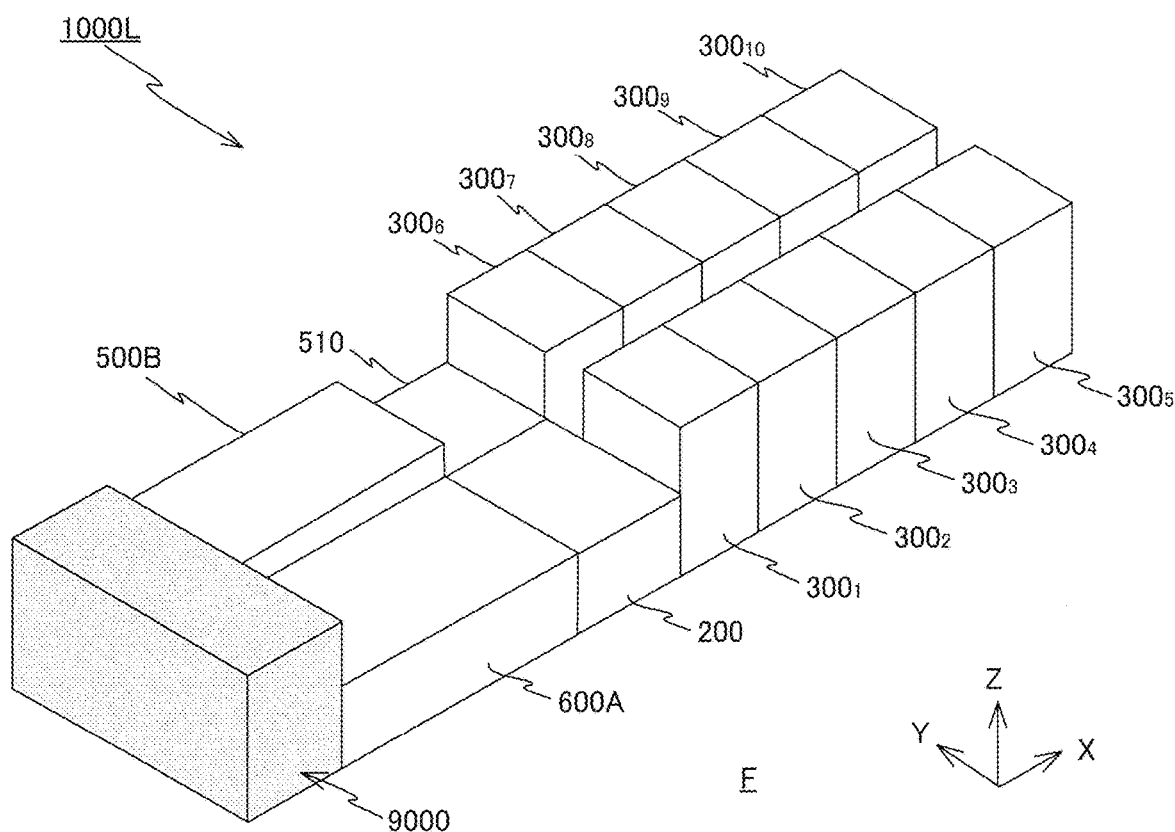
FIG. 28 is a perspective view showing an example of an exposure system that can be disposed together with the resist coating/development device in a space with a rectangular shape in planar view within a clean room.

Besides, as an exposure system that can be disposed together with a C/D in a space with a rectangular shape in planar view in a clear room, an exposure system 1000L in a layout as illustrated in a perspective view in FIG. 28 can be given. Exposure system 1000L has interface chamber 600A described above in its part. In exposure system 1000L, interface chamber 600A and control rack 500B with the X-axis direction serving as their longitudinal directions are disposed side by side in the Y-axis direction, on the +X side of C/D 9000 installed on floor surface F with the Y axis direction serving as its longitudinal direction. Measurement chamber 200 and control rack 510 are disposed on the +X side of interface chamber 600A and control rack 500B, respectively. Further, the two rows of chambers $300_1$ to $300_5$ and $300_6$ to $300_{10}$ are disposed on the +X side of measurement chamber 200 and control rack 510. C/D 9000 and measurement chamber 200 are connected in-line via interface chamber 600A.

In exposure system 1000L, wiring and piping from a utility supply source of a clean room sub-fab are connected to control rack 510 from below via floor surface F. Control rack 510 supplies the utility to control rack 500B. Control rack 500B distributes the supplied utility to measurement chamber 200 and the ten chambers $300_1$ to $300_{10}$. Control rack 500B incorporates a board for controlling the components other than the electron beam irradiation devices such as, for example, a stage system, and the like. Further, control rack 510 incorporates a board relating to the control of electron beam irradiation device 330 of each chamber $300_i$, and the like.

Figure 29:
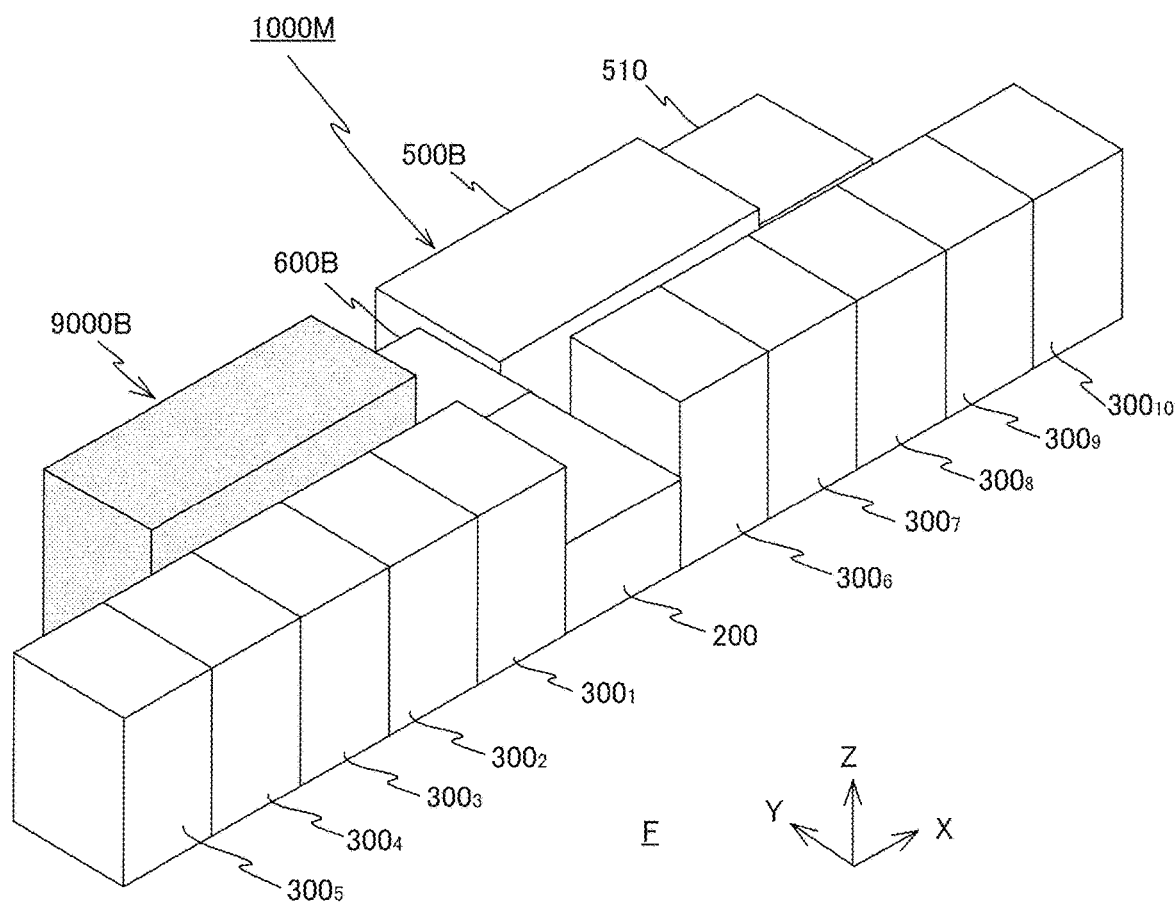
FIG. 29 is a perspective view showing an example of an exposure system that employs another layout, together with the resist coating/development device.

As an exposure system employing another layout, an exposure system 1000M in a layout as illustrated in a perspective view in FIG. 29 can be given. Exposure system 1000M has, in its part, an interface chamber 600B that is different from interface chambers 600 and 600A described above. In exposure system 1000M, measurement chamber 200 is disposed on floor surface F with the Y-axis direction serving as its longitudinal direction, and chambers $300_1$ to $300_5$ and chambers $300_6$ to $300_{10}$ are disposed in line in the X-axis direction, respectively, on one side and the other side in the X-axis direction with measurement chamber 200 in between. C/D 9000B is disposed on the +Y side of chambers $300_1$ to $300_3$ with a predetermined spacing in between. Interface chamber 600B is disposed adjacently on the +Y side of measurement chamber 200, and C/D 9000B and measurement chamber 200 are connected in-line by interface chamber 600B.

Further, control rack 500B is disposed adjacently on the +X side of interface chamber 600B, and control rack 510 is disposed adjacently on the +X side of control rack 500B.

In exposure system 1000M, wiring and piping from a utility supply source of a clean room sub-fab are connected to control rack 510 from below via floor surface F. Control rack 510 supplies the utility to control rack 500B. Control rack 500B distributes the supplied utility to measurement chamber 200 and the ten chambers $300_1$ to $300_{10}$. Control rack 500B incorporates a board for controlling the components other than the electron beam irradiation devices such as, for example, a stage system, and the like. Further, control rack 510 incorporates a board relating to the control of electron beam irradiation device 330 of each chamber $300_i$, and the like.

In exposure system 1000M, a carrying route of shuttle 10 (a wafer) is set in a space on the +Y-side of chambers $300_1$ to $300_5$ (the C/D 9000B side) and in a space on the +Y-side of chambers $300_6$ to $300_{10}$ (the control rack 500B side).

In exposure system 1000M, the overall lengths of wiring and piping for distributing the utility to chambers $300_1$ to $300_{10}$ are shorter than those in the case where control rack 500B is disposed on one end side of a chamber row consisting of chambers $300_1$ to $300_{10}$ lying in line.

Note that, as a method of turning each of the beams ON/OFF for the multibeam optical system in exposure system 1000 related to the first embodiment described above, such a method may also be employed that a plurality of electron beams are generated via a blanking aperture array having a plurality of openings and the electron beams are individually turned ON/OFF in accordance with a pattern to be drawn and thereby the pattern is drawn on a specimen surface. Further, such a configuration may also be employed that a surface emission type electron beam source having a plurality of electron emitting sections to emit a plurality of electron beams is used instead of the blanking aperture array.

Further, as the electron beam irradiation device, a multi-beam type irradiation device that irradiates multiple beams or a single beam type irradiation device that irradiates a single electron beam, or the like may be used. Note that, as the single beam type irradiation device, there are types such as: a point beam type that makes a beam to be irradiated into a spot shape to use; a variable-shaped beam type that makes a beam to be irradiated have a rectangular cross-sectional shape whose size is variable to use; a stencil mask type that creates beforehand a stencil mask having a beam passing hole with a desired shape and shapes a beam into the desired shape by the stencil mask to use; and the like.

Further, as the electron beam irradiation device, a multi-column type in which many optical system columns are disposed or a single column type in which one optical system column is disposed may also be used.

Note that the exposure unit in each of the embodiments described above is not limited to the scanning stepper method, but a static type method such as a stepper may also be used, and a reduction projection exposure system of a step-and-stich method that synthesizes a shot area and a shot area may also be employed.

Further, as the exposure unit in each of the embodiments described above, a device of a batch transfer method that transfers, in a batch, a pattern corresponding to one semiconductor chip or a plurality of semiconductor chips from a mask onto a photosensitive substrate, or a device of a divided transfer method capable of performing exposure with higher throughput than the batch transfer method may be used. The divided transfer method is a method of dividing a pattern to be transferred onto a photosensitive substrate into a plurality of small areas that are each smaller than a size corresponding to one shot on a mask and transferring them onto the photosensitive substrate. As the device of the divided transfer method, there is also an electron beam reduction transfer exposure apparatus in which a mask provided with circuit patterns for the entirety of one semiconductor chip is prepared, a certain range of the mask is irradiated with an electron beam, and an image of a pattern of the irradiated range is reduced and transferred by a projection lens.

Note that, in the measurement room formed in the measurement chamber in each of the embodiments described above, measurement with respect to a target that has been coated with sensitive agent in a substrate proceeding device is performed, but measurement with respect to a target before being coated with sensitive agent in the substrate proceeding device may be performed.

Note that, in exposure system 1000 related to the first embodiment described above, the case has been described where the target is a wafer for semiconductor device manufacturing, but exposure system 1000 as a matter of course and the exposure system related to each of the embodiments and the modified examples described above can suitably be used also when masks are manufactured by forming fine patterns on glass substrates. For example, the exposure system may also be employed as an exposure system that draws a mask pattern on a rectangular glass plate or a silicon wafer, or an exposure system for manufacturing organic ELs, thin-film magnetic heads, imaging devices (such as CCD), micromachines, DNA chips or the like. Although exposure system 1000 that uses electron beams as exposure beams has been described in the first embodiment described above, each of the embodiments and the modified examples described above can also be applied to exposure systems such as an exposure system using ion beams or the like. Further, the exposure system is not limited to an exposure system that performs exposure using charged particle beams, but may also be an exposure system that uses an EUV exposure apparatus to illuminate a mask using EUV light as exposure beams and project such EUV light from a mask pattern on a substrate using a projection optical system.

INDUSTRIAL APPLICABILITY

As is described above, the exposure system and the lithography system related to the present invention are suitable to be used in the lithography process in the manufacturing of electron devices such as semiconductor devices.

REFERENCE SIGNS LIST

60 . . . measurement room,
200 . . . measurement chamber,
$300_i$, $300_2$, $300_3$, $300_4$, $300_5$ . . . chambers,
$300_6$, $300_7$, $300_8$, $300_9$, $300_{10}$ . . . chambers,
$301_i$ . . . exposure room,
302 . . . load lock chamber,
310 . . . exposure unit,
322 . . . coarse-fine movement stage,
330 . . . electron beam irradiation device,
350a, 350b, 350c . . . suspension support mechanisms,
351 . . . vibration isolation pad,
352 . . . wire,
353 . . . positioning device,
400 . . . frame,
500 . . . control rack,
1000 . . . exposure system,
9000 . . . C/D,
F . . . floor surface,
SP . . . space, and
W, $W_0$, $W_1$ . . . wafers.

The invention claimed is:

1. An exposure system comprising:
a first chamber in which a measurement room is formed, in the measurement room measurement being performed with respect to a target or a target coated with sensitive agent in a substrate processing device, and the target being mounted on a shuttle during the measurement;
a plurality of second chambers in each of which an exposure room is formed, in each of the exposure rooms the target, which is mounted on the shuttle that has been carried from the first chamber, being exposed with an exposure beam; and
at least one control rack that (i) supplies utility supplied from an external utility supply source to the first chamber and the plurality of second chambers, (ii) includes a unit for controlling the measurement in the first chamber, and (iii) includes a control system directly related to controlling the exposure in the plurality of second chambers,
wherein at least the control system of the at least one control rack is located either (i) adjacent to the first chamber in a virtual plane that intersects the plurality of second chambers or (ii) above the first chamber.

2. The exposure system according to claim 1, wherein the first chamber is disposed adjacently to the substrate processing device, and each of the plurality of second chambers is disposed adjacently to the first chamber.

3. The exposure system according to claim 1, wherein the first chamber is disposed adjacently on one side of the plurality of second chambers, and
the control rack is disposed adjacently on the other side of the plurality of second chambers.

4. The exposure system according to claim 1, wherein the control system of the at least one control rack is disposed above the first chamber.

5. The exposure system according to claim 4, further comprising:
a frame member that supports the control rack above the first chamber such that (i) weight of the control rack does not act on the first chamber and (ii) the control rack and the first chamber are vibrationally separated.

6. The exposure system according to claim 1, further comprising:
a carrier system provided between the substrate processing device and the first chamber, that carries the target, wherein
the control rack is disposed adjacently to the carrier system.

7. The exposure system according to claim 1, wherein the plurality of second chambers are each arrayed along a predetermined direction.

8. The exposure system according to claim 1, wherein the plurality of second chambers are disposed on both of one side and the other side of the first chamber in a first direction.

9. The exposure system according to claim 1, wherein the first chamber is disposed on one side of the substrate processing device in a first direction, and
the plurality of second chambers are disposed on one side of the first chamber in a second direction intersecting the first direction.

10. The exposure system according to claim 1, wherein the substrate processing device and the first chamber are connected in-line, and
a space in the substrate processing device, a space in the control rack and a space in each of the plurality of second chambers are independent from each other.

11. The exposure system according to claim 1, wherein a space in each of the plurality of second chambers is vacuum atmospheric.

12. The exposure system according to claim 1, wherein each of the plurality of second chambers has a load lock room.

13. The exposure system according to claim 1, wherein at least one of at least partial sections of an exposure unit is accommodated in each of the plurality of second chambers, the exposure unit exposing the target coated with the sensitive agent with the exposure beam.

14. The exposure system according to claim 13, wherein the exposure unit has a stage device and an irradiation device, the stage device including a stage that holds the target and is movable, and the irradiation device irradiating the target with the exposure beam, and
the stage and at least an emitting end of the irradiation device are accommodated inside each of the plurality of second chambers.

15. The exposure system according to claim 14, wherein the exposure unit as a whole is accommodated inside each of the plurality of second chambers.

16. The exposure system according to claim 14, wherein the stage device includes an encoder system that has a grating section and a head section and measures position information of the stage, the grating section being provided at one of the stage and a predetermined position external to the stage, a two-dimensional grating being formed at the grating section, the head section being provided at the other of the stage and the predetermined position to be faceable by the grating section, and the head section irradiating the grating section with a plurality of beams and receiving returned beams from the grating section.

17. The exposure system according to claim 16, wherein the exposure unit further has a metrology frame that is provided with a component of the encoder system, the component being one of the grating section and the head section that is provided at the predetermined position, and the metrology frame is supported integrally with the irradiation device, in a suspended manner from a ceiling section of each of the plurality of second chambers via a plurality of suspension support mechanisms having a flexible structure.

18. The exposure system according to claim 17, wherein the irradiation device is supported in a suspended manner at three points via three of the suspension support mechanisms, by the ceiling section via the metrology frame.

19. The exposure system according to claim 17, wherein the suspension support mechanism includes a vibration isolation pad and a wire, the vibration isolation pad being fixed to the ceiling section, and the wire having one end connected to the vibration isolation pad and an other end connected to a support member of the irradiation device.

20. The exposure system according to claim 19, further comprising:

a positioning device of a noncontact method to maintain a relative position between the irradiation device and each of the plurality of second chambers in a predetermined state.

21. The exposure system according to claim 14, wherein the irradiation device comprises a multibeam optical system that has a blanking aperture array having a plurality of openings, the multibeam optical system being capable of individually setting, for the plurality of beams that have respectively passed through the plurality of openings, irradiation states of the plurality of beams being irradiated on the target.

22. The exposure system according to claim 1, wherein the utility supply source is disposed below a floor surface on which the substrate processing device, the first chamber, the plurality of second chambers, and the at least one control rack are disposed, and a first supply member that is connected to the utility supply source via the floor surface is connected to the at least one control rack.

23. A lithography system comprising:
a first exposure system that comprises
    a first chamber in which a measurement room is formed, in the measurement room measurement being performed with respect to a target or a target coated with sensitive agent in a first substrate processing device, and the target being mounted on a shuttle during the measurement in the first chamber,
    a second chamber in which an exposure room is formed, in the exposure room the target, which is mounted on the shuttle that has been carried from the first chamber, being exposed with an exposure beam, and
    at least one first control rack that (i) supplies utility supplied from an external utility supply source to the first chamber and the second chamber, (ii) includes a unit for controlling the measurement in the first chamber, and (iii) includes a control system directly related to controlling the exposure in the second chamber; and
a second exposure system that comprises
    a third chamber in which a measurement room is formed, in the measurement room measurement being performed with respect to a target or a target coated with sensitive agent in a second substrate processing device, and the target being mounted on a shuttle during the measurement in the third chamber,
    a fourth chamber in which an exposure room is formed, in the exposure room the target, which is mounted on the shuttle that has been carried from the third chamber, being exposed with an exposure beam, and
    at least one second control rack that (i) supplies utility supplied from an external utility supply source to the third chamber and the fourth chamber, (ii) includes a unit for controlling the measurement in the third chamber, and (iii) includes a control system directly related to controlling the exposure in the fourth chamber, wherein
at least the control system of the at least one first control rack is located either (i) adjacent to the first chamber in a virtual plane that intersects the second chamber and the fourth chamber or (ii) above the first chamber,
at least the control system of the at least one second control rack is located either (i) adjacent to the third chamber in the virtual plane that intersects the second chamber and the fourth chamber or (ii) above the third chamber,
the first chamber is disposed on one side of the first substrate processing device in a second direction that intersects a first direction, in the first direction the first substrate processing device and the second substrate processing device lying side by side,
the second chamber is disposed on the other side of the first chamber in the first direction,
the third chamber is disposed on the other side of the second substrate processing device in the second direction, and
the fourth chamber is disposed on one side of the third chamber in the first direction.

24. A lithography system comprising:
a first exposure system that comprises
    a first chamber in which a measurement room is formed, in the measurement room measurement being performed with respect to a target or a target coated with sensitive agent in a first substrate processing device, and the target being mounted on a shuttle during the measurement in the first chamber,
    a second chamber in which an exposure room is formed, in the exposure room the target, which is mounted on the shuttle that has been carried from the first chamber, being exposed with an exposure beam, and
    at least one first control rack that (i) supplies utility supplied from an external utility supply source to the first chamber and the second chamber, (ii) includes a unit for controlling the measurement in the first chamber, and (iii) includes a control system directly related to controlling the exposure in the second chamber; and a second exposure system that comprises
- a third chamber in which a measurement room is formed, in the measurement room measurement being performed with respect to a target or a target coated with sensitive agent in a second substrate processing device, and the target being mounted on a shuttle during the measurement in the third chamber,
- a fourth chamber in which an exposure room is formed, in the exposure room the target, which is mounted on the shuttle that has been carried from the third chamber, being exposed with an exposure beam, and
- at least one second control rack that (i) supplies utility supplied from an external utility supply source to the third chamber and the fourth chamber, (ii) includes a unit for controlling the measurement in the third chamber, and (iii) includes a control system directly related to controlling the exposure in the fourth chamber, wherein at least the control system of the at least one first control rack is located either (i) adjacent to the first chamber in a virtual plane that intersects the second chamber and the fourth chamber or (ii) above the first chamber, at least the control system of the at least one second control rack is located either (i) adjacent to the third chamber in the virtual plane that intersects the second chamber and the fourth chamber or (ii) above the third chamber, the first substrate processing device and the second substrate processing device are disposed a predetermined distance apart in a first direction, the first chamber and the third chamber are disposed at 180-degrees rotationally symmetric positions with respect to a point between the first substrate processing device and the second substrate processing device, and the second chamber and the fourth chamber are disposed at 180-degrees rotationally symmetric positions with respect to a point between the first substrate processing device and the second substrate processing device.

* * * * *